United States Patent
Kawada et al.

(10) Patent No.: US 9,702,695 B2
(45) Date of Patent: Jul. 11, 2017

(54) IMAGE PROCESSING DEVICE, CHARGED PARTICLE BEAM DEVICE, CHARGED PARTICLE BEAM DEVICE ADJUSTMENT SAMPLE, AND MANUFACTURING METHOD THEREOF

(75) Inventors: Hiroki Kawada, Tsuchiura (JP); Osamu Inoue, Kodaira (JP); Miyako Matsui, Kokubunji (JP); Takahiro Kawasaki, Omitama (JP); Naoshi Itabashi, Hachioji (JP); Takashi Takahama, Higashimurayama (JP); Katsumi Setoguchi, Hitachinaka (JP); Osamu Komuro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/700,096

(22) PCT Filed: May 25, 2011

(86) PCT No.: PCT/JP2011/061978
§ 371 (c)(1),
(2), (4) Date: Jan. 4, 2013

(87) PCT Pub. No.: WO2011/148975
PCT Pub. Date: Dec. 1, 2011

(65) Prior Publication Data
US 2013/0146763 A1 Jun. 13, 2013

(30) Foreign Application Priority Data

May 27, 2010 (JP) ................................. 2010-121122
Feb. 21, 2011 (JP) ................................. 2011-034975
Feb. 25, 2011 (JP) ................................. 2011-039181

(51) Int. Cl.
*G01N 23/00* (2006.01)
*G01B 15/00* (2006.01)
(Continued)

(52) U.S. Cl.
CPC ........... *G01B 15/00* (2013.01); *G06K 9/6201* (2013.01); *H01J 37/222* (2013.01); *H01J 37/28* (2013.01);
(Continued)

(58) Field of Classification Search
CPC ......... G01B 15/00; G01B 15/04; H01J 37/00; H01J 37/02; H01J 37/023; H01J 37/07;
(Continued)

(56) References Cited

U.S. PATENT DOCUMENTS 5,666,053 A * 9/1997 Suzuki et al. ................. 324/250
5,969,273 A 10/1999 Archie et al.
(Continued)

FOREIGN PATENT DOCUMENTS

JP 60-169977 A 9/1986
JP 6-325176 A 11/1994
(Continued)

OTHER PUBLICATIONS

András E. Vladár et al., "Reference Material 8091: New Scanning Electron Microscope Sharpness Standard", Proceedings of SPIE, 2001, pp. 827-834, vol. 4344.
(Continued)

*Primary Examiner* — Jason McCormack
(74) *Attorney, Agent, or Firm* — Crowell & Moring LLP

(57) ABSTRACT

An object of the present invention is to provide an image processing apparatus that quickly and precisely measures or evaluates a distortion in a field of view and a charged particle beam apparatus. To attain the object, an image processing apparatus or the like is proposed which acquires a first image
(Continued)

of a first area of an imaging target and a second image of a second area that is located at a different position than the first area and partially overlaps with the first area and determines the distance between a measurement point in the second image and a second part of the second image that corresponds to a particular area for a plurality of sites in the overlapping area of the first image and the second image.

7 Claims, 58 Drawing Sheets

(51) Int. Cl.
H01J 37/22 (2006.01)
H01J 37/28 (2006.01)
G06K 9/62 (2006.01)
(52) U.S. Cl.
CPC ............. H01J 2237/24578 (2013.01); H01J 2237/2817 (2013.01); H01J 2237/2826 (2013.01); Y10T 428/24355 (2015.01)
(58) Field of Classification Search
CPC .. H01J 37/147; H01J 37/1471; H01J 37/1472; H01J 37/1474; H01J 37/1475; H01J 37/1477; H01J 37/222
USPC .......................................... 250/306, 307, 311
See application file for complete search history.

(56) References Cited

U.S. PATENT DOCUMENTS

| | | | |
|---|---|---|---|
| 6,545,275 B1 | 4/2003 | Pearl et al. | |
| 7,236,651 B2 | 6/2007 | Ishitani et al. | |
| 7,633,064 B2 | 12/2009 | Tsuneta et al. | |
| 7,834,997 B2 | 11/2010 | Nakayama | |
| 8,526,681 B2* | 9/2013 | Akutsu | 382/107 |
| 2002/0109833 A1* | 8/2002 | Chiba | G02B 27/0012 356/124 |
| 2003/0062479 A1 | 4/2003 | Kametani et al. | |
| 2005/0045821 A1* | 3/2005 | Noji | G01N 23/225 250/311 |
| 2005/0057662 A1* | 3/2005 | Washisu | 348/208.99 |
| 2005/0059873 A1* | 3/2005 | Glozman | G06T 7/0012 600/407 |
| 2006/0157448 A1* | 7/2006 | Magni | B08B 7/0035 216/67 |
| 2007/0065042 A1* | 3/2007 | Vroomen | G06T 7/60 382/286 |
| 2007/0292037 A1* | 12/2007 | Allon | G06T 7/0028 382/238 |
| 2008/0210867 A1 | 9/2008 | Hitomi et al. | |
| 2008/0230697 A1* | 9/2008 | Tanimoto | G01N 23/225 250/310 |
| 2009/0030302 A1* | 1/2009 | Taniguchi | A61B 6/5241 600/410 |
| 2009/0326363 A1* | 12/2009 | Li et al. | 600/411 |
| 2010/0157085 A1* | 6/2010 | Sasaki | 348/222.1 |
| 2010/0196504 A1* | 8/2010 | Schmaus | A61K 8/345 424/616 |
| 2011/0210250 A1 | 9/2011 | Nakayama et al. | |

FOREIGN PATENT DOCUMENTS

| | | |
|---|---|---|
| JP | 8-161608 A | 6/1996 |
| JP | 9-204529 A | 8/1997 |
| JP | 10-50245 A | 2/1998 |
| JP | 11-224640 A | 8/1999 |
| JP | 2000-100362 A | 4/2000 |
| JP | 2000-114207 A | 4/2000 |
| JP | 2005-268231 A | 9/2005 |
| JP | 2007-303892 A | 11/2007 |
| JP | 2008-14850 A | 1/2008 |
| JP | 2008-97839 A | 4/2008 |
| WO | WO 2010/052840 A1 | 5/2010 |

OTHER PUBLICATIONS

Benjamin Bunday et al., "CD-SEM Parameter Influence on Image Resolution and Measurement Accuracy", Proceedings of SPIE, 2009, pp. 727204-1-727204-12, vol. 7272.
International Search Report dated Aug. 2, 2011 including English-language translation (Four (4) pages).
Japanese-language of the PCT/ISA/237 Written Opinion dated Aug. 2, 2011 (Five (5) pages).

* cited by examiner

2701 Same pitch, Same line width  2702  2703 Square pattern  2704 Beam image

Fig. 28
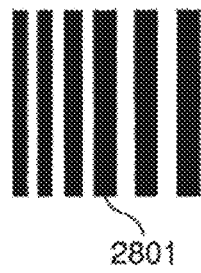 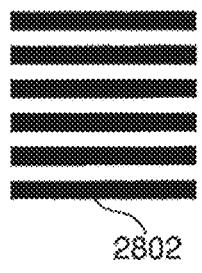 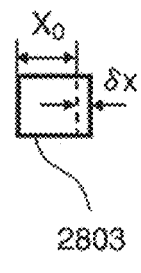 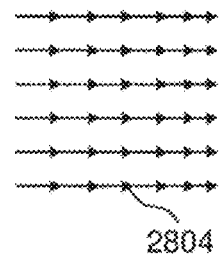
2801     2802     2803     2804
Same pitch, Same line width    Square pattern    Beam image
Fig. 29
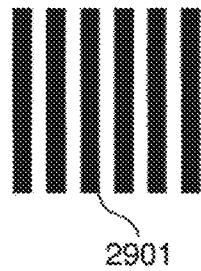 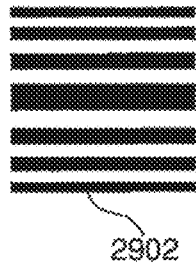 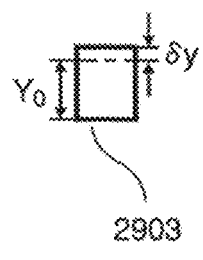 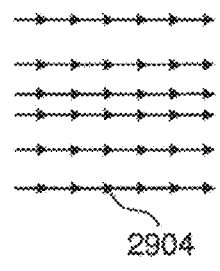
2901     2902     2903     2904
Same pitch, Same line width    Square pattern    Beam image
Fig. 30
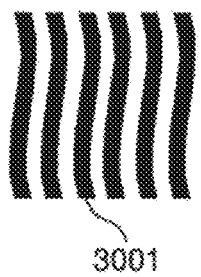 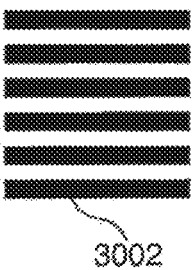 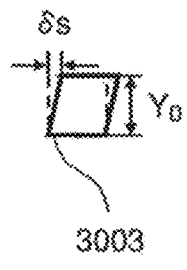 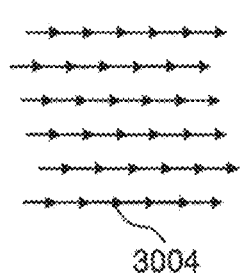
3001     3002     3003     3004
Same pitch, Same line width    Square pattern    Beam image Vector X component: Shear distortion ratio in X direction
Vector Y component: Magnification distortion ratio in Y direction Vector X component: Magnification distortion ratio in X direction
Vector Y component: Shear distortion ratio in Y direction Vector X component: Magnification distortion ratio in X direction
 + Shear distortion ratio in X direction
Vector Y component: Shear distortion ratio in Y direction
 + Magnification distortion ratio in Y direction Fig. 43
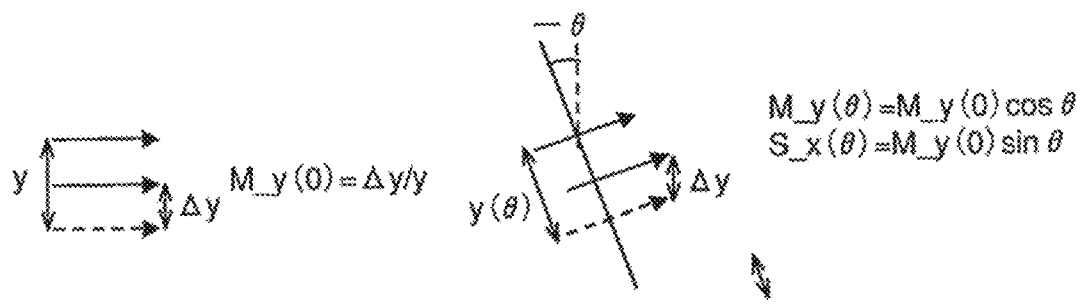
Magnification distortion ratio in Y direction at θ = 0°
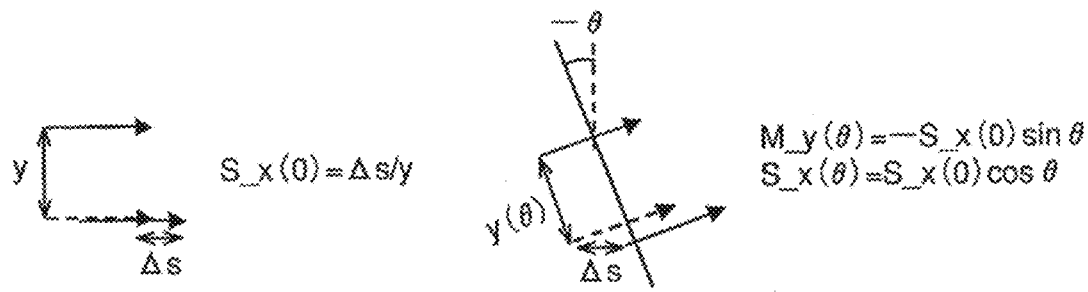
Shear distortion ratio in X direction at θ = 0°

Fig. 66
(a)
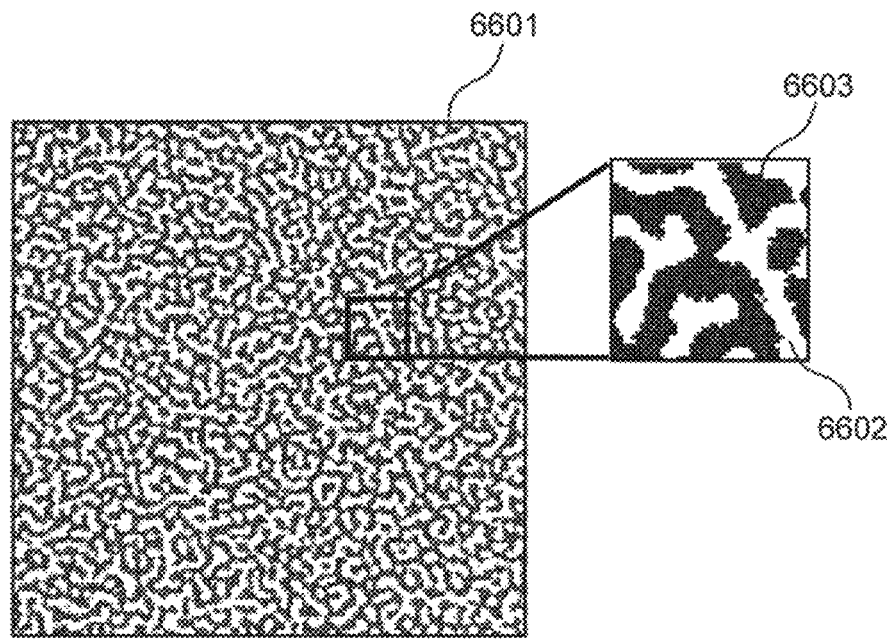
(b)
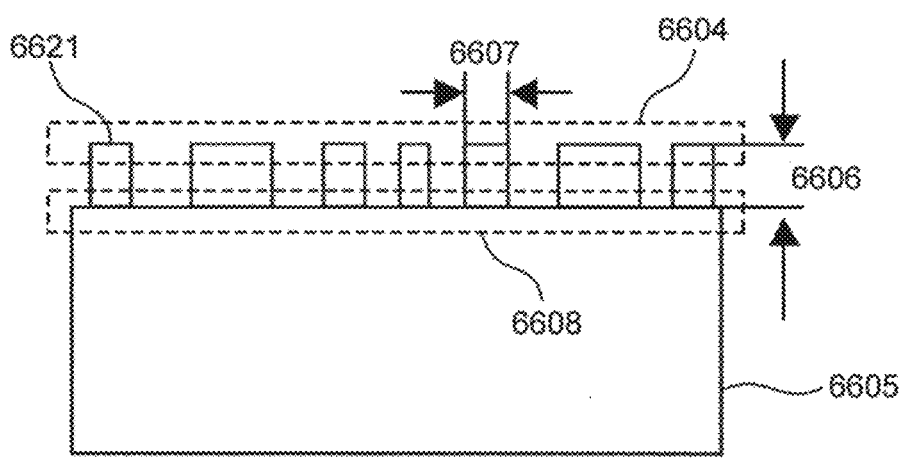

Fig. 68
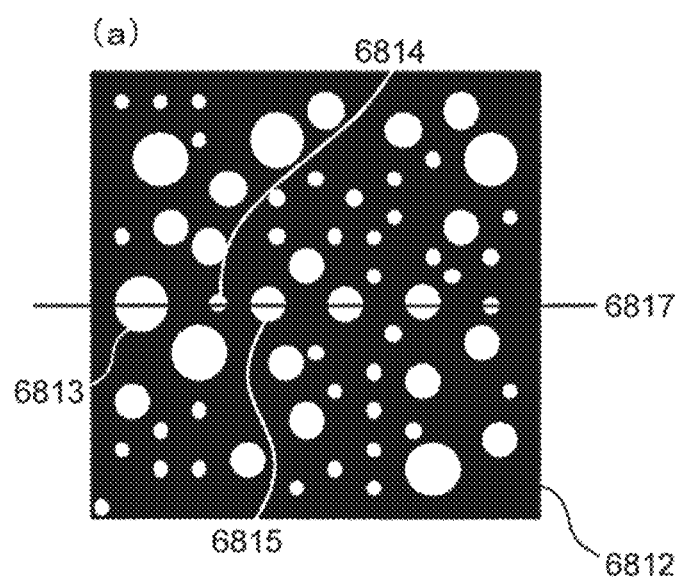
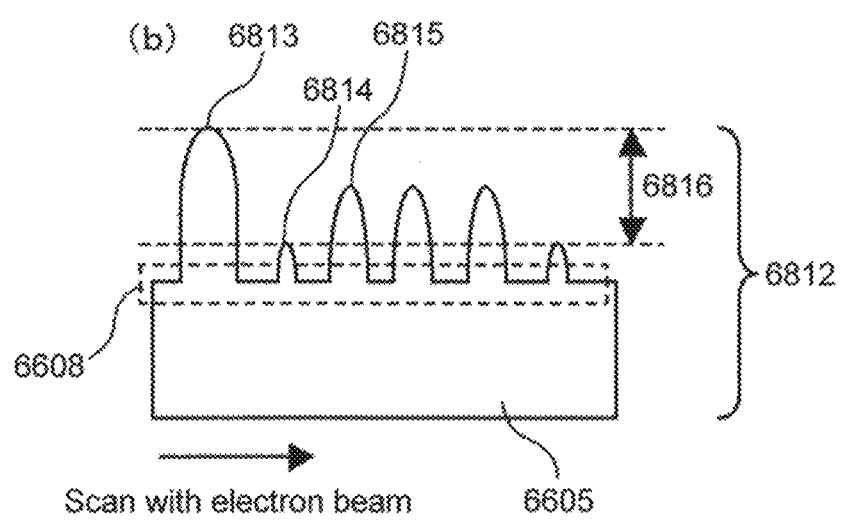

Fig. 69
(a)
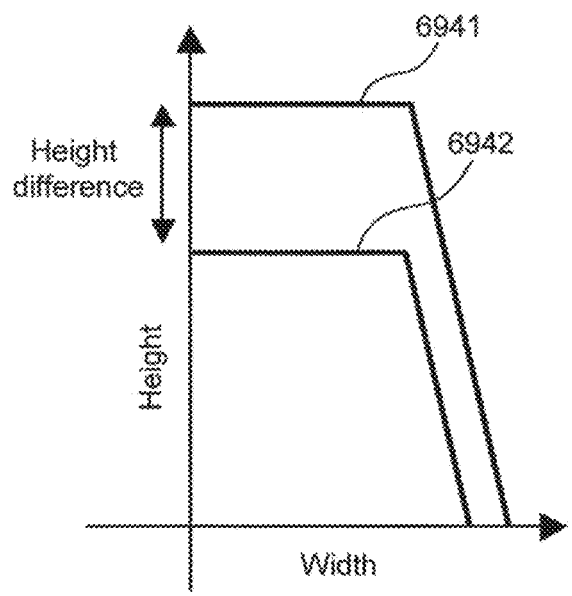
(b)
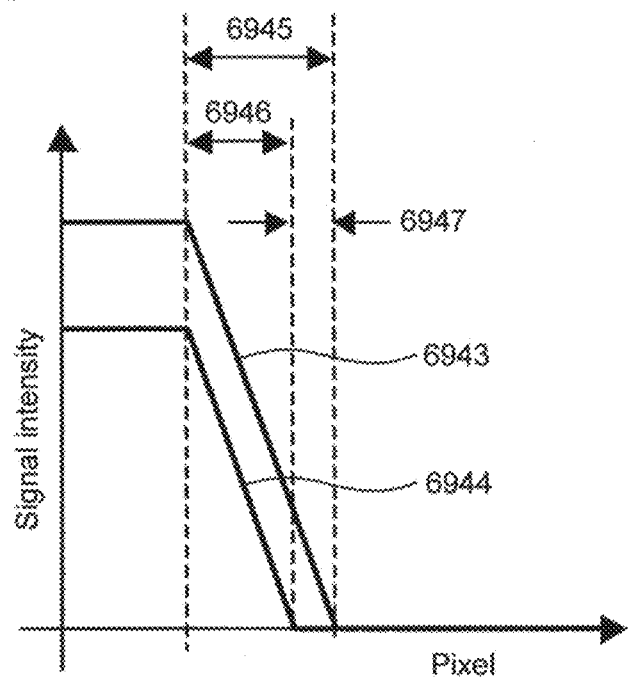

Fig. 78
(a)
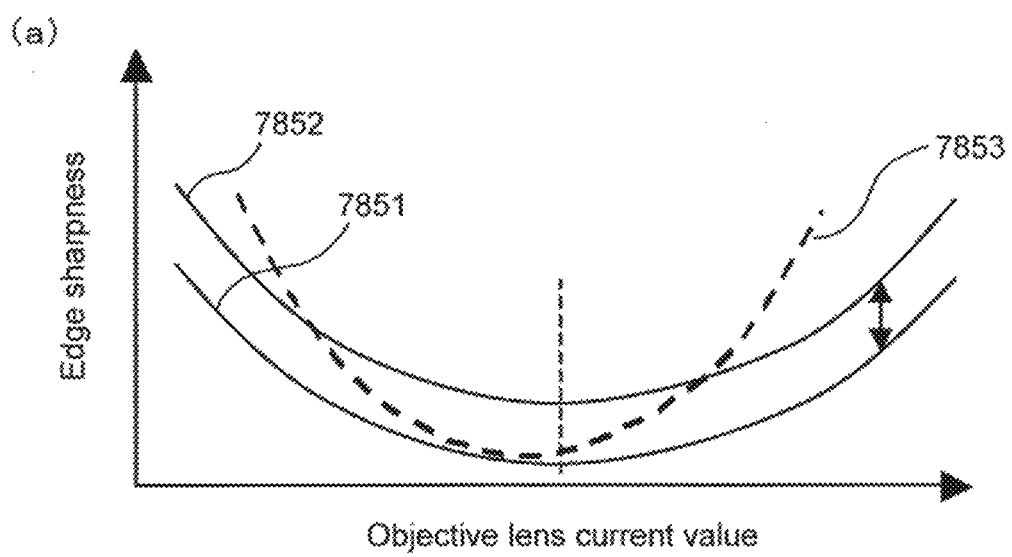
(b)
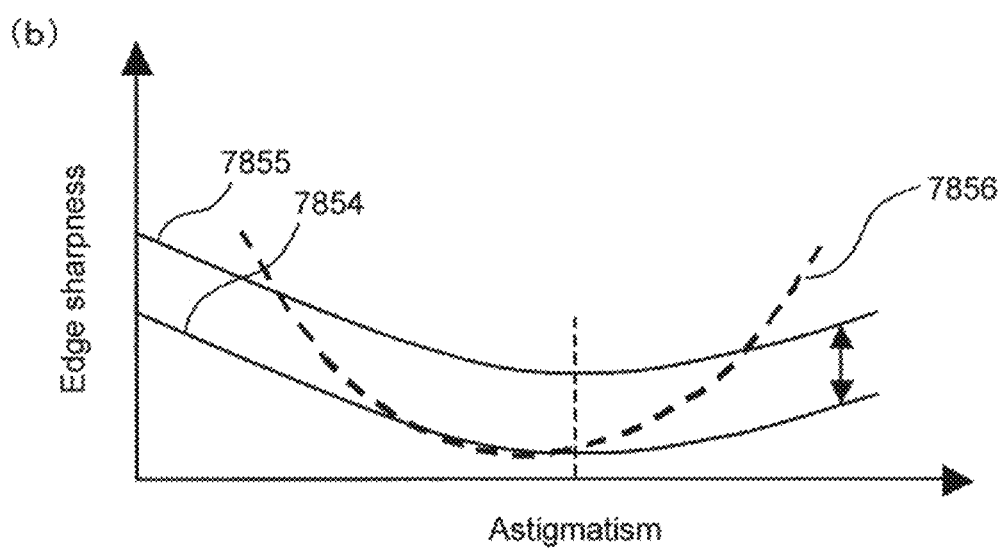

IMAGE PROCESSING DEVICE, CHARGED PARTICLE BEAM DEVICE, CHARGED PARTICLE BEAM DEVICE ADJUSTMENT SAMPLE, AND MANUFACTURING METHOD THEREOF

TECHNICAL FIELD

The present invention relates to a method, an apparatus and a computer program for measuring and evaluating a displacement or the like in an image obtained with a scanning electron microscope or the like. In particular, it relates to a method, an apparatus and a computer program that can measure and evaluate a distribution of a deformation, a displacement or the like in an image, a charged particle beam apparatus adjustment sample and a manufacturing method thereof.

BACKGROUND ART

In manufacture or inspection of a functional element product manufactured by micromachining of a surface, such as a semiconductor device and a thin-film magnetic head, a scanning electron microscope (SEM) is widely used for measurement of the width of a pattern formed by machining (referred to as "length measurement" hereinafter), visual inspection and the like. The scanning electron microscope is an apparatus that has an electron source that emits an electron beam, a convergent lens and an objective lens that narrows down the electron beam through interaction between the electron beam and a magnetic or electric field, a deflector that one-dimensionally or two-dimensionally scans a sample with the electron beam, and a detector that detects a secondary signal (a secondary electron, a reflection electron or an electromagnetic wave) emitted from the sample irradiated with the electron beam by making use of the photoelectric effect or the like, and forms a sample image by transforming or processing the detected signal into a visualizable signal, such as a brightness signal, in synchronization with the scanning with the electron beam.

A known approach for an image processing apparatus to perform such imaging is to evaluate a local distortion in the field of view. Patent Literature 1 discloses an approach of measuring an absolute distortion in a measurement standard sample having a periodic structure with a first magnification, imaging a measurement sample having an arbitrary structure with the first magnification and a second magnification (the image taken with the second magnification is used as a comparative image), forming an expanded or contracted image by expanding or contracting the image taken with the first magnification to the second magnification, measuring a relative distortion between the two magnifications in the expanded or contracted image and the comparative image, and determining an absolute distortion for the second magnification from the relative distortion and the absolute distortion described above.

A measuring apparatus incorporating SEM is required to stably perform precise measurement for a long period. In addition, differences in measurements between a plurality of measuring apparatuses in the production line have to be reduced so that the measurements do not vary with the apparatus. To this end, it is essential that the measurement precision of the length measurement electron microscope can be easily monitored, and all the apparatuses in the semiconductor production line are adjusted or calibrated to always perform measurement with an equal precision.

An important factor that determines the measurement precision of the electron microscope is spatial resolution of an incident electron beam. There is a process of measuring edge sharpness for an acquired electron microscope image as an evaluation value of the spatial resolution. Patent Literatures 3, 4 and 5 disclose known processes of measuring edge sharpness for an electron microscopic image, for example.

A known sample used for measuring edge sharpness described in Patent Literature 2 is a conductive organic film with fine particles of a heavy metal, such as gold, deposited thereon. Another known sample is a Si substrate with fine needle-shaped projections of Si formed thereon described in Non Patent Literature 1. Furthermore, as described in Non Patent Literature 2, there is proposed a sample that is produced by dry-etching a Si substrate with a silicon oxide film and a resist deposited thereon to form an irregular pattern of silicon oxide film on the Si substrate. There is a known process of calculating edge sharpness by acquiring an electron microscopic image of such a sample and performing an image processing thereof.

Another factor that determines the measurement precision of the electron microscope is magnification calibration precision of an electron microscopic image. As a conventional calibration sample having a fineness of 100 nm or less in terms of pitch dimension, there is proposed a superlattice sample having a periodic structure described in Patent Literature 6. A known process of calibrating a local magnification of an image with such a magnification calibration sample having a periodic structure is a process described in Patent Literature 1.

CITATION LIST

Patent Literature

Patent Literature 1: JP Patent Publication (Kokai) No. 2008-14850A (corresponding to U.S. Pat. No. 7,633,064)
Patent Literature 2: JP Patent Publication (Kokai) No. 11-224640A (1999)
Patent Literature 3: JP Patent Publication (Kokai) No. 2005-268231A (corresponding to U.S. Pat. No. 7,236,651)
Patent Literature 4: U.S. Pat. No. 5,969,273
Patent Literature 5: U.S. Pat. No. 6,545,275
Patent Literature 6: JP Patent Publication (Kokai) No. 2007-303892A (corresponding to U.S. Pat. No. 7,834,997)

Non Patent Literature

Non Patent Literature 1: Proceedings of SPIE Vol. 4344, pp. 827-834 (2001)
Non Patent Literature 2: Proceedings of SPIE Vol. 7272, pp. 727204-1-12 (2009)

SUMMARY OF INVENTION

Technical Problem

According to the technique disclosed in Patent Literature 1, distortion measurement using the standard sample is possible with a magnification that is not covered by the conventional standard sample. However, as the required dimension precision becomes higher, there arises a concern about the relative decrease of the precision of the standard sample. According to the approach disclosed in Patent Literature 1, the relative distortion between different magnifications can be compensated for, but the decrease in precision of formation of the standard sample cannot be compensated for.

Furthermore, since the expanded or contracted image and the comparative image are taken with different magnifications, there is a concern about a decrease in measurement precision of the relative distortion depending on the difference between the first magnification and the second magnification.

Furthermore, although the standard sample generally has an array of regular patterns evenly arranged, the pitch of the patterns locally varies in an image of the standard sample taken with high magnification. Such a roughness causes variations of measurement values of the pitch, so that the variations have to be reduced by measuring the pitch at a plurality of positions and averaging the measurement values. Thus, the measurement takes time accordingly.

In the following, an image processing apparatus or the like whose first object is to quickly and precisely measure or evaluate a partial displacement in the field of view will be described.

In addition, it will be discussed whether or not the conventional sample described above will be able to be used to measure the resolution evaluation value of the scanning electron microscope, adjust the electron microscope and calibrate the magnification of images in the trend toward smaller sizes and higher integration densities of semiconductor devices.

First, as described in Patent Literature 2, in a case where the electron microscope is adjusted using a conductive organic film with fine particles of a heavy metal, such as gold, deposited thereon as a sample, there is a concern that the heavy metal, such as gold, enters the semiconductor device during measurement of the semiconductor device and causes a failure of the semiconductor device.

Furthermore, our investigation of an edge sharpness evaluation sample 6812 for an electron microscope, which is produced by forming fine needle-shaped projections of Si on a Si substrate described in Non Patent Literature 1 has shown the problems described below. FIG. 68 includes schematic diagrams showing the sample 6812. FIG. 68(*a*) is a top view, and FIG. 68(*b*) is a cross-sectional view taken along a line 6817 in FIG. 68(*a*). As shown in the cross-sectional view, the difference 6816 in height among the tip ends of needle-shaped fine projections 6813, 6814 and 6815 formed on the sample vary in an electron microscopic image acquisition area. The projections have needle-shaped cross-sectional shapes, which differ among the projections. The sample 6812 has an extremely fine pattern, so that the edge sharpness of the electron microscopic image taken with high magnification can be measured. However, because of the variations of the height and shape of the projections, it is difficult to measure the edge sharpness or magnification of the electron microscope using the sample 6812 with high precision, high reproducibility and high stability.

FIG. 69 includes diagrams for illustrating the effect of the pattern height variations on the precision of measurement of the edge sharpness. FIG. 69(*a*) is a schematic cross-sectional view of patterns having different heights, a tall pattern 6941 and a short pattern 6942. FIG. 69(*b*) shows a secondary electron profile 6943 of an electron microscopic image of the tall pattern 6941 shown in FIG. 69(*a*) and a secondary electron profile 6944 of an electron microscopic image of the short pattern 6942. The edge sharpness is determined by measuring the distance for which the electron beam profile varies at the pattern edge. In FIG. 69(*b*), for example, the distance between the part where the signal from the pattern top is flat and the part where the signal from a pattern bottom 8 is flat is defined as the edge sharpness. There is a variation 6947 in the edge sharpness caused by the difference in pattern height between an edge sharpness 6945 determined for the tall pattern 6941 and an edge sharpness 6946 determined for the short pattern 6942. Therefore, if the pattern height of the sample to be measured varies, a problem arises that the measurement value of edge sharpness varies. If the pattern height varies in the area in which an electron microscopic image is to be taken, a problem arises that the measurement precision and measurement reproducibility of edge sharpness decrease, so that the electron microscope cannot be adjusted with high precision.

Whether there is a pattern height variation that affects the edge sharpness of the electron microscopic image described above can be determined from a gradation value distribution of the electron microscopic image, for example. FIG. 70 shows an example of a histogram of the black and white gradation of an electron microscopic image of a sample with needle-shaped projections formed thereon described in Non Patent Literature 1. The higher the gradation of the histogram, the brighter the image is, and the lower the gradation of the histogram, the darker the image is. The histogram shown in FIG. 705 has a bright peak 7031 and a dark peak 7032, the bright peak 7031 is formed by signals from the needle-shaped projections 6813 to 6815, and the dark peak 7032 is formed by signals from a pattern bottom 6608. The gradation difference 7033 between the bright peak 7031 and the dark peak 7032 is a brightness component that varies depending on the height of the needle-shaped projection.

A gradation variation $\sigma B2$ of the dark peak 7032 is a variation of the signal from the pattern bottom, which is composed of a variation caused by an image noise component and a height variation of the pattern bottom. In the case of this pattern, the height variation of the pattern bottom 8 is substantially 0, so that the variation $\sigma B2$ is mostly composed of a variation $\sigma N$ caused by an image noise component. On the other hand, a variation $\sigma T2$ of the bright peak 7031 is a variation of the signals from the pattern top parts of the needle-shaped projections 6813 to 6815, which is the sum of a variation $\sigma N$ caused by an image noise component and a brightness variation $\sigma TH2$ caused by a height variation of the pattern top parts. The variation $\sigma T2$ of the bright peak 7031 is 50 gradations, and the variation $\sigma B2$ of the dark peak 7032 is about 25 gradations. Therefore, if the variation $\sigma N$ caused by the image noise component is 25 gradations, the variation $\sigma TH2$ caused by the height variation of the pattern top parts is about 25 gradations.

In the histogram of the electron microscopic image of needle-shaped patterns shown in FIG. 70, the difference between the bright peak 7031 and the dark peak 7032 is 100 gradations, which are brightness components that vary depending on the height of the pattern top from the pattern bottom. For example, if it is assumed that the average height of the patterns from the pattern bottom to the pattern top is 100 nm, the height variation of the needle-shaped patterns can be estimated to be about 25 nm. Thus, it can be seen that it is difficult to measure the edge sharpness by reducing the measurement variations caused by the difference in height among the samples to 1/10 or lower. To reduce the measurement variation of the edge sharpness to 1/10 or lower when the average height of the patterns from the pattern bottom to the pattern top is 100 nm, for example, the height variation of the patterns needs to be reduced to 10 nm or less. In this case, a gradation variation component $\sigma TH$ caused by the height variation of the pattern top parts shown in the histogram of the electron microscopic image is equivalent to 10 gradations.

If the pattern height varies significantly, the measurement precision of the edge sharpness can change depending on the height of the focus point of the electro-optical system. For example, FIG. 71(a) shows an electron beam profile in a case where the electron microscope is focused on the tall projection 6813 shown in FIG. 68(b), and FIG. 71(b) shows an electron beam profile in a case where the electron microscope is focused on the short projection 6814. When the electron microscope is focused on the tall projection 6813, an edge 7125 of the projection 6813 can be accurately measured from the electron beam profile, but an edge 7126 in the vicinity of the groove bottom (pattern bottom) cannot be accurately measured. To the contrary, when the electron microscope is focused on the short projection 6814, an edge in the vicinity of a groove bottom 6608 and an edge 7129 of the short projection 6814 can be accurately measured, but there arises a problem that an edge 7127 of the tall projection 6813 cannot be accurately measured. This problem also arises when the depth of focus is deep. Thus, it can be seen that an image in which all the patterns having different heights are clearly seen cannot be taken, and therefore, an accurate and stable measurement value of the edge sharpness cannot be obtained.

Furthermore, the conventional edge sharpness evaluation sample 6812 is a chip having a size smaller than a 5-mm square, so that the sample has to be placed on a sample holder for measurement when an electron microscopic image is to be taken. FIG. 72 is a schematic diagram showing a chip-like sample placed on a sample holder. In a case where a sample 7264 is placed on a sample holder 7261 to acquire an image, an uppermost surface 7262 of the sample holder 7261 and a surface 7263 of the sample 7264 need to be flush with each other. This is because, in the case where the sample is a chip having a size smaller than a 5-mm square, and the uppermost surface 7262 of the sample holder 7261 and the surface 7263 of the sample 7264 are not flush with each other, an electric field intensity distribution 7265 on the sample surface 7263 changes, so that the measurement precision decreases if the electron microscopic image of the wafer to be inspected is taken after the electron microscope is adjusted using the electron microscopic image of the sample 7264 on the sample holder 7261. In practice, it is difficult to place the sample 7264 on the sample holder 7261 so that the uppermost surface 7262 of the sample holder 7261 and the surface 7263 of the sample are perfectly flush with each other and provide the electric field intensity distribution 7265 that is perfectly the same as the electric field intensity distribution on the surface of the wafer to be inspected.

The sample produced by forming an irregular pattern in a silicon oxide film on a Si substrate described in Non Patent Literature 2 has a problem that the sample surface irradiated with an electron beam is charged to cause a blur or distortion in the electron microscopic image. There is a concern that the electron microscopic image blurred or distorted by charges on the sample surface cannot be used to precisely adjust the optical system of the scanning electron microscope.

In the case where the sample having a periodic structure described in Patent Literature 6 is used to perform magnification calibration, the problems described below arise. As the required dimension measurement precision in semiconductor manufacturing becomes higher, the magnification calibration sample is required to have more uniform and finer patterns. However, patterns on actual calibration samples locally vary in dimension. Such a sample dimension variation causes a magnification measurement error. Thus, a large number of images have to be taken, and the pitch of the patterns has to be measured in those images, the average of the measurement values has to be taken as a length measurement value, and the measurement takes time accordingly. To measure the magnification distortion or shape distortion in an image, the above-described measurement has to be performed at a plurality of local areas in the image, so that it takes several hours or longer to complete the measurement. In addition, in order to ensure the stability of the apparatus, the measurement has to be regularly repeated. In addition, the standard sample with calibrated dimensions is usually expensive, so that the maintenance cost of the apparatus increases.

In the following, a charged particle beam apparatus adjustment sample whose second object is to solve the problems described above and adjust a charged particle beam apparatus that can be used in semiconductor device manufacturing with high precision and high stability, a manufacturing method thereof and a charged particle beam apparatus precisely adjusted using the adjustment sample will be proposed.

Solution to Problem

As an aspect to attain the first object described above, there is proposed an image processing apparatus or the like that acquires a first image of a first area that has a first part corresponding to a particular area on a sample and a second image of a second area that is located at a different position than the first area and partially overlaps with the first area, and determines a distance between a measurement point in the second image that corresponds to the first part and a second part of the second image that corresponds to the particular area for a plurality of sites in the overlapping area of the first image and the second image. Furthermore, there is proposed the image processing apparatus that uses a local distortion in the detected image to determine a distribution of a position shift due to the distortion in the image in each area.

As an embodiment to attain the second object described above, there is proposed a charged particle beam apparatus adjustment sample comprising: a substrate; and projection and depression patterns of a semiconductor material formed on a surface of the substrate, wherein the projection and depression patterns are two-dimensional irregular patterns, and top surfaces of projections of the projection and depression patterns are flat surfaces flush with each other.

Furthermore, there is proposed a method of manufacturing a charged particle beam apparatus adjustment sample comprising: a step of forming a uniform silicon oxide film having a thickness of 10 nm to 0.1 nm yet to be patterned on a Si substrate; and a step of forming fine patterns on the Si substrate under a condition that a selection ratio of the silicon oxide film is high using a plasma dry etching apparatus, wherein an uppermost surface of the Si substrate yet to be dry-etched forms flat top surfaces of the fine patterns.

Furthermore, there is proposed a charged particle beam apparatus, wherein the charged particle beam apparatus uses the charged particle beam apparatus adjustment sample described above to measure at least one of focus point, astigmatism, image resolution, edge sharpness, image magnification and image distortion and is adjusted so that the measured value falls within a preset value range.

Advantageous Effects of Invention

According to the first aspect described above, information on the distance between the particular area in the first image and the particular area in the second image contains a partial image distortion, so that the distribution of distortion in the field of view can be measured by measuring the distance for a plurality of sites. For example, if the distance between the first image and the second image is 100 nm, the distance between the particular areas in the two images should be 100 nm. If the distance is a value other than 100 nm, it means that the particular area of the image is displaced. That is, it can be seen that the particular area is located at a distorted position. Thus, the distribution of distortion in the field of view can be measured by determining the distance at a plurality of sites.

In a preferred example, the first image and the second image are taken with the same magnification (the same size of field of view). In this case, the particular area can be reproduced in the images under the same conditions, so that the distance between the first image and the second image can be measured with high precision, and as a result, the distortion can be measured with high precision.

The result is information on a local image distortion, such as a magnification distribution. Furthermore, in order to correct the position of an edge point or the like in the image detected for length measurement or shape evaluation of an arbitrary pattern in the distorted image, a local distortion distribution in the field of view can be extracted on a distortion-type basis, a distribution of the relative position shift due to the distortion over the entire image can be calculated, and the position of the detected edge point or the like in the image can be corrected.

Furthermore, since irregular patterns of a semiconductor material having a uniform height are formed on the surface of the substrate, a charged particle beam apparatus adjustment sample that allows precise and stable adjustment of a charged particle beam apparatus that can be used for manufacturing a semiconductor device and a method of manufacturing the same can be provided. Furthermore, by using the adjustment sample, a charged particle beam apparatus adjusted with high precision can be provided.

BRIEF DESCRIPTION OF DRAWINGS

FIG. 28 is a diagram showing an example of an image in which a magnification distortion in the X direction occurs.

FIG. 29 is a diagram showing an example of an image in which a magnification distortion in the Y direction occurs.

FIG. 30 is a diagram showing an example of an image in which a shear distortion in the X direction occurs.

FIG. 43 is a diagram showing distortions of a scan line when the rotation angle of the image is θ.

FIG. 66 includes schematic diagrams showing characteristics of a charged particle beam apparatus adjustment sample according to a second embodiment, FIG. 66(a) being a top view, and FIG. 66(b) being a cross-sectional view.

FIG. 68 includes schematic diagrams showing a conventional edge sharpness evaluation sample for an electron microscope, FIG. 68(a) being a top view, and FIG. 68(b) being a cross-sectional view.

FIG. 69 includes diagrams for illustrating an effect of a height variation of a pattern on the measurement precision of edge sharpness, FIG. 69(a) being a cross-sectional view of patterns, and FIG. 69(b) showing the signal intensity in association with the pattern cross sections.

FIG. 78 includes correlation diagrams showing correlations between the edge sharpness measured with the charged particle beam apparatus adjustment sample according to the second embodiment and an average length measurement value of standard line patterns, FIG. 78(a) showing a case where the current value of an objective lens is changed to change the focus of an incident electron beam, and FIG. 78(b) showing a case where astigmatism is changed.

DESCRIPTION OF EMBODIMENTS

Figure 1:
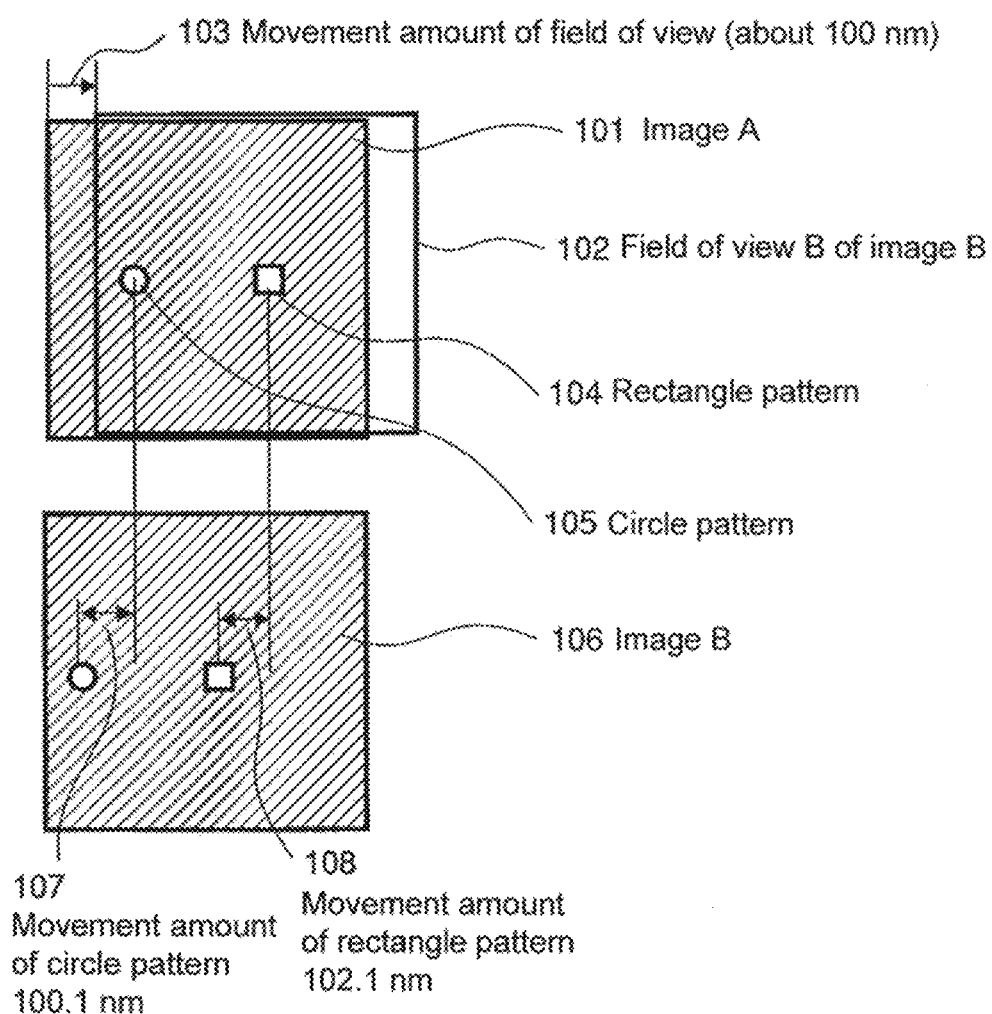
FIG. 1 is a diagram for illustrating a principle of image distortion measurement.

In the following, embodiments relating to acquisition of distortion information on an image (first and fourth embodiments) and embodiments relating to precise adjustment of a charged particle beam apparatus using an adjustment sample (second and third embodiments) will be described with reference to the drawings.

Embodiment 1

The embodiment 1 relates to a technique of observing a sample and measuring a dimension of the shape of a pattern thereon in an apparatus that handles an image taken with a microscope or the like. In particular, a method of measuring and evaluating a magnification distortion or a shape distortion in an image will be primarily described.

In particular, this embodiment relates to a scanning electron microscope that is used to observe a fine pattern and measure a dimension thereof, or more specifically, a scanning electron microscope directed to a method of measuring or calibrating a magnification distortion or a shape distortion in an observed image.

The scanning electron microscope is designed to produce a sample image precisely matching to the shape of the observed and measured sample surface and calculates the distance between two arbitrary points on the sample surface from the sample image. The calculation is commonly referred to as "length measurement", and the scanning electron microscope having such a calculation capability is referred to as a "length measurement electron microscope".

Nowadays, the dimensional precision of micromachining is as high as the order of nanometers, so that the length measurement value, which is the value of the dimension obtained by length measurement, is required to be extremely precise. To this end, the magnification of the sample image has to be accurate and be consistent over the entire image. This is referred to as a magnification consistency or a magnification distortion of an image.

Not only the magnification but also the shape has to be consistent. That is, if a sample has a linear shape, the image of the sample also has to have a linear shape. If a local magnification distortion occurs in the image, what would otherwise appear to be a straight line appears to be bent around the area. Even if such a bending occurs, the magnification may sometimes be accurate. This is referred to as a shape consistency or a shape distortion of an image.

To quantitatively measure such a magnification distortion or a shape distortion, an operation is regularly performed in which a dimension of a magnification standard sample, on which patterns with dimensions calibrated in advance are formed, is measured, and the measured dimension is compared with the calibrated dimension of the standard sample to calibrate magnification.

However, the patterns to be measured are increasingly becoming finer, and accordingly, the requirements on the precision and magnification of distortion measurement are increasingly becoming severer. Thus, a problem has arisen that it is difficult to prepare a standard sample that meets the requirements.

For example, in length measurement of a pattern having a dimension of about 20 nm, the required precision of the image in terms of magnification consistency is about 0.1%. The required precision of the shape of the contour of the periphery of the pattern is about 1 nm or less in terms of the position of the contour.

In order to satisfy the precision requirements, the inaccuracy of the dimensions of the pattern of the standard sample is preferably about a tenth of the required precisions described above. In addition, the traceability of the inaccuracy needs to be ensured by a calibration certificate issued by a public certification authority according to a certification standard. Otherwise, neither the precisions nor the inaccuracy can be reliable.

For example, for a standard sample having a dimension of 100 nm, a standard dimension is the pitch of regularly arranged liner patterns, which is about 100 nm. Length measurement is performed with about a 150,000-fold magnification, which results in local pitch variations.

The pitch variations occur because the contour of the linear patterns on the sample is not perfectly linear but has local irregularities. This is referred to as edge roughness. In order to reduce an error caused by the pitch variations, the pitch is measured at various points on the sample, and the average value of the measurements is regarded as the measurement value. If the pitch is measured at about 20 points, the error of the average value is about ±0.3 nm or less.

This error is about 0.3% of 100 nm in terms of precision. To achieve the precision of 0.1% described above, measurements need to be taken at about 180 points and averaged, which takes about 30 minutes.

Furthermore, to measure the magnification distortion or shape distortion of the image, the measurements described above need to be performed at various points in the image, so that it takes several hours or longer to complete the distortion measurement.

Furthermore, in order to ensure the stability of the apparatus, the measurements described above need to be regularly repeated. As downsizing of semiconductor patterns continues, the required time will further increase.

During the distortion measurement, the length measuring apparatus makes no contribution to production. Therefore, there are concerns about a reduction in productivity and a reduction in cost of ownership (CoO). In addition, the standard sample with calibrated dimensions is usually expensive, so that there is also concern about an increase of the maintenance cost of the apparatus.

According to the embodiments described below, an image processing technique is applied to enable measurement of a distortion in the field of view from a reduced number of SEM images acquired, so that the distortion measurement can be performed in a shorter time. In addition, since there is no need to guarantee that the sample used has the absolute dimensions, a variety of samples can be used.

In the following, a method, an apparatus and a computer program for measuring and evaluating a movement, a deformation, a displacement or the like of an image obtained with an image processing apparatus at a position in the image (or a storage medium that stores the computer program or a transmission medium that transmits the program), an image processor designed exclusively for an image processing, and a dedicated hardware accelerator will be described with reference to the drawings. More specifically, the method, the apparatus and so on described above will be described in the context of a critical dimension-scanning electron microscope (CD-SEM) or a defect review-SEM (DR-SEM), which is a kind of measurement and inspection apparatus.

In the following, a charged particle beam apparatus will be illustrated as an image forming apparatus, and a charged particle beam apparatus incorporating an SEM will be described as an implementation. However, the present invention is not limited to the implementation, and a focused ion beam (FIB) apparatus that forms an image by scanning a sample with an ion beam may be used as the charged particle beam apparatus, for example. However, since extremely high magnifications are required to precisely measure finer patterns, the SEM that is generally superior to the FIB apparatus in resolution is preferably used.

Figure 7:
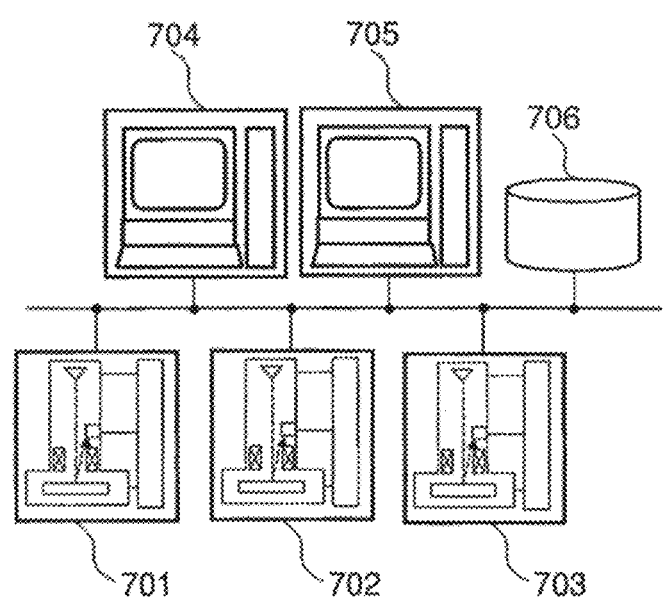
FIG. 7 is a schematic diagram for illustrating a measurement/evaluation system with a plurality of measurement or inspection apparatuses connected to a network.

FIG. 7 is a schematic diagram for illustrating a measurement/evaluation system with a plurality of measurement or inspection apparatuses connected to a network. This system primarily comprises SEMs 701, 702 and 703 that measure or inspect a pattern dimension of a semiconductor wafer, a photo mask or the like that are connected to a network. To the network, there are connected a condition setting apparatus 704 that functions also as an image processing apparatus that sets a measurement position, a measurement condition or the like on design data for a semiconductor device and makes a measurement or inspection of an acquired SEM image, a simulator 705 that simulates the quality of a pattern based on the design data for the semiconductor device, a manufacturing condition of a semiconductor manufacturing apparatus or the like, and a storage medium 706 that stores the design data including registered layout data or manufacturing condition for the semiconductor device.

The design data is represented in a GDS format or OASIS format, for example, and stored in a predetermined format. Note that any type of design data can be used as far as software that handles the design data is ready for the format of the design data and can handle the design data as graphic data. The storage medium 706 may be incorporated in a controller for the measurement or inspection apparatuses, the condition setting apparatus 704 or the simulator 705. The simulator 705 has a capability of simulating a defect occurrence position based on the design data.

Each of the SEMs 701, 702 and 703 has a controller that performs a required control of the SEM. The controller may incorporate the capability of the simulator described above or the capability of setting the measurement condition or the like.

In the SEM, a plurality of stages of lenses focus an electron beam emitted from an electron source, and a scanning deflector one-dimensionally or two-dimensionally scans a sample with the focused electron beam.

A secondary electron (SE) or backscattered electron (BSE) emitted from the sample scanned with the electron beam is detected by a detector, and the resulting image signal is stored in a frame memory or other storage medium in synchronization with the scanning by the scanning deflector. The image signals stored in the frame memory are added up by a calculator in the controller. The scanning deflector can scan over an area of any size, through any position and in any direction.

The controls and the like described above are performed by the controller of each SEM, and the images and signals resulting from the scanning with the electron beam are transmitted to the condition setting apparatus 704 via the communication line network. Although the controllers that control the SEMs and the condition setting apparatus 704 have been described as separate components in this example, the present invention is not limited to such an arrangement, and the condition setting apparatus 704 may centrally perform the apparatus control and the measurement processing, or each controller may perform both the control of the SEM and the measurement processing.

The condition setting apparatus 704 or the controller stores a program for performing the measurement processing and performs measurement or calculation according to the program.

Furthermore, the condition setting apparatus 704 has a capability of creating a program (recipe) for controlling the operation of the SEM based on the design data for the semiconductor device and serves as a recipe setting section. More specifically, the condition setting apparatus 704 sets positions for the SEM to perform a required processing, such as a desired measurement point, an auto-focus point, an auto-stigma point and an addressing point on the design data, pattern contour data or simulated design data, and creates a program for automatically controlling a sample stage, the deflector and the like of the SEM.

Figure 8:
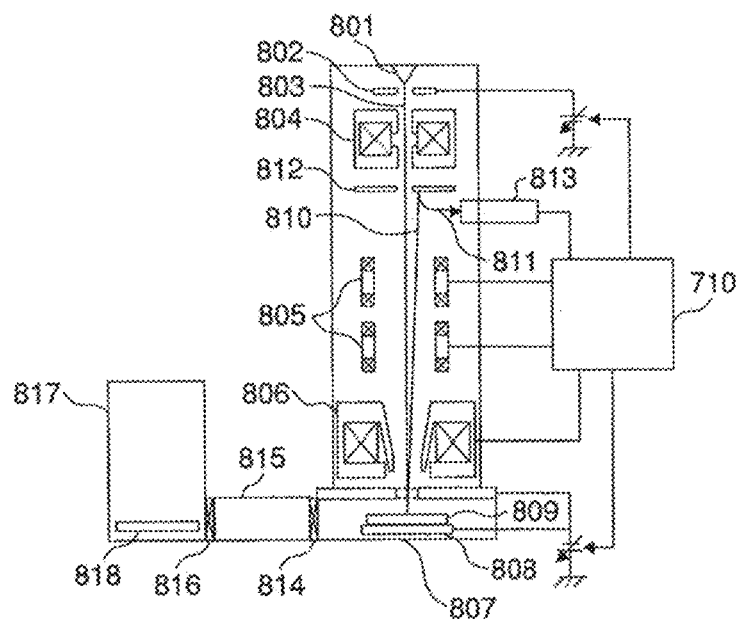
FIG. 8 is a schematic diagram showing a configuration of a scanning electron microscope.

FIG. 8 is a schematic diagram showing a configuration of the scanning electron microscope. An electron beam 803 extracted from an electron source 801 by an extraction electrode 802 and accelerated by an acceleration electrode (not shown) is narrowed down by a condenser lens 804, which is a form of focusing lens, and then, a sample 809 is one-dimensionally or two-dimensionally scanned with the electron beam 803 by a scanning deflector 805. The electron beam 803 is decelerated by a negative voltage applied to an electrode incorporated in a sample stage 808 and focused by the lens effect of an objective lens 806 before irradiating the sample 809.

When the sample 809 is irradiated with the electron beam 803, an electron 810, such as a secondary electron and a backscattered electron, is emitted from the irradiated part. The emitted electron 810 is accelerated in the direction of the electron source by the acceleration effect of the negative voltage applied to the sample and collides with a conversion electrode 812 to produce a secondary electron 811. The secondary electron 811 emitted from the conversion electrode 812 is captured by a detector 813. The output of the detector 813 changes depending on the amount of the captured secondary electrons. The brightness of a display apparatus (not shown) changes with the output. For example, in a case of forming a two-dimensional image, an image in a scan area is formed by synchronizing a deflection signal to the scanning deflector 805 and the output of the detector 813 with each other. The scanning electron microscope illustrated in FIG. 8 is further provided with a deflector (not shown) that moves the scan area for the electron beam. The deflector is used to form an image of a pattern having the same shape at different positions, for example. The deflector is referred to also as an image shifting deflector and allows the field of view (FOV) of the electron microscope to be moved without moving the sample by moving the sample stage, for example. One deflector that doubles as the image shifting deflector and the scanning deflector may be used, and a signal for image shifting and a signal for scanning superimposed on one another may be supplied to the deflector.

Although the electron emitted from the sample is converted by the conversion electrode before detection in the example shown in FIG. 8, the present invention is, of course, not limited to such an arrangement. For example, an electron multiplier or a detection surface of the detector may be disposed on the path of the accelerated electron.

A controller 710 not only controls each component of the scanning electron microscope and but also has a capability of forming an image based on the detected electrons and a capability of measuring a pattern width of a pattern formed on the sample based on the intensity distribution of the detected electrons, which is referred to as a line profile.

Figure 9:
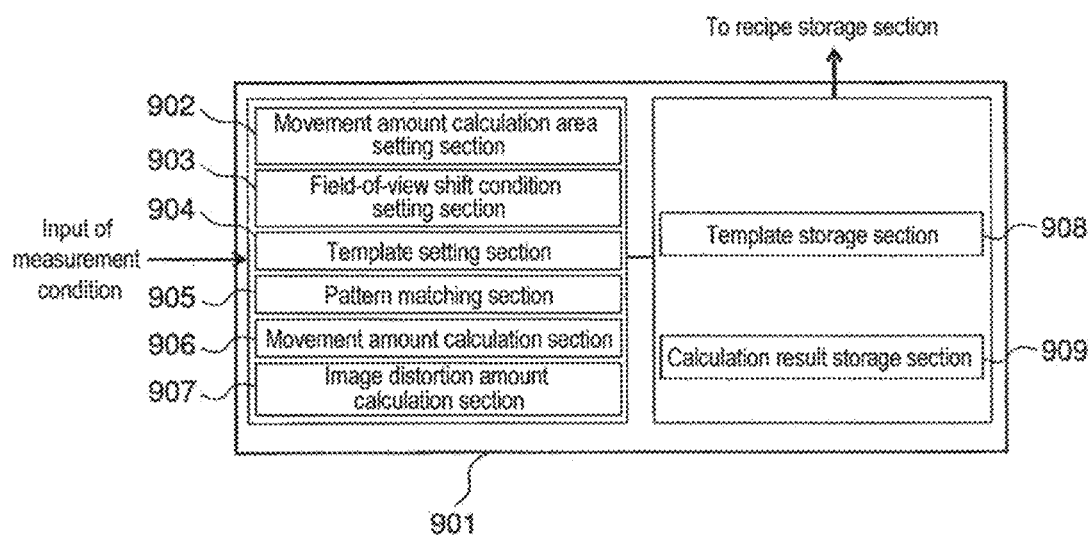
FIG. 9 is a diagram for illustrating an example of an image processor.

In the following, a method of evaluating information on a plurality of parts of an image, or more specifically, a method of properly evaluating information on a complex change in an image (sometimes referred to also as an image distortion hereinafter) based on information on a plurality of parts of the image will be described with reference to the drawings. FIG. 9 is a diagram for generally illustrating a processor that evaluates an image distortion. Although processings will be described below as being performed by an image processor designed exclusively for an image processing or a dedicated hardware accelerator in this example, the present invention is not limited to such an implementation. For example, the processings described below may be performed by a general-purpose processor executing a predetermined program.

An image processor 901 illustrated in FIG. 9 comprises a movement amount calculation area setting section 902, a field-of-view shift condition setting section 903, a template setting section 904, a pattern matching section 905, a position shift amount/direction calculation section 906, an image distortion amount calculation section 907, a template storage section 908 and a calculation result storage section 909.

The movement amount calculation area setting section 902 sets a plurality of areas for which the amount of a movement in an image is to be calculated, based on an input or preset condition. The field-of-view shift condition setting section 903 sets the amount of shift of the field of view of a scanning electron microscope or the like, based on an input or preset shift amount and an input or preset shift direction. The shift amount set by the field-of-view shift condition setting section 903 is stored in the recipe storage section as the deflection signal to the image shifting deflector described above. The recipe storage section may be incorporated in the controller 710 of the scanning electron microscope or may be an external storage medium. The template setting section 904 creates a template by cutting a part of an image obtained with the scanning electron microscope or a part of an image obtained from the design data for the semiconductor device or obtained by performing an exposure simulation on the design data. The template created by the template setting section 904 is stored in the template storage section 908 or the recipe storage section.

The pattern matching section 905 performs pattern matching based on the template created by the template setting section 904. The template matching is a pattern identification process using a template that shows a pattern having the same shape as a desired part of an imaged pattern on a sample, or more specifically, a process of determining a normalized correlation value or the like and identifying a desired part of the pattern based on the degree of matching between the template and the part of the pattern in the image. The movement amount calculation section 906 calculates the actual movement amount based on the difference between the position identified by the pattern matching and the position in the image in the field of view before movement from which the template has been cut. A specific method for the calculation will be described later. The image distortion amount calculation section 907 calculates the distortion amount of an image based on a plurality of movement amounts obtained by the movement amount calculation section 906. A specific method for the calculation will be described later.

Next, a method of evaluating an image distortion using a plurality of images obtained before and after movement of the FOV will be described. According to this embodiment, a partially overlapping area is provided between a first image obtained before movement of the FOV and a second image obtained after movement of the FOV, and the area is used as a distortion evaluation area. The magnification distortion distribution and the shape distortion distribution in the overlapping image area can be measured at one time by comparing the two images. This method has advantages that the image distortion can be evaluated in a shorter time since the calculation involves a reduced number of (at least two) images, that the method is possible if there is a characteristic shape or pattern seen in the image, and that the method requires no standard sample with calibrated dimensions.

A principle of the measurement method will be described with reference to FIG. 1. First, an image A 101 in a field of view on a sample is acquired. Then, the field of view is moved rightward by a field-of-view movement amount (about 100 nm, denoted by reference numeral 103), and an image B 106 is acquired. Note that there is an overlapping field of view between the field of view of the image A 101 and the field of view B 102 of the image B. It is assumed that there are a circle pattern 105 and a rectangle pattern 104 in the overlapping field of view. These patterns are seen in both the image A 101 and the image B 106. The positions of these patterns differ by the field-of-view movement amount 103 between the image A 101 and the image B 106.

On the assumptions described above, it is further assumed that the position of the circle pattern 105 in the image A is shifted leftward in the image B by a circle pattern movement amount 107 (100.1 nm). By the way, since the field-of-view movement amount 103 is not exact, the circle pattern movement amount 107 (100.1 nm) does not have to agree with the field-of-view movement amount 103. Similarly, it is assumed that a rectangle pattern movement amount 108 (102.1 nm) is determined.

The circle pattern movement amount and the rectangle pattern movement amount should perfectly agree with each other, because neither the circle pattern nor the rectangle pattern move in each of the two images A and B, and the position shift of the patterns caused by the movement of the field of view should be the same regardless of the position in the images or the shape of the patterns.

Thus, the disagreement between the values probably means that a local distortion occurs in the images. For example, a horizontal image distortion that occurs in the vicinity of the rectangle pattern (104) can be regarded as being about 2% larger than that in the vicinity of the circle pattern (105). This value can be calculated according to the following formula 1.

$$102.1 \text{ nm}/100.1 \text{ nm}=1.02 \quad \text{(formula 1)}$$

Other than the rectangle pattern, if there is a pattern having a characteristic shape at a different position in the image, the relative magnitude of the image distortion in the vicinity of the pattern can be similarly measured. If there are such patterns evenly distributed in the image, a distribution diagram of the image distortion of the image can be created.

This method has an advantage that no dimension calibration of the pattern on the sample is needed. In addition, there are fewer restrictions on the size or shape of the pattern. Therefore, this method has an advantage that the cost required to produce the sample can be reduced. This method further has an advantage that, since the image distortion distribution over the entire image can be essentially obtained at one time from only two images, the time and cost required for image distortion measurement can be reduced.

Although the field of view is moved in the horizontal direction in this embodiment, the field of view may be moved in an oblique direction at an angle of 45°. Then, the field of view can be moved in the horizontal direction and in the vertical direction at the same time. Then, the image distortion can be measured in the horizontal direction and in the vertical direction at the same time, and the measurement time can be advantageously reduced.

The electron microscope moves the field of view by beam shifting, for example. The beam shifting is an operation to move the field of view for observation of the electron microscope without moving the sample. For example, when the field of view is moved from the field of view A to the field of view B, the direction of the movement is an upper right direction at an angle of 45° with respect to the field of view A. The distance of the movement is a distance determined by about a tenth of the length and about a tenth of the width of the field of view A, for example. If the field of view has a size of 0.7 μm by 0.7 μm, for example, the distance of the movement is determined by 0.07 μm of rightward movement and 0.07 μm of upward movement.

Figure 2:
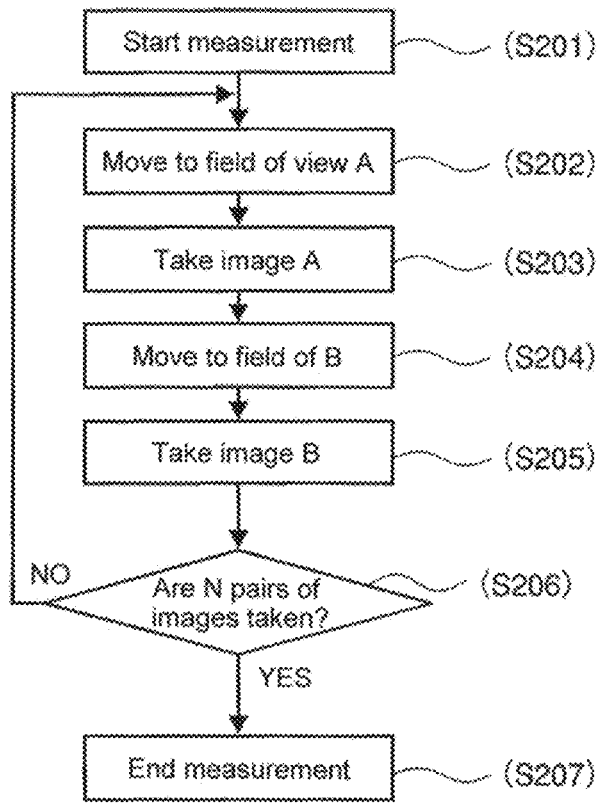
FIG. 2 is a flowchart for illustrating a process of acquiring an image required for distortion measurement.

FIG. 2 is a flowchart showing a process of acquiring an image required for image distortion measurement. First, a cue or signal to start measurement (Step 201) is transmitted to the apparatus. Then, in order to observe the sample in the particular field of view A, the field of view is moved to the field of view A by moving the sample or the optical system (Step 202). The image A is taken in the field of view A and stored in the storage apparatus (Step 203). Then, the field of view is moved to the field of view B (Step 204).

Then, the image B is taken and stored in the storage apparatus (Step 205).

By the procedure described above, a pair of images, the image A and the image B, is taken. In the actual measurement, in order to reduce an error caused by noise in the images, a plurality of pairs of images are preferably taken. Thus, the procedure described above is repeated in a loop until N pairs of images (N=10, for example) are obtained (Step 206).

Figure 3:
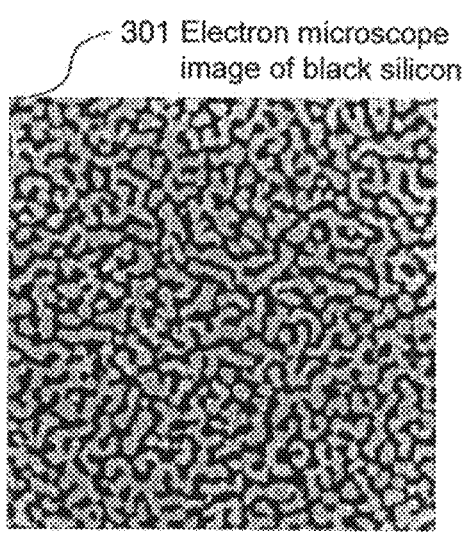
FIG. 3 is a diagram for illustrating an example of an image distortion measurement sample.

The sample imaged and observed preferably contains as many patterns or features having a characteristic shape as possible. For example, in image distortion measurement of the electron microscope, a sample referred to as a black silicon wafer is used, which is a silicon wafer dry-etched to have irregularities having a size of several to several tens of nanometers on the surface. FIG. 3 shows an electron microscope image 301 of a black silicon wafer as an example of the sample used for image distortion measurement. The length of each side of the image is about 0.7 μm. Observation conditions of the electron microscope is as follows: the acceleration voltage is 800V, the electron beam current is 8 pA, the magnification is 0.2 million times, the accumulated number of images is 64, and the image is formed by 512 rows by 512 columns of pixels.

Alternatively, the sample may be a semiconductor device having pit patterns having different shapes arranged with high density. Alternatively, the sample may be a silicon chip having irregularly arranged particle patterns formed by vapor deposition of gold.

Figure 4:
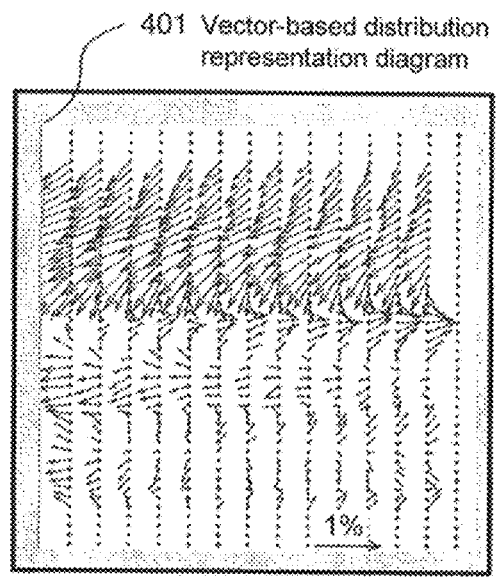
FIG. 4 is a diagram for illustrating an example of a representation of a distribution of an image distortion measurement result.

An in-plane distribution of the image distortion measured by the method described above can be expressed by a vector representation. FIG. 4 shows an example of the representation of the distribution of the image distortion. A vector-based distribution representation diagram 401 allows the local image distortion distribution to be seen at a glance. The X component and the Y component of each vector represent the X-directional component and the Y-directional component of the distortion. The length of the arrow shown at the bottom right of the vector-based distribution representation diagram 401 represents a distortion ratio of about 1%, so that the degree of the distortion can be roughly visually grasped by comparing the length of each vector with the length of the arrow.

The simplest method of correcting the measured image distortion is to correct based on the vector distribution obtained as described above. For example, pixel information for a particular position in the image is not correct pixel information because the effect of the distortion. The pixel information can be used as information on a pixel at a position that is shifted from the particular position by the magnitude of a vector closest to the particular position in the direction indicated by the vector.

For example, in a case where pixels having a brightness equal to or higher than a certain value are to be extracted, the positions of the extracted pixels are not always correct but can be shifted from the correct positions because of the image distortion. Thus, the X coordinate and the Y coordinate of each of the extracted pixels are shifted by the X component and the Y component of the distortion vector closest to the pixel, respectively. In this way, the correct distribution of the extracted pixels can be obtained.

The image distortion measurement method and the image distortion correction method described above are not exclusively applied to the electron microscope described above but can be applied to an optical microscope. Furthermore, the methods can be applied to measurement instruments or image processors that handle other types of images.

For example, in a case of measurement of the image distortion of a camera, a telescope or an astronomical telescope, a night sky with stars can be used instead of the black silicon wafer shown in FIG. 3. In the image acquisition flowchart shown in FIG. 2, the image A is an observation image of the night sky with stars taken with the astronomical telescope directed in a certain direction. The image B is an observation image taken after the astronomical telescope moved by a slight angle from the direction. The image distortion of the astronomical telescope can be numerically measured by comparing the two images according to the method according to this embodiment. Furthermore, based on the two images, the image distortion can be corrected according to the method according to this embodiment. This is because the positions of the stars in the sky can be regarded as being unchanged while the astronomic telescope is moved by the slight angle.

In the application to an artificial satellite, a satellite image of an area of a city on the Earth's surface dense with characteristic buildings can be used. When the artificial satellite is scanning the Earth's surface for image taking, two satellite images are taken at a short time interval, and the two images can be compared according to the method according to this embodiment to numerically measure the image distortion of the artificial satellite. Furthermore, based on the two satellite images, the image distortion can be corrected according to the method according to this embodiment. This is because the positions of the buildings on the Earth's surface can be regarded as being unchanged in the short time interval.

In the following, the method of evaluating information on a plurality of parts of an image and the method of properly evaluating an image distortion will be described in further details with reference to the drawings.

Figure 5:
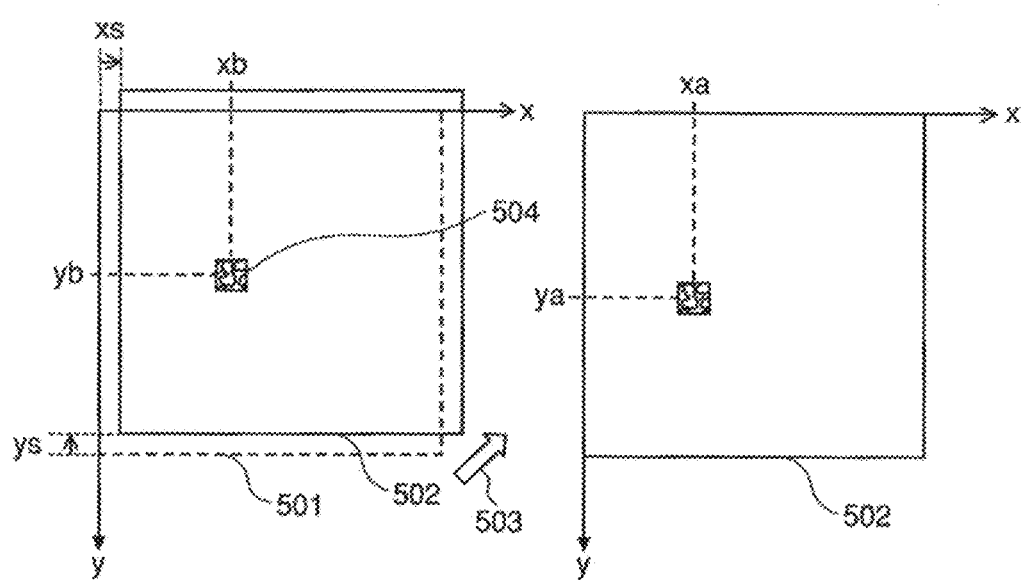
FIG. 5 includes diagrams for illustrating a principle on which the position of a pattern seen in a field of view changes between before and after the field of view is moved.

FIG. 5 includes diagrams for illustrating a principle on which the position of a pattern seen in the field of view changes between before and after the field of view is moved. The left half of FIG. 5 is a diagram for illustrating the coordinates of a particular area 504 on the assumption that the address of the upper left vertex of the field of view is (0, 0) ((1, 1) in terms of the number of pixels). The right half of FIG. 5 is a diagram for illustrating the coordinates of the particular area 504 after the field of view is moved. In this example, a field of view 501 is moved in a movement direction 503 to the position of a field of view 502. In this example, according to the setting made by the field-of-view shift condition setting section 903, the field of view is moved by (xs, ys) in the upper right direction in the drawing.

In this example, the position (xa, ya) of the particular area in the field of view 502 after movement would otherwise be (xb−xs, yb+ys). However, because of the image distortion or the like, the position (xa, ya) is shifted from the position (xb−xs, yb+ys). Thus, the actual movement amount can be determined by determining the values of xb−xa and yb−ya. The calculation is performed by the movement amount calculation section 906.

Figure 14:
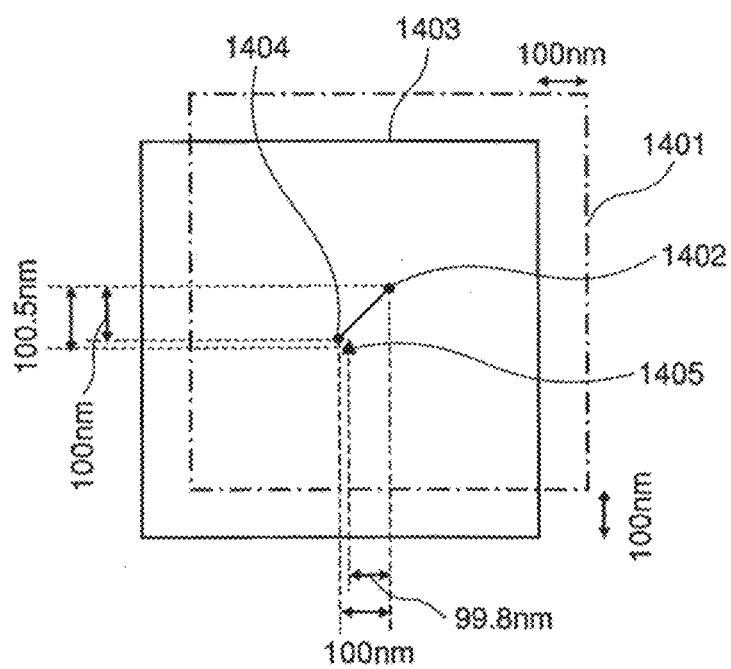
FIG. 14 is a diagram for illustrating an example of measurement of the movement amount of the reference position.

In this example, rather than the absolute value of the movement amount, a relative value of information concerning the shift amount of each site is determined, and a distribution of the relative values is defined as an image distortion. For example, in the example shown in FIG. 12, arbitrary reference sites 1203 and 1204 are determined in field of views 1201 and 1202, respectively, a ratio between a movement amount A determined for the reference sites and a movement amount B determined for other sites (sites 1205 and 1206, for example) (A/B, B/A or the like) is determined, and the ratio is used as information concerning a displacement of the sites due to the movement of the field of view. The displacement information is determined by the image distortion amount calculation section 907. Furthermore, the image distortion amount calculation section 907 calculates an image displacement vector that represents the image displacement between before and after the field of view is moved. FIG. 14 is a diagram for illustrating an example of measurement of the position (movement amount) of a site (reference position) of the field of view before and after the field of view is moved. In this example, the field of view is moved rightward by 100 nm and upward by 100 nm by image shifting. If the field of view is moved in this way, a reference position 1402 in a field of view 1401 before movement should be a reference position 1404 in a field of view 1403 after movement. However, an actual reference position 1405 can be shifted by +0.2 nm in the X direction and by −0.5 nm in the Y direction from the ideal reference position 1404 after movement of the field of view (on the assumption that the upper left vertex of the field of view is a point (0, 0)). In FIG. 14 and other drawings, the position shift is exaggerated for purposes of visual recognition.

Figure 13:
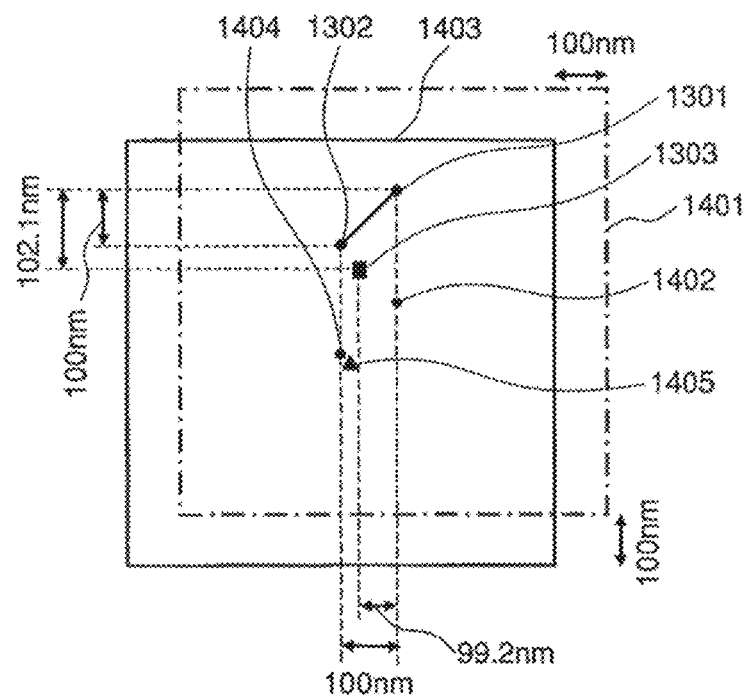
FIG. 13 is a diagram for illustrating an example in which a movement amount evaluation position is set at a different position than a reference position.

FIG. 13 is a diagram for illustrating an example in which a movement amount evaluation position 1301 is set at a point different from the reference position 1402. As with the reference position 1402, the movement amount evaluation position 1301 before movement of the field of view should be a reference position 1302 in a field of view 1403 after movement of the field of view. However, an actual movement amount evaluation position 1303 after movement of the field of view is shifted by +0.8 nm in the X direction and by −2.1 nm in the Y direction from its ideal position. Based on this result, the movement amount evaluation position is evaluated. First, the evaluation value in the X direction can be determined as follows.

$$99.2 \text{ nm}/99.8 \text{ nm}=0.99 \qquad \text{(formula 2)}$$

The evaluation value in the Y direction can be determined as follows.

$$102.1 \text{ nm}/100.5 \text{ nm}=1.02 \qquad \text{(formula 3)}$$

Thus, in the example shown in FIG. 13, the movement amount evaluation position is shifted from the reference position (the image is distorted) by 1% in the X direction and 2% in the Y direction. Based on the distortion information, a two-dimensional distortion evaluation value ($\sqrt{(x^2+y^2)}$) can be determined. Furthermore, the direction of the distortion can be calculated by determining the following value.

$$\arctan \theta = (y/x) \qquad \text{(formula 4)}$$

These calculations are performed by the image distortion amount calculation section 907 shown in FIG. 9 for a plurality of movement amount evaluation positions, and the result is stored in the calculation result storage section 909.

"x" represents the evaluation value of the distortion in the X direction, and "y" represents the evaluation value of the distortion in the Y direction. Although the evaluation value of the distortion is determined by calculating the ratio of the actual movement amount (change amount) of the movement amount evaluation position to the actual movement amount of the reference position in this example, the present invention is not limited to this implementation, and the evaluation value may be a movement amount difference. Furthermore, the ratio or dimension difference may be sorted into ranks 1, 2, 3, 4 and so on, and the rank may be used as the evaluation value. The smaller the displacement of the reference position between before and after movement of the field of view, the more accurately the degree of the distortion at the movement amount evaluation position can be determined, so that it is preferred that such a position is selected as the reference position.

Figure 15:
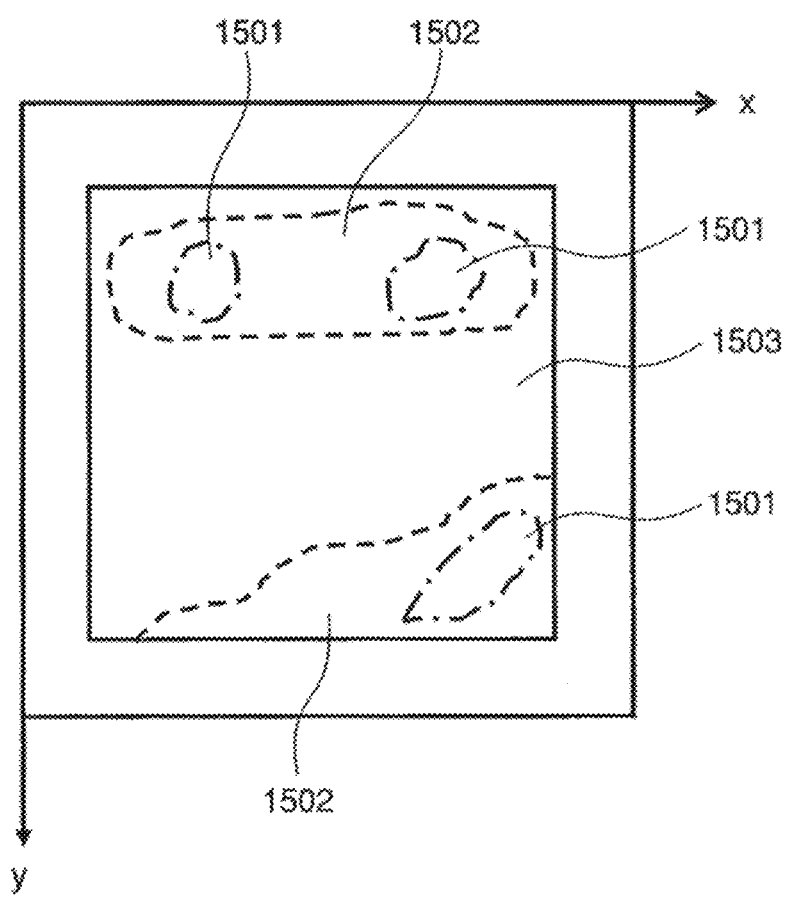
FIG. 15 is a diagram for illustrating an example of a distortion distribution diagram.

From the viewpoint that a position for which the evaluation value differs between before and after movement of the field of view is not preferred as the measurement area, it is preferred that an area in which the field-of-view movement amount and the movement amount of the movement evaluation position deviate significantly from each other can be identified by determining the difference between the movement amounts. FIG. 15 is an example of the distortion distribution diagram, which shows an example in which areas are sorted according to the degree of distortion. In the example shown in FIG. 15, an area 1501 enclosed by an alternate long and short dash line is defined as an area in which a high level of distortion occurs (the evaluation value of the distortion is higher than a first threshold), an area 1502 enclosed by a dotted line is defined as an area in which a medium level of distortion occurs (the evaluation value of the distortion is equal to or lower than the first threshold and higher than a second threshold), and a remaining area 1503 is defined as an area in which a low level of distortion or no distortion occurs (the evaluation value of the distortion is equal to or lower than the second threshold). Such a distribution representation allows a measurement area to be set or an area in which a measurement value is to be corrected to be identified while visually checking an area in which a deformation of a pattern edge or the like can occur because of a distortion. This effect can also be achieved if only the address of a part in which a high level of distortion can occur is selectively displayed. According to a simpler method, a distribution concerning information on the movement amount of the movement amount evaluation position can be displayed.

In this example, the distribution information may be determined based on the evaluation values determined according to the formulas 3 and 4 or determined based on the difference between the field-of-view movement amount and the movement amount of the movement amount evaluation position. However, there is a possibility that the set field-of-view movement amount and the actual field-of-view movement amount deviate from each other, the evaluation value of the distortion is preferably determined based on the ratio or difference between the reference position and the field-of-view movement amount evaluation position.

Figure 24:
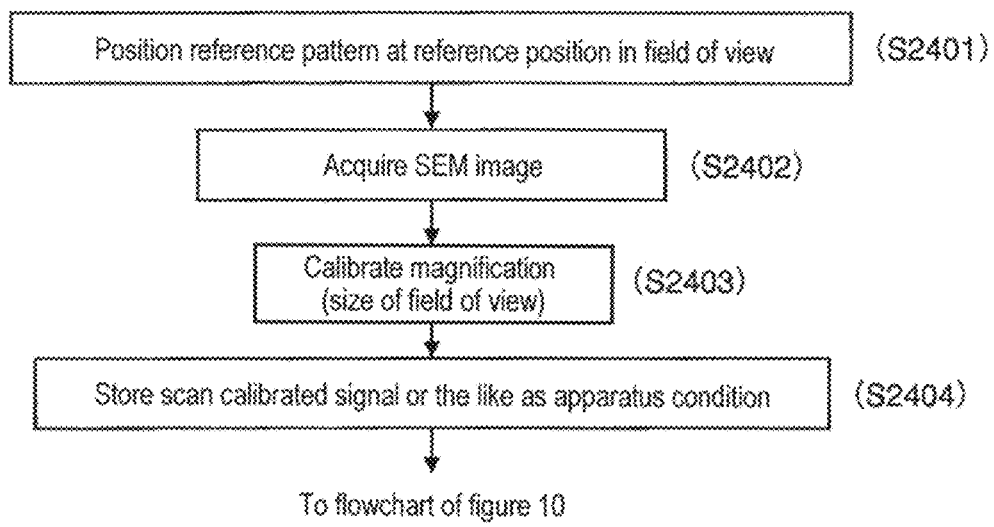
FIG. 24 is a flowchart for illustrating a process of performing magnification calibration using a reference pattern.
Figure 25:
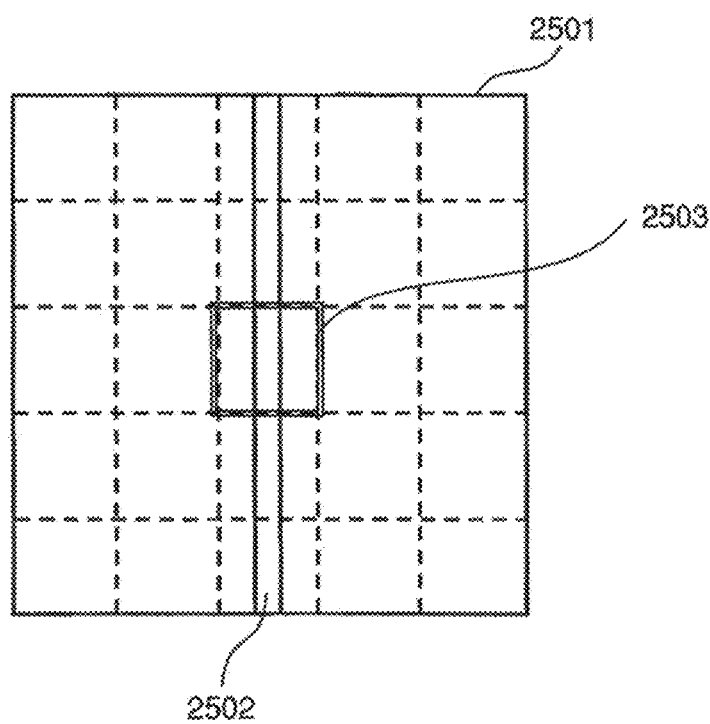
FIG. 25 is a diagram for illustrating an example in which the reference pattern is located at the reference position in the field of view.

Furthermore, the distortion can be accurately measured by taking an SEM image with a pattern with a guaranteed dimension disposed at the reference position and performing magnification calibration or the like based on the reference dimension of the part. FIG. 24 is a flowchart for illustrating this process. First, a standard sample (not shown) placed in advance on a sample stage 1101 is positioned in the field of view of the SEM (Step 2401). The pattern on the standard sample has a guaranteed absolute dimension and has a pattern width of 25 nm or 50 nm, for example. As illustrated in FIG. 25, the position of the field of view is set so that a reference position (reference area) 2503 allocated in a field of view 2501 is positioned on a pattern 2502. The size (magnification) of the field of view is the same as that of the image for which the movement amount evaluation described above is performed. Then, an SEM image or a dimension value of the pattern is acquired by electron beam scanning (Step 2402). Then, based on the ratio between the acquired dimension value and the dimension value of the pattern 2502, a magnification calibration value (or a scan width calibration value) is calculated (Step 2403). Since the dimension value of the pattern 2502 is guaranteed, the scan width is adjusted so that the measurement result agrees with the guaranteed dimension value. The adjusted scan signal value (or correction coefficient) is stored as an apparatus condition (Step 2404).

An image acquired by beam scanning according to the scan signal calibrated as described above can be regarded as an image that has no magnification distortion at least in the reference area. Thus, the distortion at each movement amount evaluation position can be accurately determined by performing the processing illustrated in FIG. 10 under the apparatus condition.

Figure 6:
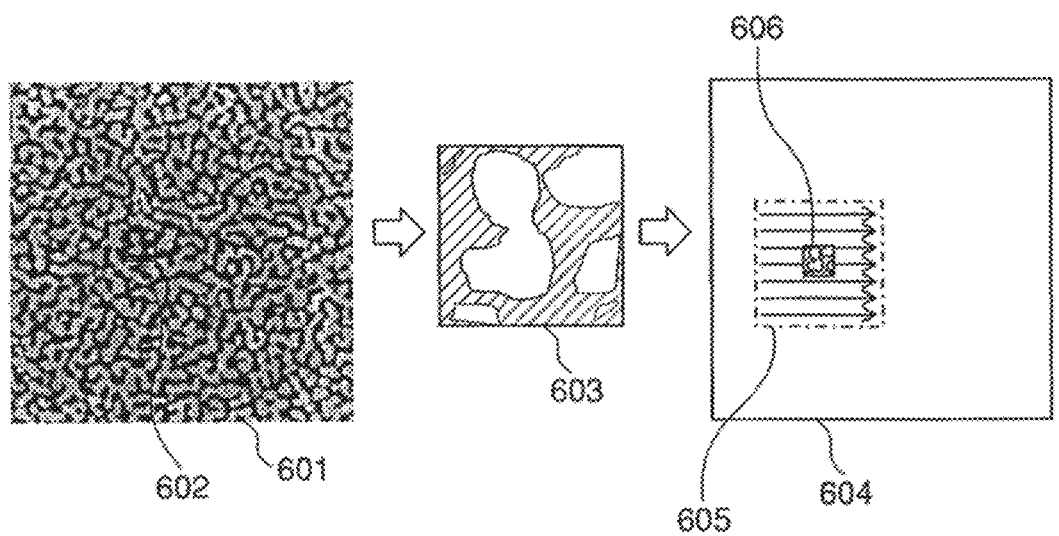
FIG. 6 is a diagram for illustrating an example in which the position of a particular area after movement of the field of view is determined by pattern matching.

FIG. 6 is a diagram for illustrating an example in which a two-dimensional area of the image before movement of the field of view (first image) at the reference position or the movement amount evaluation position (first position) is cut as a particular area to create a template for pattern matching, and the reference position or the movement amount evaluation position in the image after movement of the field of view (second image) is determined by pattern matching. First, the template setting section 904 illustrated in FIG. 9 cuts a particular area 602 from a first image 601 to create a template 603. The cut particular area is subjected to a binarization or smoothing processing as required and then is stored in the template storage section 908 as a template.

Then, on a second image 604, pattern matching is performed using the template 603 created as described above. The template setting section 904 sets a search area 605 for pattern matching with respect to a base point that is a position 606 shifted by the field-of-view movement amount from the position in the second image 604 that corresponds to the first position. The field-of-view movement amount is known, and the distortion amount is substantially smaller than the size of the field of view, so that the search area 605 can be smaller than the second image. Of course, the search area can be the entire second image. However, from the viewpoint of efficiency of the matching processing, the search area is preferably a part of the second image.

The movement amount calculation section 906 shown in FIG. 9 calculates the evaluation values of the distortions in the x direction and the y direction by determining the difference between the matching position in the second image 604 and the position in the first image from which the template has been cut before movement of the field of view or the difference between the matching position in the second image and the ideal movement destination position. The calculation result is stored in the calculation result storage section 909. Since the first image and the second image have the same magnification (the same size of field of view), the template cut from the first image and the area of the second image to which the template is applied are produced under substantially the same conditions, so that precise matching can be achieved.

Figure 12:
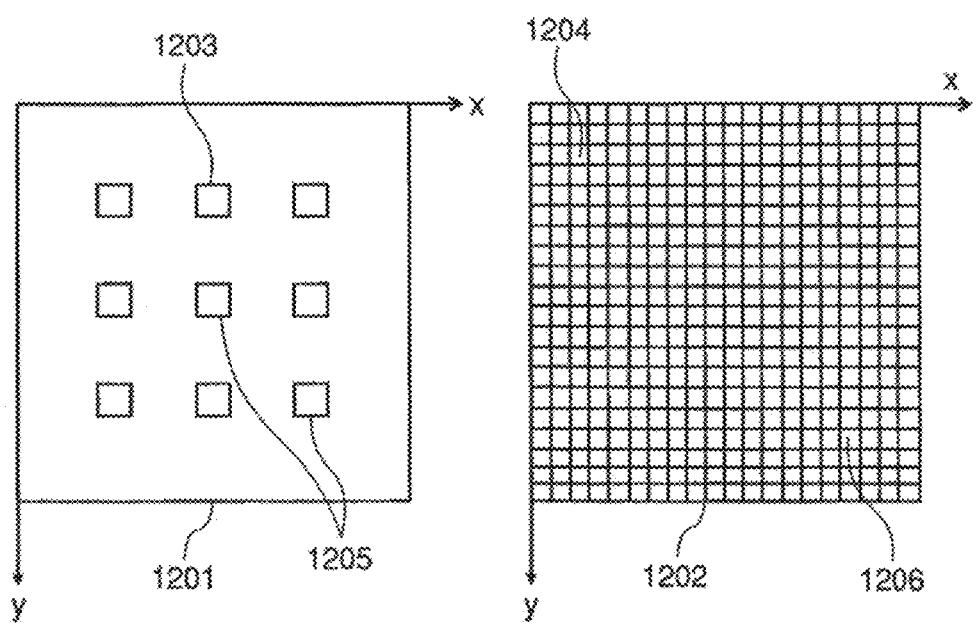
FIG. 12 is a diagram for illustrating examples of movement amount measurement positions for distortion measurement.

Next, an example of setting of the reference position and the movement amount evaluation position in an image to be evaluated will be described with reference to FIG. 12. The left half of FIG. 12 is a diagram for illustrating an example in which the distortion evaluation value is determined for nine sites including the reference position, and the right half of FIG. 12 is a diagram for illustrating an example in which a 20-by-20 matrix of sites are set, and the evaluation value is determined for each site. In the example shown in the left half of FIG. 12, a reference position 1203 and eighth movement amount evaluation positions 1205 are set. In the example shown in the right half of FIG. 12, a reference position 1203 and 399 movement amount evaluation positions 1206 are set. It is preferred that the evaluation target is the entire image as shown in the right half of FIG. 12 because a detailed distortion distribution over the entire image can be measured. However, in a case where the measurement site is limited to a particular area of the image, such as in a case where an SEM image is used for the measurement, the particular area can be selectively used for evaluation. The left half of FIG. 12 is an example of such an implementation, and the number of calculation steps can be reduced if the movement amount evaluation positions are set in a part of the image, rather than over the entire image. Furthermore, although the evaluation positions do not overlap with each other in the example shown in the left half of FIG. 12, the evaluation can be performed even if the two-dimensional areas to be cut are larger and overlap with each other.

Figure 10:
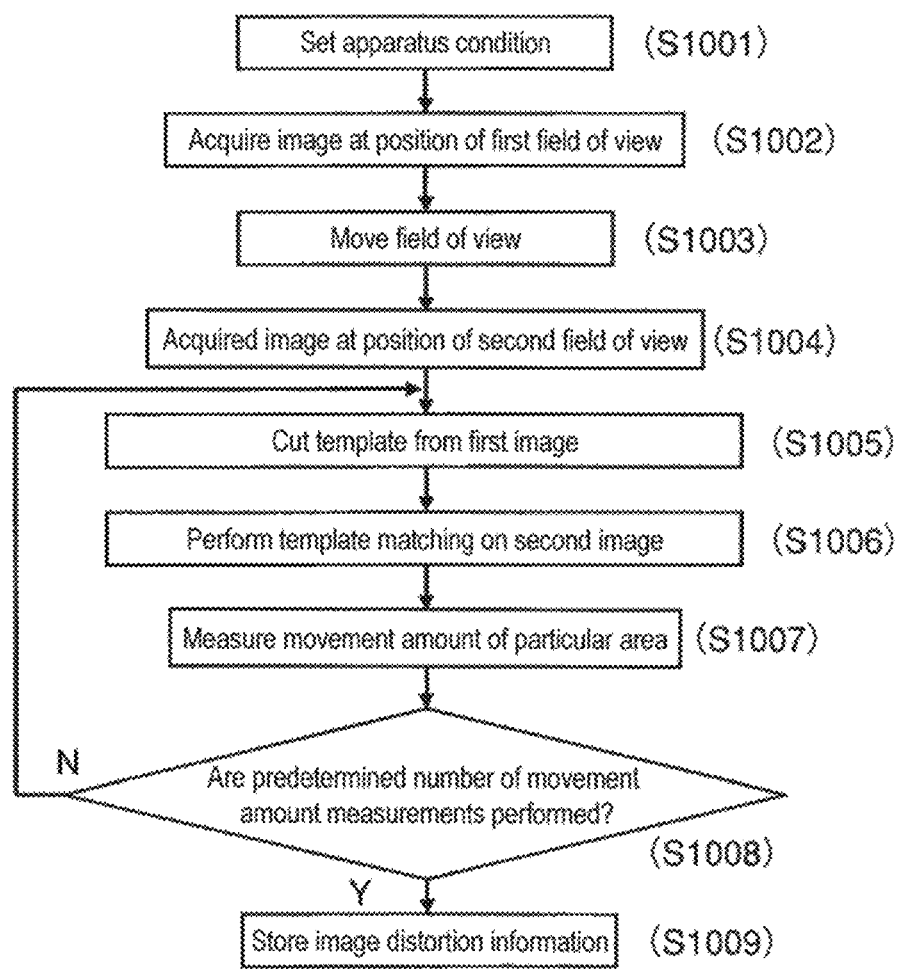
FIG. 10 is a flowchart for illustrating an image distortion evaluation process.

FIG. 10 is a flowchart for illustrating an image distortion evaluation process. First, an acquisition condition for an image for which distortion evaluation is to be performed and an apparatus condition, such as a distortion evaluation position condition, are set (Step 1001). Then, according to the set apparatus condition, a first image is acquired (Step 1002). After the first image is acquired, the field of view is moved (Step 1003), and a second image is acquired in a second field of view (Step 1004). Then, an area to form a template used for pattern matching on the second image is extracted from the first image (Step 1005). The extraction of the template may be performed immediately after Step 1002.

Then, using the template extracted from the first image, template matching is performed on the second image (Step 1006) to locate the position of the same area as the template in the image after movement of the field of view, thereby determining the movement amount (Step 1007). The template matching is performed for a predetermined number of positions (Step 1008), and the positional information is stored (Step 1009).

According to the process illustrated in FIG. 10, only two images (three images if the process includes the processing shown in FIG. 24) are needed to extract the distortion information for a plurality of sites.

Figure 11:
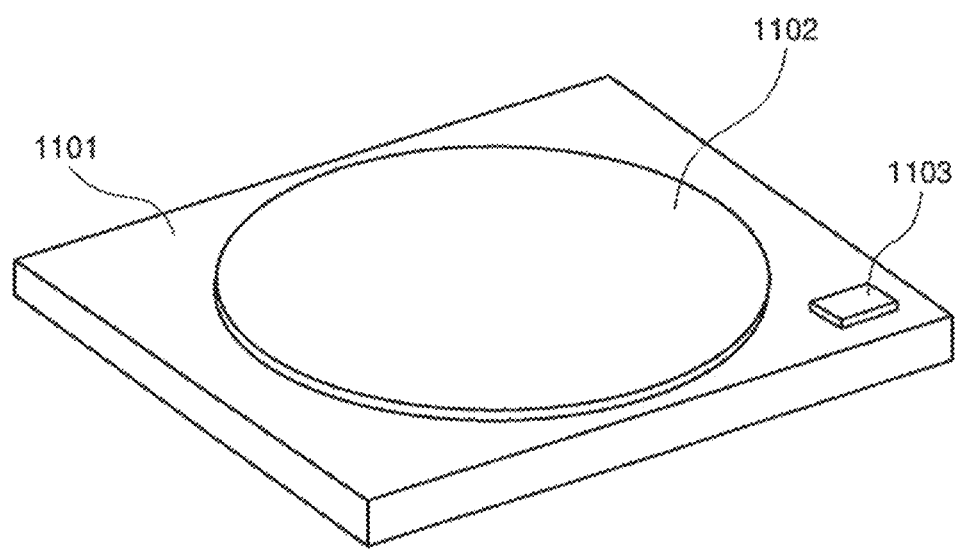
FIG. 11 is a diagram for illustrating an example of a sample stage on which a distortion evaluation sample is placed.

In this embodiment, the black silicon wafer illustrated in FIG. 3 is used as the sample for determining the distortion evaluation value. However, alternatively, a sample 1103 containing black silicon may be provided on a sample stage 1101 for a sample 1102 in the SEM as illustrated in FIG. 11. In particular, in the case of an SEM for semiconductor measurement and inspection, in which a pre-evacuation chamber (load lock chamber) 815 and a mini environment 817 are connected to a sample chamber 807 with a vacuum valve 814 interposed therebetween as illustrated in FIG. 8, a sample 818 containing black silicon may be prepared in the mini environment 817 and carried into a sample chamber 807 as required. Although the black silicon, which has an array of multiple patterns distinguishable by pattern matching in the field of view, is a preferred sample especially for the distortion evaluation according to this embodiment described herein, in this embodiment, any other samples than the black silicon that have similar properties can be used. Furthermore, a magnification calibration sample may be provided adjacent to the black silicon wafer.

Figure 26:
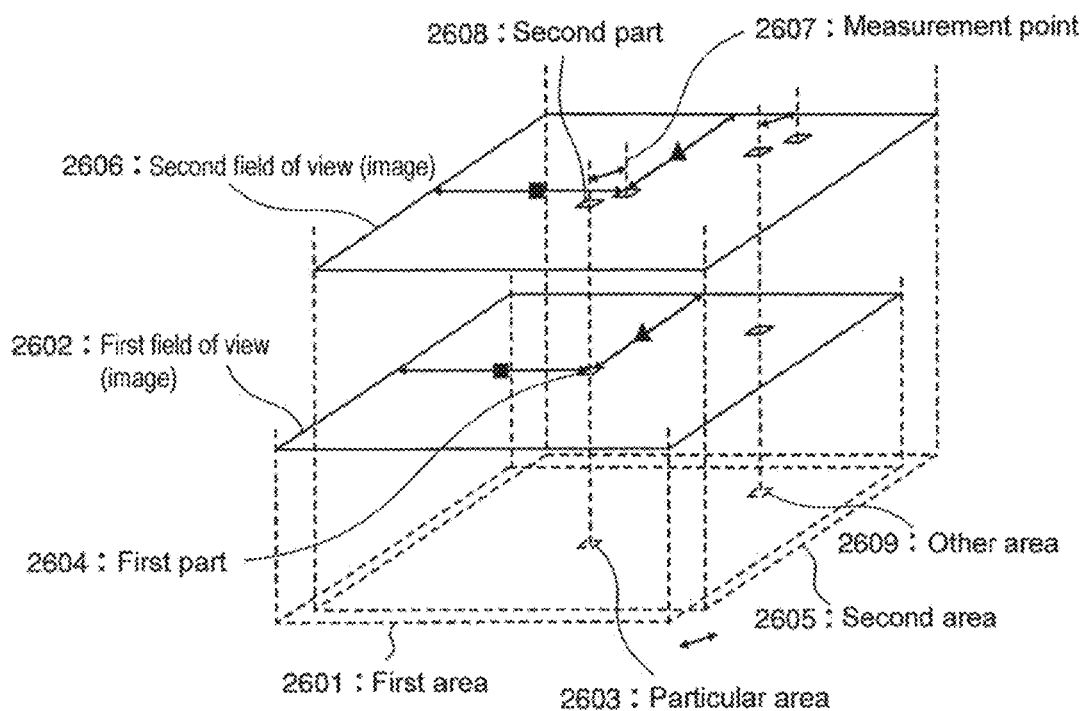
FIG. 26 is a conceptual diagram showing a method of calculating movement amounts of a plurality of sites between two fields of view.

FIG. 26 is a conceptual diagram for illustrating the method of calculating the movement amount for a plurality of sites in two fields of view described above. In this example, a first field of view 2602 is positioned in a first area 2601 of a sample to acquire a first image, and a second field of view 2606 is positioned in a second area 2605 that differs from the first area 2601 but partially overlaps with the first area 2601 to acquire a second image. In this example, a first part 2604, which corresponds to a particular area 2603 of the sample, is cut from the first image to create a template for pattern matching, and template matching is performed on the second image using the template to locate the position of a second part 2608 on the second image.

Then, the distance between the position located by template matching and a measurement point 2607 on the second image that corresponds to the first part of the first image is determined. The measurement of the movement amount is performed for other sites in the overlapping area of the first field of view 2602 and the second field of view 2606, such as another area 2609, thereby determining the movement amount of each site.

The first field of view 2602 and the second field of view 2606 have the same size, and scanning of the first and second fields of view is performed under the same conditions except that the scan position is slightly different. Since the first and second images are acquired under substantially the same conditions, the distortion distribution can be represented under substantially the same conditions. Furthermore, since the first and second images are slightly displaced from each other, the distortion at each site can be made remarkable.

Next, an application of the distortion evaluation value determined as described above to image correction or the like will be described.

Figure 16:
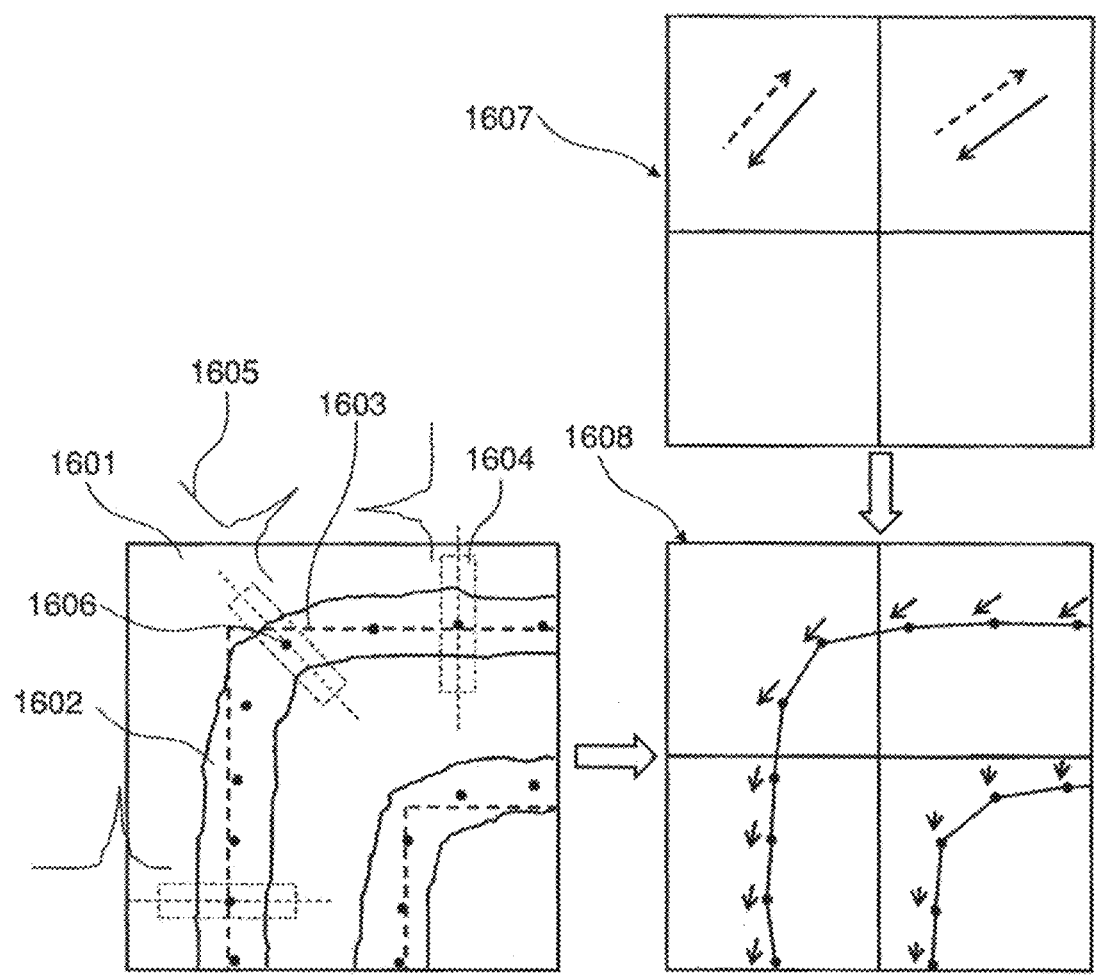
FIG. 16 is a diagram for illustrating a method of extracting a contour line from a pattern image.
Figure 17:
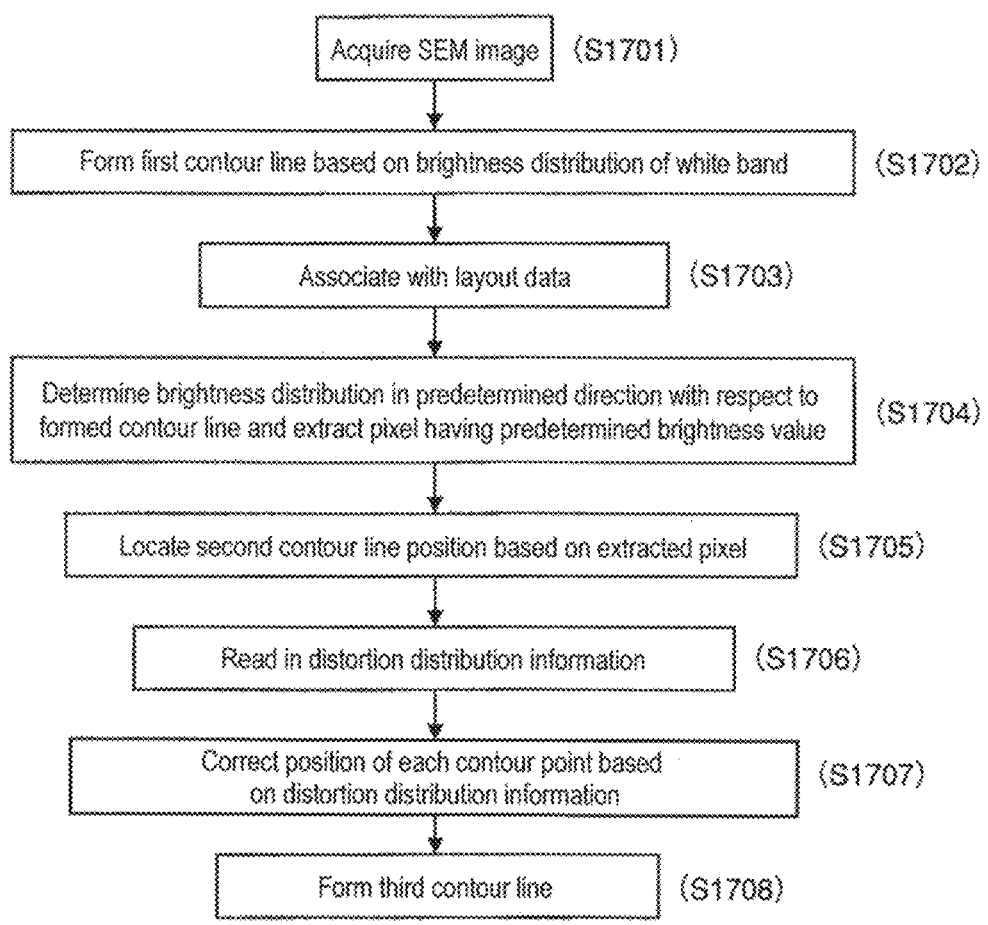
FIG. 17 is a flowchart for illustrating a contour line extraction process.

FIG. 16 is a diagram for illustrating an example of a method of extracting a contour line from a pattern image formed based on detected electrons. This contour line extraction process may be performed by the condition setting apparatus 704 or the controller 710 connected to the SEM. In the contour line extraction, as illustrated in FIG. 17, first, the SEM forms an SEM image 1601 (Step 1701). Then, a first contour line (not shown) is extracted from a white band 1602 corresponding to an edge part of a pattern in the SEM image (Step 1702). A possible method of extracting the first contour line is a method of thinning the edge part based on the brightness distribution of the white band 1602.

Then, the first contour line formed is checked against layout data 1603 included in the device design data by vector data comparison or pattern matching between the first contour line and the layout data 1603 (Step 1703). The layout data 1603 is line segment information in the design data stored in a GDS format or the like. After the checking, a brightness distribution information collection area 1604 is set to be perpendicular to the first contour line, and a brightness distribution 1605 is detected (Step 1704). A pixel having a predetermined brightness is extracted from the brightness distribution formed in this way, and the position of the pixel is defined as a second contour line position, thereby allowing location of a contour point needed to form an accurate contour line (Step 1705).

As the method of forming an accurate contour line described above, conventional methods described in JP Patent Publication (Kokai) Nos. 60-169977A (1985), 6-325176A (1994), 8-161508A (1996) and 9-204529A (1997) can be applied, for example.

In this embodiment, there is provided a method of forming an accurate contour line that is not affected by an image distortion by performing position correction of a point defined as another second contour line position 1606 based on distortion distribution information 1607. The distortion distribution information 1607 is information determined at a plurality of movement amount evaluation positions, and the distortion distribution information 1607 shown in FIG. 16 is a schematic representation of the information determined at a plurality of movement amount evaluation positions. The dotted line arrow indicates a distortion vector, and the solid line arrow indicates a correction vector. The two vectors are related so as to be counter to each other.

The distortion distribution information 1607 is read in (Step 1706), and the position of each contour point (second contour line position 1706) is corrected as illustrated in a correction screen 1608 (Step 1707). The contour points subjected to the position correction are connected to form a final contour line (third contour line) (Step 1708). The movement amount of each contour point in the distortion distribution information 1607 may be corrected by setting the relationship between the distortion evaluation value and the movement amount each time a contour line is formed or may be corrected based on a relational formula prepared in advance that represents the relationship between the distortion evaluation value and the movement amount. Alternatively, the movement amount of each contour point may be corrected by multiplying it by a distortion ratio. The direction of correction of the point of each point is opposite to the direction of the distortion, so that the calculation formula or the like is also set in that way.

Figure 18:
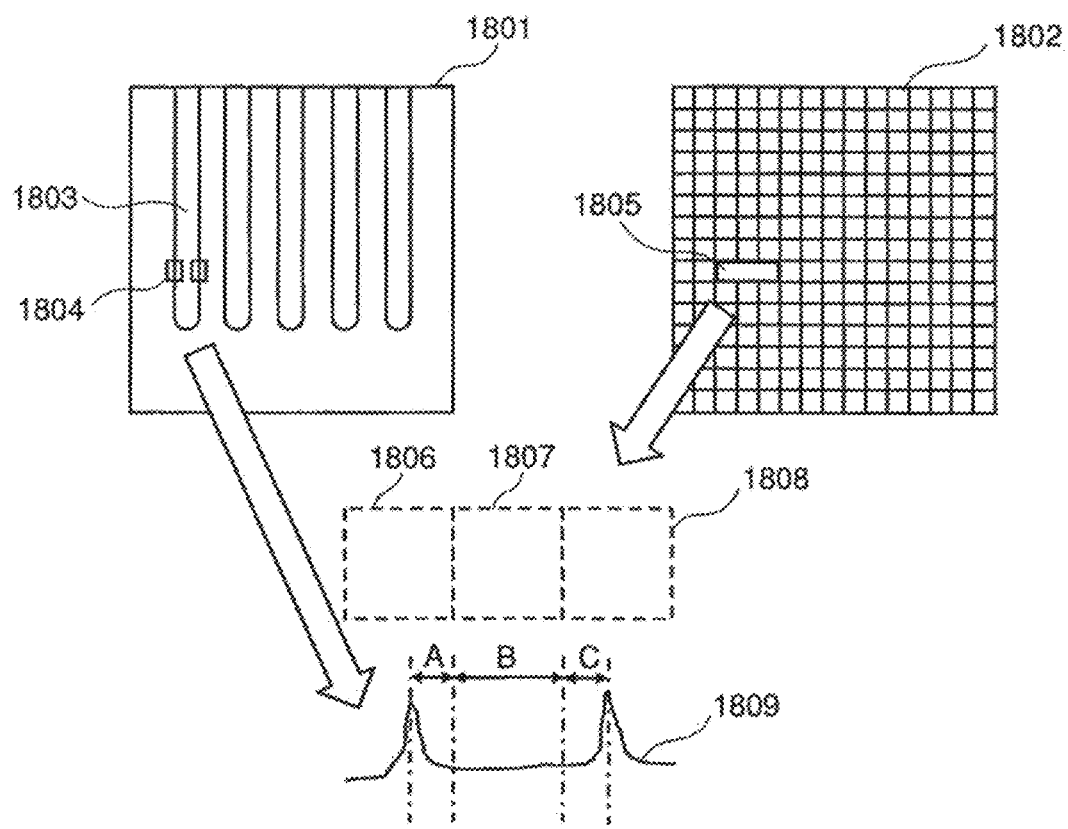
FIG. 18 is a diagram for illustrating an example in which a dimension measurement value is corrected based on distortion information.

In the CD-SEM that measures a dimension value of a semiconductor pattern, the measurement value can be corrected in the same way. FIG. 18 is a diagram for illustrating a specific example of that implementation. To measure the line width of a line pattern 1803 in an image 1801 including a plurality of line patterns, length measurement boxes 1804 are set. In this step, distortion information 1805 concerning the previously recorded length measurement boxes 1804 and an area between the length measurement boxes is extracted from distortion distribution information 1802.

Furthermore, a line profile 1809 of the line pattern 1803, which is signal amount distribution information, is formed. The distortion information 1805 includes distortion information concerning three small areas 1806, 1807 and 1808, which store their respective distortion information. The distortion information may be replaced with an expansion or contraction coefficient of the dimension in the length measurement direction (X direction in this example). Provided that the expansion or contraction coefficients of the small areas 1806, 1807 and 1808 are k1, k2 and k3, respectively, a length measurement value CD1 after distortion correction can be determined according to the following formula.

$$CD1 = k1 \cdot A + k2 \cdot B + k3 \cdot C \tag{formula 5}$$

According to the method described above, accurate pattern measurement can be achieved regardless of whether there is an image distortion or not.

Next, there will be described a method of comparing a simulation result in a semiconductor process and an SEM image (or a pattern contour line formed based on the SEM image). Recent semiconductor device design uses a simulation technique for evaluating the quality of the semiconductor device. However, the simulation result and the actually formed pattern may sometimes deviate from each other. Such a difference can be caused by low precision of the design data or simulation or caused by inappropriate setting of the process conditions. According to a possible method for verifying the cause, a plurality of patterns are formed under different design, simulation and/or process conditions, and the SEM images of the formed patterns and the simulation result are compared.

Figure 21:
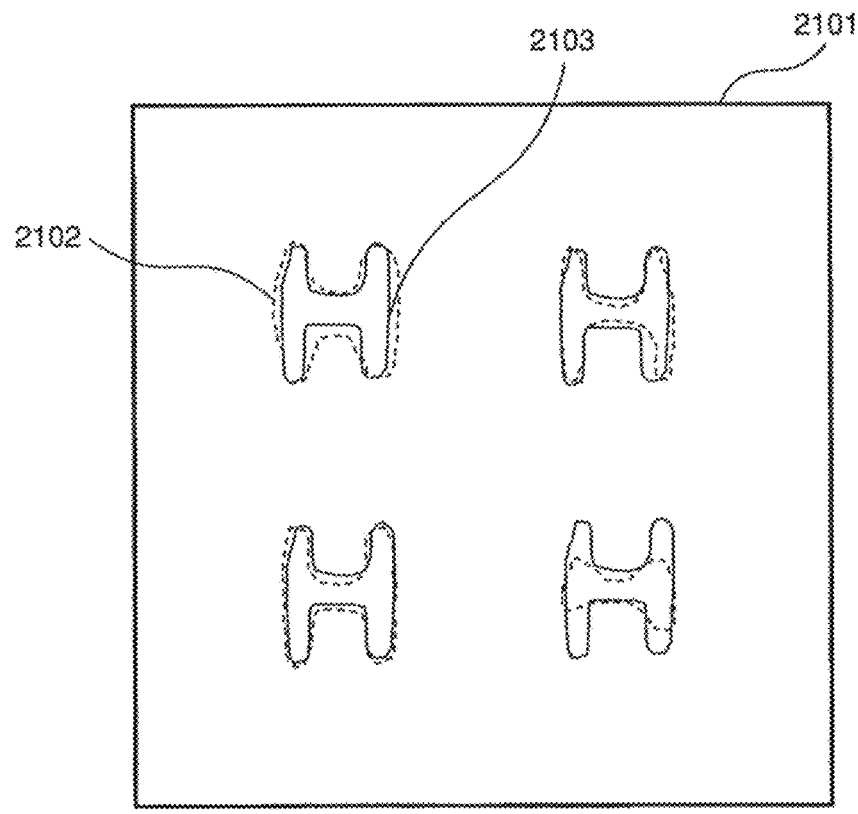
FIG. 21 is a diagram for illustrating an example in which the SEM image and a simulation image are superposed one on another.

FIG. 21 is a diagram for illustrating an example of an image in which four SEM images of a pattern taken under different process conditions (or contour lines 2102 formed based on the SEM images) and a pattern graphics 2103 obtained by simulation superposed one on another. In the case where there are a plurality of patterns at different positions in one FOV 2101, if an image distortion occurs, the precision of the result of the comparison at each position can decrease. However, by correcting the SEM image or the contour line according to the image distortion as illustrated in FIG. 16, the comparison can be prevented from being affected by the image distortion and made with high precision.

Figure 19:
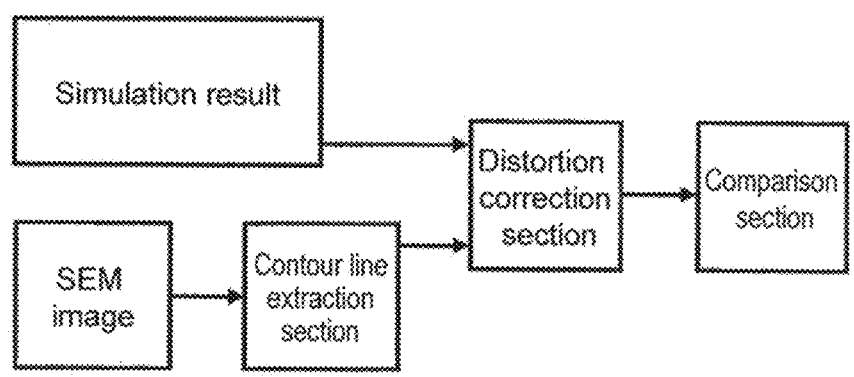
FIG. 19 is a block diagram for illustrating a process of comparing a simulation result and a SEM image based on distortion correction.

FIG. 19 is a block diagram for illustrating a process of comparing the simulation result and the SEM image based on the distortion correction. Although the contour line based on the SEM image is corrected in the example shown in FIG. 16, the pattern graphics obtained by simulation may be corrected. As illustrated in FIG. 19, the comparative inspection can be achieved with high precision by correcting the simulation result or the SEM image.

Figure 20:
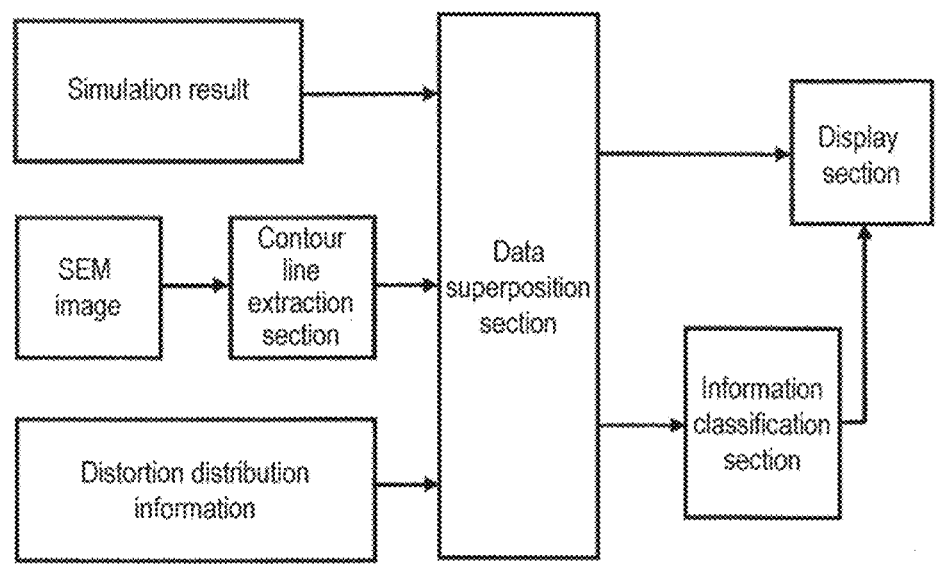
FIG. 20 is a block diagram for illustrating a process of displaying the simulation result, a contour line and distortion distribution information in a superposed manner.

As illustrated in FIG. 20, if the simulation result, the contour line and the distortion distribution information are displayed in a superposed manner, whether the deviation between the simulation result and the SEM image is caused by a factor relating to the simulation, such as the simulation precision, or by a factor relating to the SEM can be readily visually recognized without performing the distortion correction.

A position where the deviation between the simulation result and the SEM image is equal to or greater than a predetermined value, and the distortion amount is equal to or greater than a predetermined value (that is, both conditions are met) (such a position will be referred to as a class 1) and a position where the deviation between the simulation result and the SEM image is lower than the predetermined value although the distortion amount is equal to or greater than the predetermined value (such a position will be referred to as a class 2) can be considered as a position for which the precision of the comparative verification needs to be verified again, it is preferred to display the classification result superposed on the superposed image so that those positions can be easily recognized. If information concerning at least one of the position of class 1, the position of class 2 and a position where the deviation between the simulation result and the SEM image is lower than the predetermined value, and the distortion amount is also lower than the predetermined value (class 3) is superposed on the super posed image, the validity of the comparative verification can be easily judged. The classification described above is performed by an information classification section.

Figure 22:
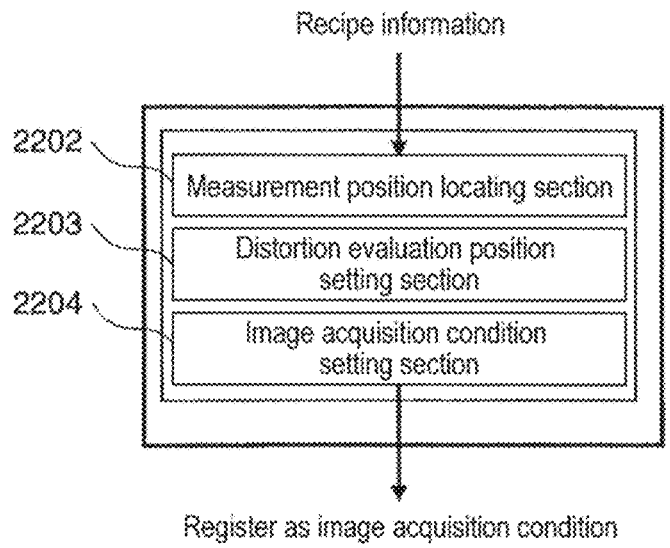
FIG. 22 is a diagram for illustrating an example of a processor that selects a part to be evaluated for distortion from a plurality of areas in FOV based on identification of a measurement or inspection site.

FIG. 22 is a diagram for illustrating an example of a processor that selects a part in which the distortion evaluation is to be performed from a plurality of areas in the FOV by measurement or location of an inspection site. A measurement or inspection apparatus represented by the CD-SEM performs measurement or inspection according to an operation program for the apparatus referred to as a recipe. That is, since the position where the measurement or inspection is to be performed is determined in advance, the efficiency of the distortion evaluation can be improved by selectively performing the distortion evaluation of the site. A measurement position locating section 2202 extracts information concerning a measurement or inspection position in the FOV from the recipe information, a distortion evaluation position setting section 2203 sets a movement amount evaluation position, which corresponds to the measurement position, and a reference position based on the extracted information, and an image acquisition condition setting section 2204 sets an apparatus condition for image acquisition based on the positional information.

With the configuration described above, the distortion evaluation can be more efficiently performed than in the case where the distortion evaluation is performed for the entire FOV.

Next, an example in which the image distortion evaluation is performed in a plurality of SEMs will be described according to the flowchart illustrated in FIG. 23. Three SEMs 701 to 703 are connected to the measurement or inspection system illustrated in FIG. 7. The plurality of SEMs preferably output the same measurement result when they measure the same thing. However, if there is an individual difference (machine difference) between the apparatuses, the measurement result may differ between the apparatuses. In a case where each apparatus measures an image distortion when there is a machine difference, it may be difficult to distinguish whether the image distortion is caused by the machine difference or by an external factor that occurs for a while (a vibration in the vicinity of the SEMs, for example). In this example, there is provided a method of determining whether the difference in degree of image distortion between the apparatuses is caused by the machine difference or not by configuring the plurality of apparatuses so as to simultaneously acquire an image used for image distortion evaluation. The term "simultaneously" used in this example does not mean the perfect same time, and the apparatuses can sequentially perform the measurement in a period when an event that can cause a difference in image distortion between the apparatuses occurs.

Figure 23:
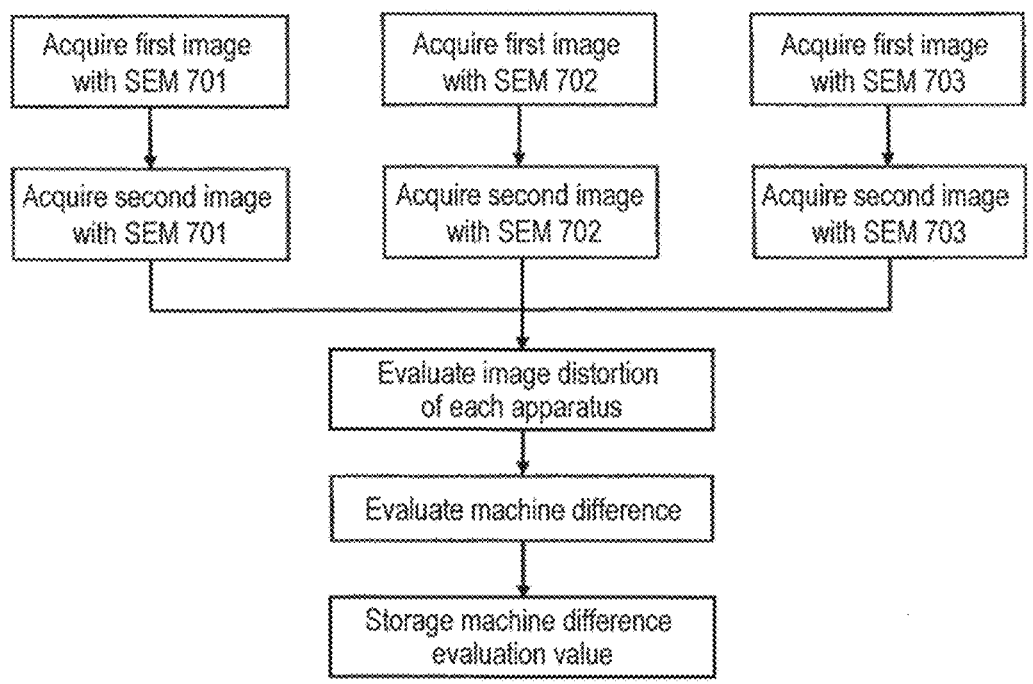
FIG. 23 is a diagram for illustrating a process of evaluating an image distortion in a plurality of SEMs.

As illustrated in FIG. 23, the plurality of (three, in this example) SEMs acquire a first image before movement of the field of view and a second image after movement of the field of view. After that, image distortion evaluation is performed for each apparatus, the machine difference is evaluated based on the evaluation values, and the information on the machine difference is stored in a predetermined storage medium.

According to the method described above, the cause of the image distortion can be properly determined, and the machine difference can be stably measured without being affected by the image distortion.

In the embodiment described so far, using each movement amount determined by the movement amount calculation section 906, the image distortion amount calculation section 907 determines the evaluation value by the calculations according to the formulas 2, 3 and the like and calculates the image displacement vector that represents an image displacement between before and after movement of the field of view (the image distortion distribution 401 in FIG. 4).

These are indexes of the degree of local image distortion (the image distortion ratio provided that 0% represents no distortion). That is, the distortion ratio does not always directly indicate the movement amount of the position of the acquired pattern to be measured or the contour line position of the pattern due to the image distortion or the distortion distribution information 1607. To correct a shift of a detection point due to a distortion in measurement of the distance between two arbitrary points in an image, the distribution of position shift amounts due to distortions needs to be determined. The distortion vector 1607 illustrated in FIG. 16 is an example of the distribution. To determine the distortion vector, a distortion component due to the image distortion itself and a distortion component due to the movement of the field of view have to be taken into consideration.

Figure 27:
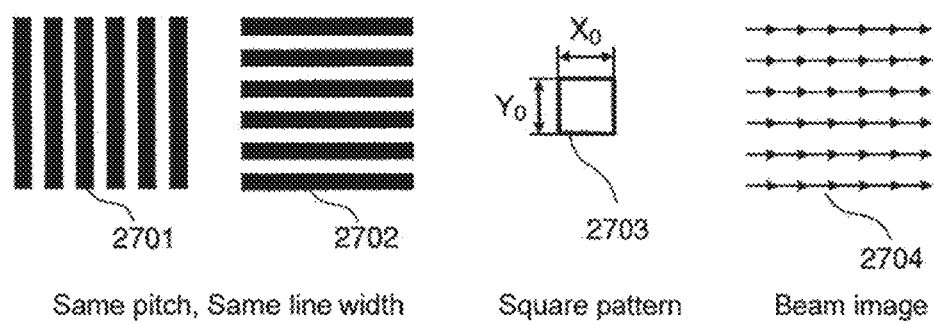
FIG. 27 is a diagram showing an example of an image that is not distorted.

In the following, an image distortion assumed in the scanning electron microscope or the like will be described. It is assumed that an image is scanned with a charged particle beam in the horizontal direction, the horizontal direction is the X direction, and the vertical direction is the Y direction. FIG. 27 shows image examples 2701 to 2703 and a scan line beam image 2704 in a case where no image distortion occurs. Since no distortion occurs in the image, the dimensions and shape of the pattern in the image do not change. Each arrow in the beam image 2704 of the scanning electron microscope indicates the scan speed and the scan direction in the area, and a series of arrows represents one scan line. If no image distortion occurs, the scan speed is the same for all the scan lines and is constant in the X direction and 0 in the Y direction. The intervals between the scan lines in the Y direction is constant, and the X coordinates of the start points of the scan lines agree with each other.

Local distortions assumed in the scanning electron microscope can be generally classified into the following four types of distortions.

The first type of distortion is a dimension change in the X direction due to a magnification distortion in the X direction. The vertical line 2701 having a uniform width changes in line width dimension due to the image distortion as shown as a vertical line 2801 in FIG. 28, although the horizontal line 2701 having a uniform width does not change in line dimension as shown as a horizontal line 2802. As for the sign (positive or negative) of the distortion ratio, it is assumed that the small square pattern 2703 increases in dimension in the X direction as shown as a pattern 2803 when the magnification distortion ratio in the X direction is positive. The magnification distortion ratio in the X direction is defined by the following formula, provided that the dimension in the X direction of the pattern 2803 in the image having no distortion is denoted by $X_0$, and the dimension difference due to the distortion is denoted by δx.

Magnification distortion ratio in the $X$ direction
$$DMx = \delta x / X_0 \qquad \text{(formula 6)}$$

In the scanning electron microscope, a main cause of this type of distortion is a nonuniform scan speed (X component) of the beam moved by beam deflection in the X direction from the left end to the right end of the image as shown by a beam image 2804. The magnification distortion ratio is negative in an area of the image in which the scan speed is higher than the scan speed in a reference area and is positive in an area in which the scan speed is lower than the scan speed in the reference area.

The second type of distortion is a dimension change in the Y direction due to a magnification distortion in the Y direction. As shown in FIG. 29, a horizontal line 2902 changes in line width dimension, whereas a vertical line 2901 does not change in line dimension. A small square pattern 2903 increases in dimension in the Y direction when the magnification distortion ratio in the Y direction is positive. The magnification distortion ratio in the Y direction is defined by the following formula, provided that the dimension in the Y direction of the pattern 2903 in the image having no distortion is denoted by $Y_0$, and the dimension difference due to the distortion is denoted by δy.

Magnification distortion ratio in the $Y$ direction
$$DMy = \delta y / Y_0 \qquad \text{(formula 7)}$$

In the scanning electron microscope, a main cause of this type of distortion is a nonuniform interval between the scan lines due to disturbing noise in synchronization with the frequency of the power supply as shown by a beam image 2904. If no distortion occurs, the interval between two adjacent upper and lower scan lines is determined by the set Y magnification. If the magnification distortion in the Y direction occurs, the magnification distortion ratio is negative in an area in which the lower scan line is below the relative position with respect to the upper line determined by the Y magnification and is positive in an area in which the lower scan line is above the relative position determined by the Y magnification.

The third type of distortion is a shape change due to a shear distortion in the X direction. As shown in FIG. 30, a vertical line 3001 changes in line shape. Both the vertical line and a horizontal line 3002 do not change in line dimension. A small square pattern 3003, which is an example in which the shear distortion in the X direction is positive, changes in shape but does not change in area. The shear distortion ratio in the X direction is defined by the following formula, provided that the dimension in the Y direction of the pattern 3003 in the image having no distortion is denoted by $Y_0$, and the shear shift amount in the X direction due to the distortion is denoted by δs.

$$\text{Shear distortion ratio in the } X \text{ direction } DSx = \delta s/Y_0 \quad \text{(formula 8)}$$

In the scanning electron microscope, a main cause of this type of distortion is a variation of the relative positions of the scan lines with respect to each other in the X direction due to disturbing noise or the like in synchronization with the frequency of the power supply as shown by a beam image 3004. The shear distortion ratio is determined by the relative position in the X direction of the lower scan line with respect to the upper scan line of two adjacent upper and lower scan lines. The shear distortion in the X direction is positive in an area in which the lower scan line is displaced rightward from the upper scan line, and is negative in an area in which the lower scan line is displaced leftward from the upper scan line.

Figure 31:
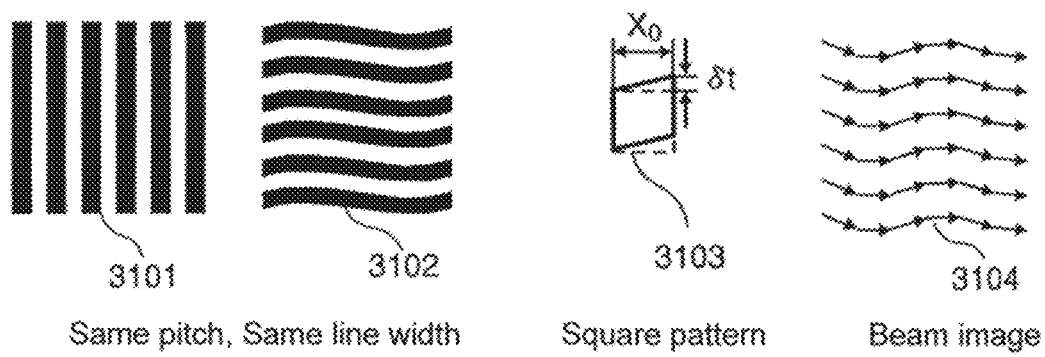
FIG. 31 is a diagram showing an example of an image in which a shear distortion in the Y direction occurs.

The fourth type of distortion is a shape change due to a shear distortion in the Y direction. As shown in FIG. 31, a horizontal line 3102 changes in line shape. Both a vertical line 3101 and the horizontal line do not change in line dimension. A small square pattern 3103, which is an example in which the shear distortion in the Y direction is positive, changes in shape but does not change in area. The shear distortion ratio in the Y direction is defined by the following formula, provided that the dimension in the X direction of the pattern 3103 in the image having no distortion is denoted by $X_0$, and the shear shift amount in the Y direction due to the distortion is denoted by δt.

$$\text{Shear distortion ratio in the } Y \text{ direction } DSy = \delta t/Y_0 \quad \text{(formula 9)}$$

In the scanning electron microscope, a main cause of this type of distortion is a Y component of the scan speed of the beam moved by beam deflection in the X direction from the left end to the right end of the image as shown by a beam image 3104. The shear distortion in the Y direction is positive in an area in which the speed in the Y direction is negative (represented by a downward vector), and is negative in an area in which the speed in the Y direction is positive (represented by an upward vector).

In this embodiment, to determine the distortion ratio distribution of an image, two images having overlapping areas are first acquired. Then, the position shift amount due to the distortion is calculated from the distortion ratio distribution.

Although a specific measurement method and a component of the distortion ratio to be measured will be described later, the distortion ratio to be measured is a relative distortion value with respect to a reference. Therefore, to determine the distortion ratio at each measurement point, a reference where no distortion occurs (the distortion ratio is 0) needs to be determined. The reference distortion can be the distortion at a particular position in the image or be an average of the distortion in an area having a certain width. As an example of the reference magnification distortion, the magnification distortion in the area measured in the magnification calibration shown in FIG. 24 can be used for measuring the distribution of the magnification distortion ratio. An example of the reference shape distortion (shear distortion) is the shape distortion in the area calibrated with a standard rectangle sample, for example. An average of the distortion ratio over the entire image can be zero distortion.

In this example, the distortion in an area at the center of the image is used as a reference distortion (including no shear distortion).

Next, examples of the direction of shifting of the field of view and the distortion component to be measured will be described.

Figure 32:
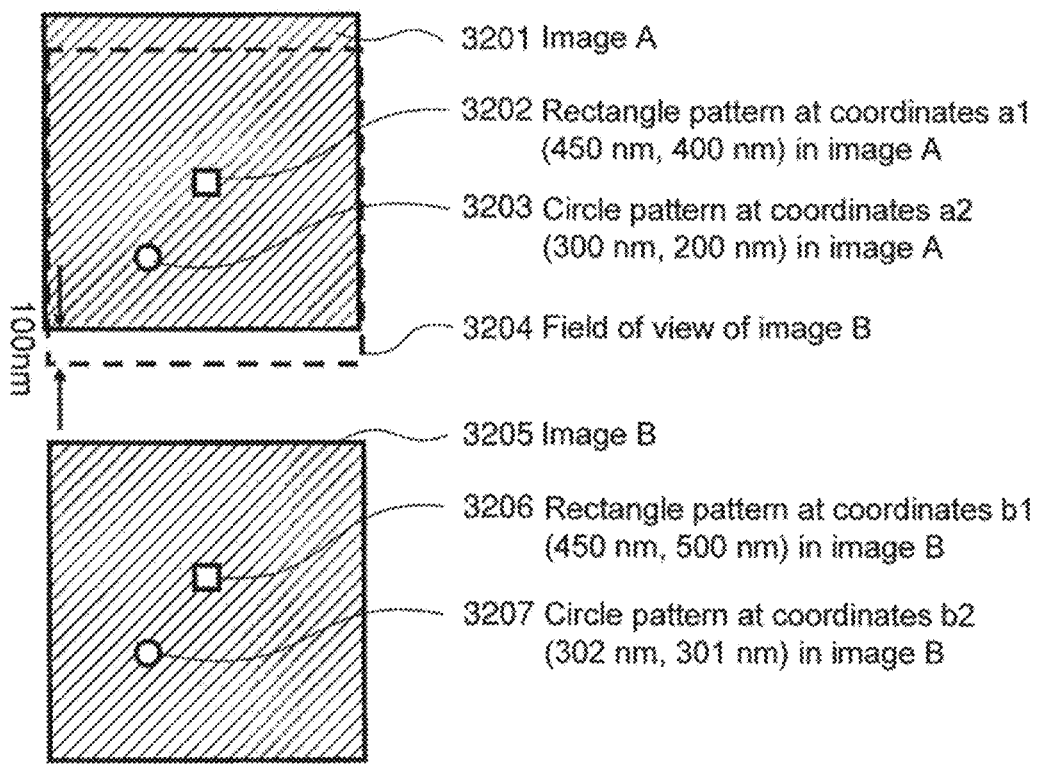
FIG. 32 is a diagram for illustrating a principle of image distortion measurement (the field of view is shifted in the Y direction).

FIG. 32 shows an example in which the magnification distortion ratio in the Y direction and the shear distortion in the X direction are calculated using two images taken in different fields of view shifted in the Y direction. First, a first image (A 3201) is acquired. It is assumed that a rectangle pattern 3202 is a pattern at an image distortion reference position and is located at coordinates a1 (450 nm, 400 nm) in the image A. It is assumed that a circle pattern 3203 is a pattern at an image distortion evaluation position and is located at coordinates a2 (300 nm, 200 nm) in the image A. Then, the field of view is moved rightward by 0 nm and downward by 100 nm, and an image B is acquired in a new field of view 3204. A rectangle pattern 3206 in the image B is located at coordinates b1 (450 nm, 500 nm), which is shifted from the coordinates a1 rightward by 0 nm and upward by 100 nm as a result of the movement of the field of view. Therefore, a movement vector (Xs, Ys) of the reference position is (0, 100 nm). If no image distortion occurs, a circle pattern in the image B is located at coordinates (300 nm, 300 nm) shifted rightward by 0 nm and upward by 100 nm as with the rectangle pattern. However, it is assumed here that an image distortion occurs in the area of the circle pattern, and the circle pattern is moved rightward by 2 nm and upward by 101 nm and is located at coordinates b2 (302 nm, 301 nm) in the image B. A movement vector (Xa, Ya) of the evaluation position is (2, 101 nm).

The fact that the movement amount in the Y direction of the evaluation position is 1% greater than the movement amount in the Y direction of the reference position shows that the magnification in the Y direction in the area of the image between the coordinates b1 and b2 is 101% of the magnification in the Y direction at the reference position, and the magnification distortion ratio in the Y direction is +1%. This can be expressed by the following formula.

$$\text{Magnification distortion ratio in the } Y \text{ direction } DMy = \quad \text{(formula 10)}$$
$$(Ya - Ys)/Ys \times 100 = (101 - 100)/100 \times 100 = 1\%$$

On the other hand, the fact that the difference in movement amount in the X direction between the evaluation position and the reference position is +2% of the movement amount in the Y direction of the reference position shows that the shear distortion ratio in the X direction in the area of the image between the coordinates b1 and b2 is 2% greater than the shear distortion ratio at the reference position, and the shear distortion ratio in the X direction at the evaluation position is +2% provided that the shear distortion ratio at the reference position is 0. This can be expressed by the following formula.

$$\text{Shear distortion ratio in the } X \text{ direction } DSy = \quad \text{(formula 11)}$$
$$(Xa - Xs)/Ys \times 100 = (2 - 0)/100 \times 100 = 2\%$$

The distortion ratio at the evaluation position is the value in the area of the image between the coordinates b1 and b2.

The measurement result can also be used as the measurement result of the distortion ratio at a measurement point at intermediate coordinates b (300 nm, 250 nm) between the two points.

Figure 33:
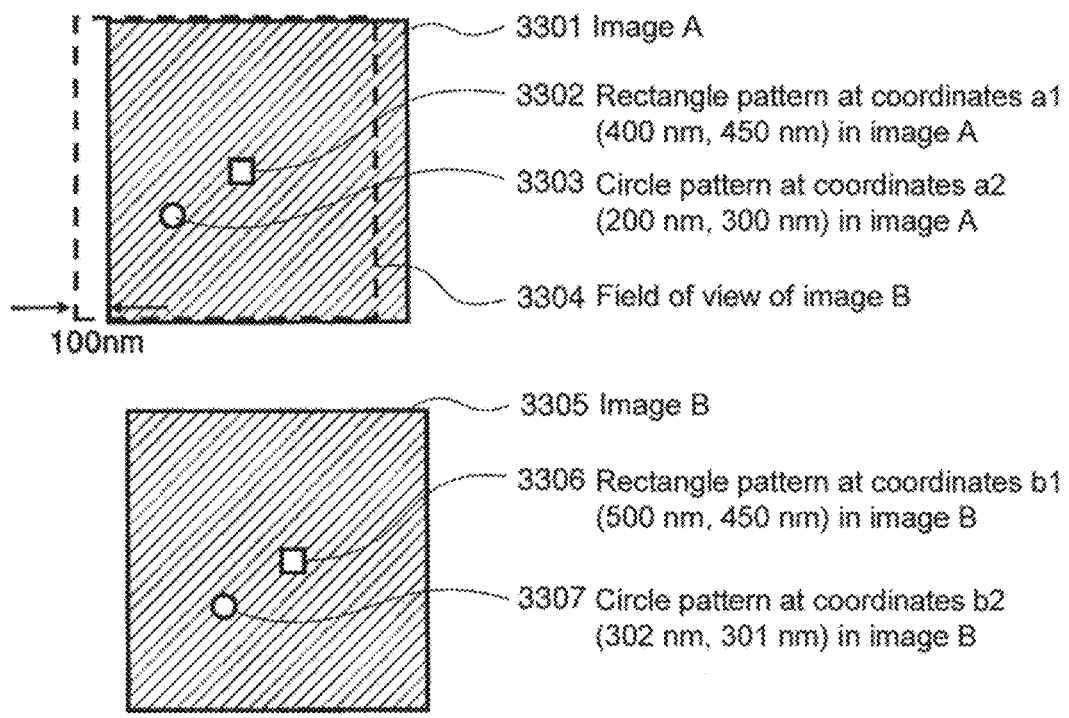
FIG. 33 is a diagram for illustrating a principle of image distortion measurement (the field of view is shifted in the X direction).

FIG. 33 shows an example in which the magnification distortion ratio in the X direction and the shear distortion in the Y direction are calculated using two images taken in different fields of view shifted in the X direction. First, a first image (A 3301) is acquired. It is assumed that a rectangle pattern 3302 is a pattern at an image distortion reference position and is located at coordinates a1 (400 nm, 450 nm) in the image A. It is assumed that a circle pattern 3303 is a pattern at an image distortion evaluation position and is located at coordinates a2 (200 nm, 300 nm) in the image A. Then, the field of view is moved leftward by 100 nm and upward by 0 nm, and an image B is acquired in a new field of view 3204. A rectangle pattern 3206 in the image B is located at coordinates b1 (500 nm, 450 nm), which is shifted from the coordinates a1 rightward by 100 nm and upward by 0 nm as a result of the movement of the field of view. Therefore, a movement vector (Xs, Ys) of the reference position is (100, 0 nm). If no image distortion occurs, a circle pattern in the image B is located at coordinates (300 nm, 300 nm) shifted rightward by 100 nm and upward by 0 nm as with the rectangle pattern. However, it is assumed here that an image distortion occurs in the area of the circle pattern, and the circle pattern is moved rightward by 102 nm and upward by 1 nm and is located at coordinates b2 (302 nm, 301 nm) in the image B. A movement vector (Xa, Ya) of the evaluation position is (102, 1 nm).

The fact that the movement amount in the X direction of the evaluation position is 2% greater than the movement amount in the X direction of the reference position shows that the magnification in the X direction in the area of the image between the coordinates b1 and b2 is 102% of the magnification in the X direction at the reference position, and the magnification distortion ratio in the X direction is +2%. This can be expressed by the following formula.

Magnification distortion ratio in the $X$ direction $DMx =$ (formula 12)

$(Xa - Xs)/Xs \times 100 = (102 - 100)/100 \times 100 = 2\%$

On the other hand, the fact that the difference in movement amount in the Y direction between the evaluation position and the reference position is +1% of the movement amount in the X direction of the reference position shows that the shear distortion ratio in the Y direction in the area of the image between the coordinates b1 and b2 is 1% greater than the shear distortion ratio at the reference position, and the shear distortion ratio in the Y direction at the evaluation position is +1% provided that the shear distortion ratio at the reference position is 0. This can be expressed by the following formula.

Shear distortion ratio in the $Y$ direction $DSx =$ (formula 13)

$(Ya - Ys)/Xs \times 100 = (1 - 0)/100 \times 100 = 1\%$

The distortion ratio at the evaluation position is the value in the area of the image between the coordinates b1 and b2. The measurement result can also be used as the measurement result of the distortion ratio at a measurement point at intermediate coordinates b (300 nm, 250 nm) between the two points.

[Distortion Characteristics of Electron Microscope and Improvement of Measurement Precision by Averaging]

Figure 34:
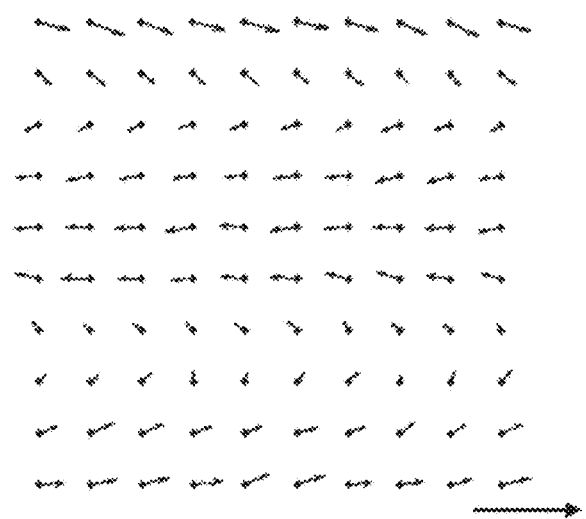
FIG. 34 is a diagram showing an example of a vector representation of an image distortion ratio distribution (the field of view is shifted in the Y direction).
Figure 35:
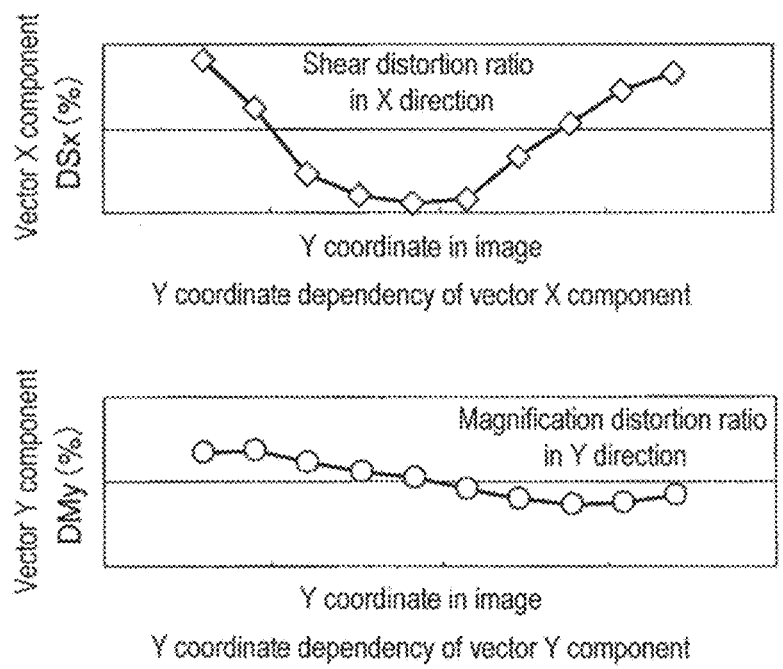
FIG. 35 is a diagram showing a representation of the image distortion ratio distribution with the vector components averaged in the X direction (the field of view is shifted in the Y direction).

With the scanning electron microscope, a main cause of the magnification distortion in the Y direction and the shear distortion in the X direction resulting from movement of the field of view in the Y direction is variations of the relative positions of the scan lines as shown by beam images 304 and 305 in FIGS. 3 and 4. Therefore, these distortions differ among the scan lines but are in many cases less distributed in each scan line. In this case, the distortion is mainly distributed in the Y direction and less distributed in the X direction, so that an average distortion in the X direction over measurement points with the same Y coordinate in the image can be taken, and the average is used as a common approximate measurement value common in the X direction to reduce the measurement variations among the measurement points. FIG. 34 shows an example of a vector representation of the distortion ratio when the field of view of the scanning electron microscope is moved in the Y direction. The X component of the vector indicates the shear distortion ratio in the X direction, and the Y component of the vector indicates the magnification distortion ratio in the Y direction. Each component is distributed in the Y direction and less distributed in the X direction. FIG. 35 is an example of a graph showing a Y coordinate dependency determined by averaging the vector components in the X direction. In this way, the Y coordinate dependencies of the shear distortion ratio in the X direction and the magnification distortion ratio in the Y direction can be detected.

Figure 36:
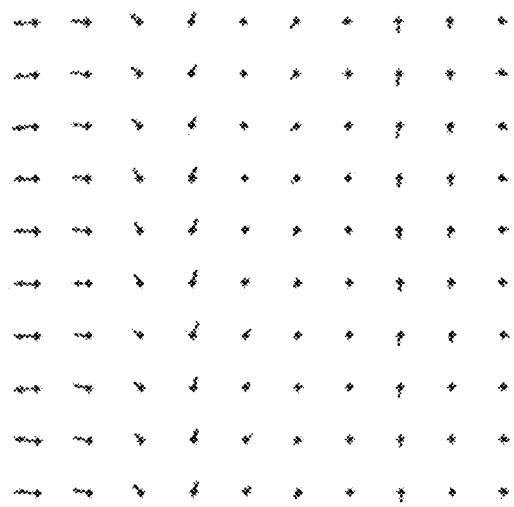
FIG. 36 is a diagram showing an example of a vector representation of an image distortion ratio distribution (the field of view is shifted in the X direction).
Figure 37:
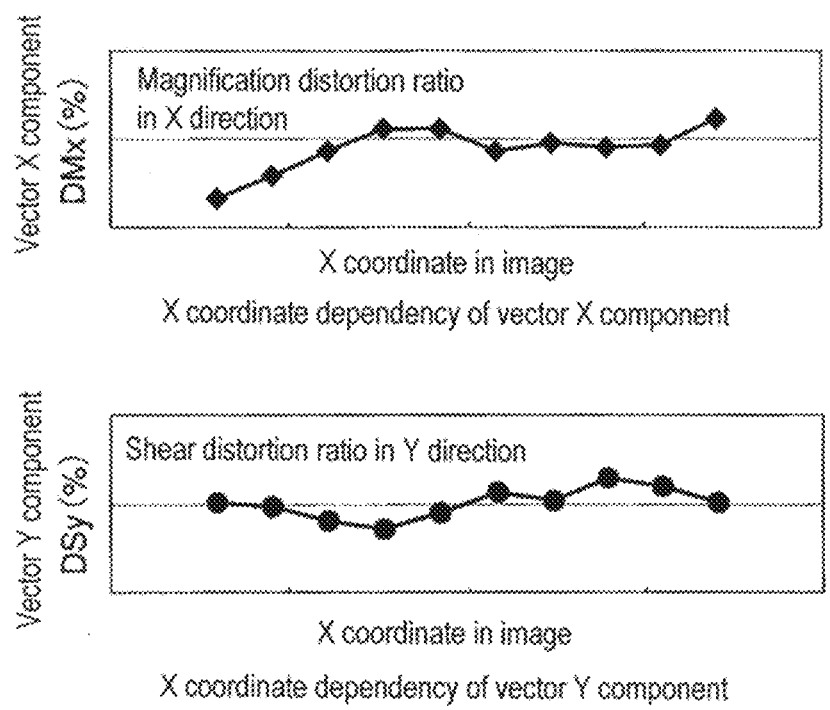
FIG. 37 is a diagram showing a representation of the image distortion ratio distribution with the vector components averaged in the Y direction (the field of view is shifted in the X direction).

On the other hand, a main cause of the magnification distortion in the X direction and the shear distortion in the Y direction resulting from movement of the field of view in the X direction is a nonuniform scan speed of the beam moved by beam deflection in the X direction from the left end to the right end of the image as shown by beam images 204, 505 in FIGS. 2 and 5. Therefore, these distortions are distributed in each scan line and in many cases less significantly differ among the scan lines. In this case, the distortion is mainly distributed in the X direction and less distributed in the Y direction, so that an average distortion in the Y direction over measurement points with the same X coordinate in the image can be taken, and the average is used as a common approximate measurement value common in the Y direction to reduce the measurement variations among the measurement points. FIG. 36 shows an example of a vector representation of the distortion ratio when the field of view of the scanning electron microscope is moved in the X direction. The X component of the vector indicates the magnification distortion ratio in the X direction, and the Y component of the vector indicates the shear distortion ratio in the Y direction. Each component is distributed in the X direction and less distributed in the Y direction. FIG. 37 is an example of a graph showing a X coordinate dependency determined by averaging the vector components in the Y direction. In this way, the X coordinate dependencies of the magnification distortion ratio in the X direction and the shear distortion ratio in the Y direction can be detected.

Figure 38:
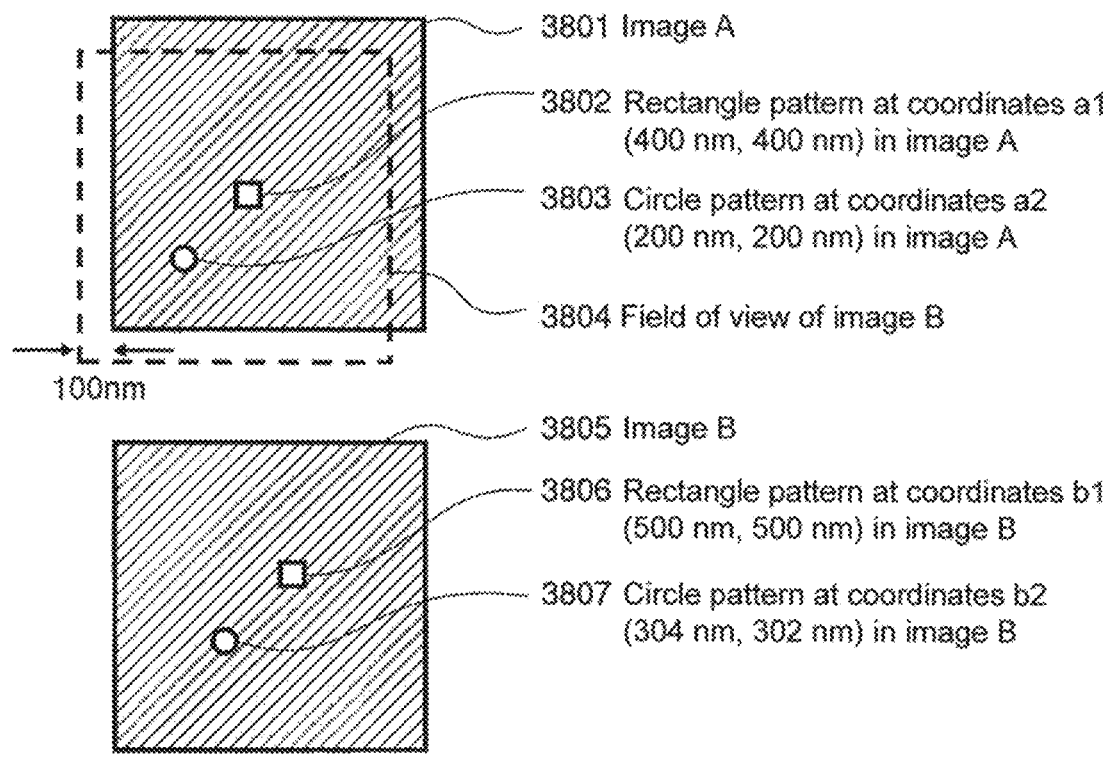
FIG. 38 is a diagram for illustrating a principle of image distortion measurement (the field of view is shifted in the X direction and the Y direction).

FIG. 38 shows an example in which the distortion is calculated using two images taken in different fields of view shifted in the X direction and the Y direction at the same time. First, a first image (A 3801) is acquired. It is assumed that a rectangle pattern 3802 is a pattern at an image distortion reference position and is located at coordinates a1 (400 nm, 400 nm) in the image A. It is assumed that a circle pattern 3803 is a pattern at an image distortion evaluation position and is located at coordinates a2 (200 nm, 200 nm) in the image A. Then, the field of view is moved leftward by 100 nm and downward by 100 nm, and an image B is acquired in a new field of view 3804. A rectangle pattern 3806 in the image B is located at coordinates b1 (500 nm, 500 nm). Therefore, a movement vector (Xs, Ys) of the reference position is (100 nm, 100 nm). If no image distortion occurs, a circle pattern in the image B is located at coordinates (300 nm, 300 nm) shifted rightward by 100 nm and upward by 100 nm as with the rectangle pattern. However, it is assumed here that an image distortion occurs in the area of the circle pattern, and the circle pattern is moved rightward by 104 nm and upward by 102 nm and is located at coordinates b2 (304 nm, 302 nm) in the image B. A movement vector (Xa, Ya) of the evaluation position is (104 nm, 102 nm).

The difference in movement amount in the X direction between the evaluation position and the reference position is expressed by the following formula.

$$\Delta X = Xa - Xs = +4 \text{ nm} \quad \text{(formula 14)}$$

The fact that the value is 4% of the movement amount in the X direction of the reference position shows that the sum of the magnification distortion ratio in the X direction and the shear distortion ratio in the X direction in the area of the image between the coordinates b1 and b2 is +4%. Although the field of view is moved in the X direction and the Y direction by the same shift amount in this example, the distortion ratio is the sum of the distortion ratios calculated according to the formulas 11 and 12 even if the field of view is moved in the X direction and the Y direction by different shift amounts.

The difference in movement amount in the Y direction between the evaluation position and the reference position is expressed by the following formula.

$$\Delta Y = Ya - Ys = +2 \text{ nm} \quad \text{(formula 15)}$$

The fact that the value is 2% of the movement amount in the Y direction of the reference position shows that the sum of the magnification distortion ratio in the Y direction and the shear distortion ratio in the Y direction in the area of the image between the coordinates b1 and b2 is +2%. Although the field of view is moved in the X direction and the Y direction by the same shift amount in this example, the distortion ratio is the sum of the distortion ratios calculated according to the formulas 10 and 13 even if the field of view is moved in the X direction and the Y direction by different shift amounts.

These distortions can be used as a distortion value at a measurement point at intermediate coordinates B (250 nm, 250 nm) between the two points, rather than the value in the area of the image between the coordinates b1 and b2.

Figure 39:
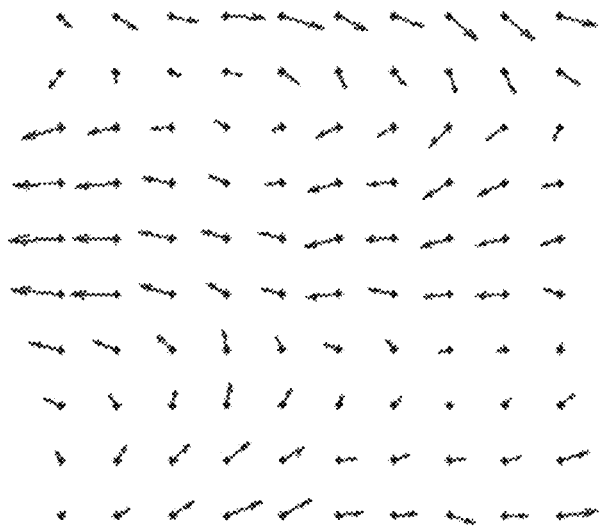
FIG. 39 is a diagram showing an example of a vector representation of an image distortion ratio distribution (the field of view is shifted in the X direction and the Y direction).
Figure 40:
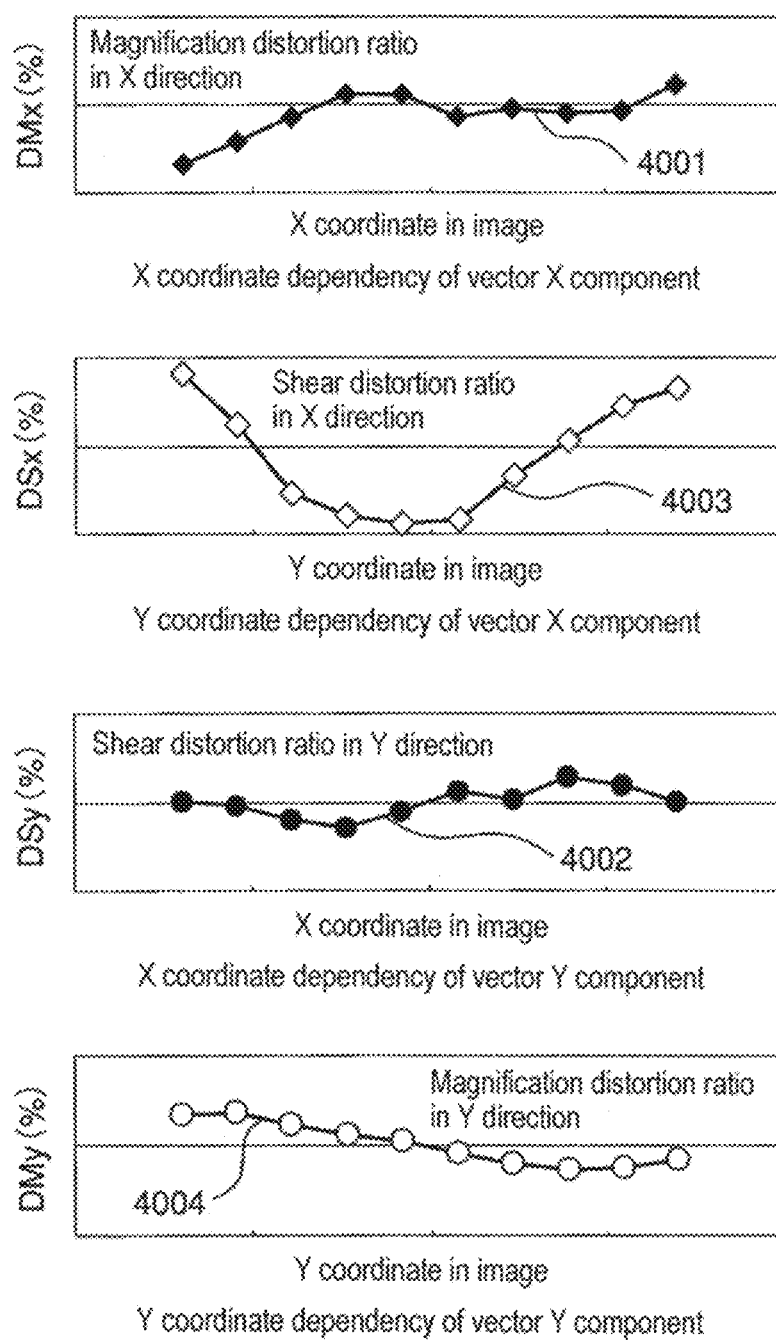
FIG. 40 is a diagram showing a representation of the image distortion ratio distribution with the vector components averaged in the X direction and the Y direction (the field of view is shifted in the X direction).

FIG. 39 shows an example of a vector representation of the distortion ratio when the field of view of the scanning electron microscope is moved in the X direction and the Y direction at the same time. The X component of the vector indicates the sum of the shear distortion ratio in the X direction and the magnification distortion ratio in the X direction, and the Y component of the vector indicates the magnification distortion ratio in the Y direction and the shear distortion ratio in the Y direction. As described above, the two distortion ratios added up each have an X-directional distribution and a Y-directional distribution, and the distortion ratios added up to form each component can be averaged in the Y direction and the X direction to extract the distortion distribution. FIG. 40 shows examples of graphs obtained by averaging each vector component in the X direction and the Y direction. In this way, the Y coordinate dependencies of the shear distortion ratio in the X direction and the magnification distortion ratio in the Y direction can be detected.

[Image Distortion of Image Rotated by θ and Image Distortion of Image with Changed Magnification]

Figure 41:
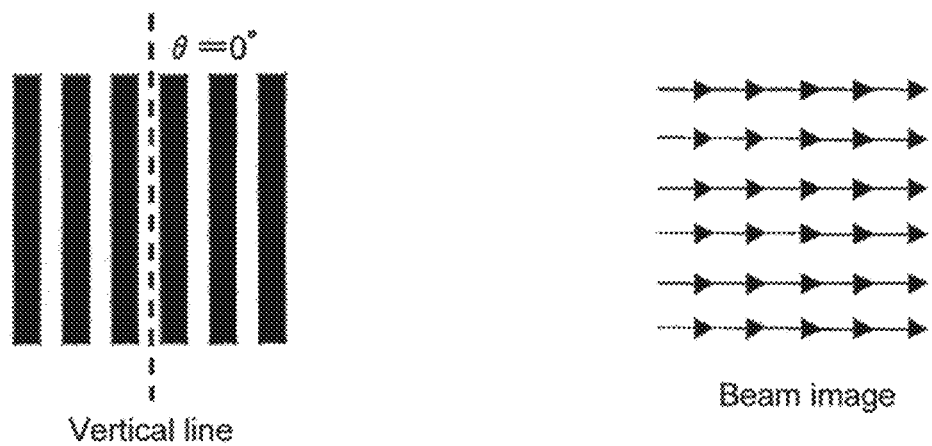
FIG. 41 is a diagram showing an example in which the rotation angle of the image is 0°.
Figure 42:
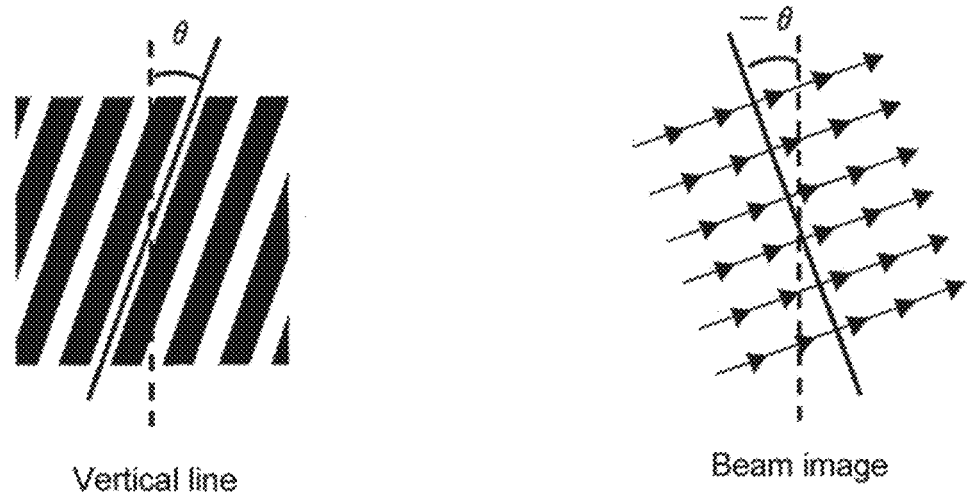
FIG. 42 is a diagram showing an example in which the rotation angle of the image is θ.

There will be described an example in which a distortion of an image rotated as a whole by an angle θ is calculated from a measurement result of a distortion of an image that is not rotated using distortion characteristics of a scanning electron microscope. FIG. 41 shows an example in which the rotation angle of the image is 0°. To obtain an image rotated as a whole by an angle θ, beam scanning is performed at an angle rotated as a whole by an angle −θ as shown in FIG. 42. The magnification distortion in the X direction and the shear distortion in the Y direction are caused by a variation in one scan, so that the magnification and the sample scan angle are small and have no dependency. On the other hand, the magnification distortion in the Y direction and the shear distortion in the X direction are caused by shifting of the relative positions of the scan lines due to disturbance noise, and the movement amount and the movement direction along each scan line have a constant relative value with respect to the sample. FIG. 43 shows changes of the magnification distortion ratio in the Y direction and the shear distortion ratio in the X direction in the case where the image is rotated by an angle θ. The magnification distortion in the X direction and the shear distortion in the Y direction vary with the sample scan angle θ according to the following formulas involving the distortions at a sample scan angle of 0°.

Magnification distortion in the X direction (θ=θ)= [magnification distortion in the X direction (θ=0)]×cos θ+[shear distortion in the X direction (θ=0)]×sin θ    (formula 16)

Shear distortion in the Y direction (θ=θ)=−[magnification distortion in the X direction (θ=0)]×sin θ+[shear distortion in the X direction (θ=0)]× cos θ    (formula 17)

As for the distortion of an image with a changed magnification, the relative value with respect to the sample does not change, so that the magnification distortion ratio in the Y direction and the shear distortion ratio in the X direction increase in proportion to the magnification of the image.

[Method of Determining Amount of Position Shift Due to Distortion]

A method of determining the amount of a position shift due to a distortion using a distribution of distortion ratios at measurement points will be described. First, a relationship between a position shift amount distribution and a distortion ratio will be described.

Figure 44:
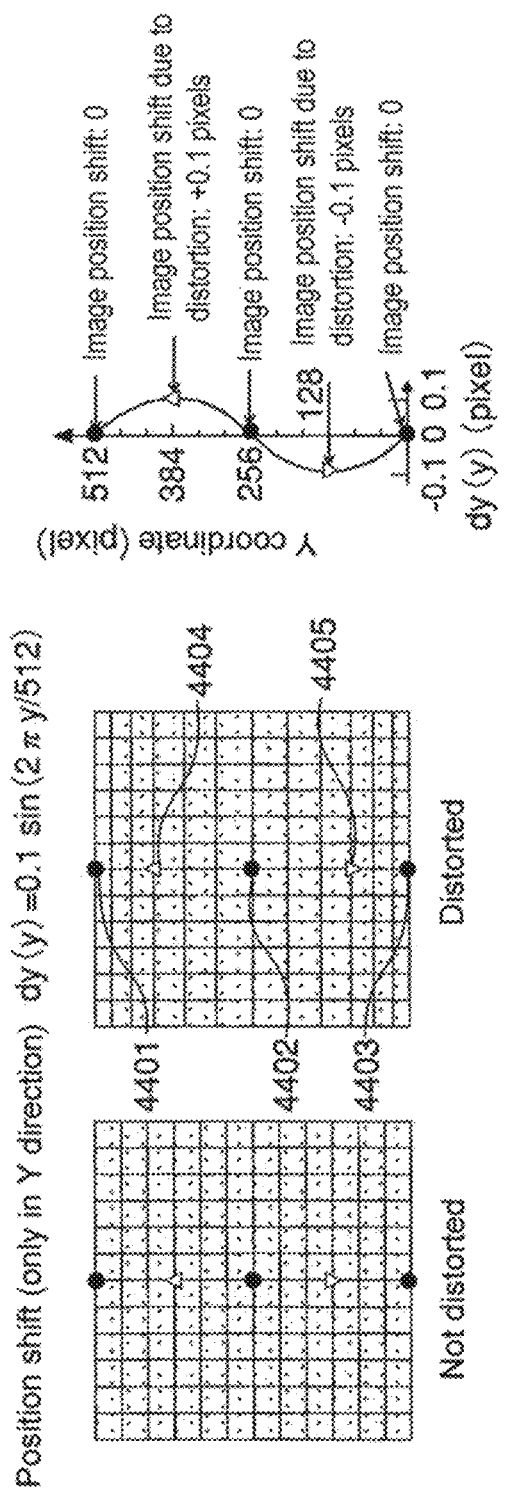
FIG. 44 is a diagram showing an example of a representation of a magnification distortion distribution in the Y direction.

As a first example, FIG. 44 shows a magnification distortion in the Y direction. In the case of an image composed of 512 pixels by 512 pixels, in a coordinate system with an origin at the lower left point of the image, a position shift amount dy in the Y direction, which depends only on the Y coordinate, varies due to a distortion according to a sine wave having an amplitude of 0.1 pixels and a wavelength of 512 pixels as expressed by the following formula.

$$dy(x,y) = dy(y) = -0.1 \sin(2\pi y/512) \quad \text{(formula 18)}$$

At positions 4401, 4402 and 4403, no position shift occurs in the Y direction. However, an upward position shift of 0.1 pixels occurs due to a distortion at a point 4404, and a downward position shift of 0.1 pixels occurs at a point 4405.

Figure 45:
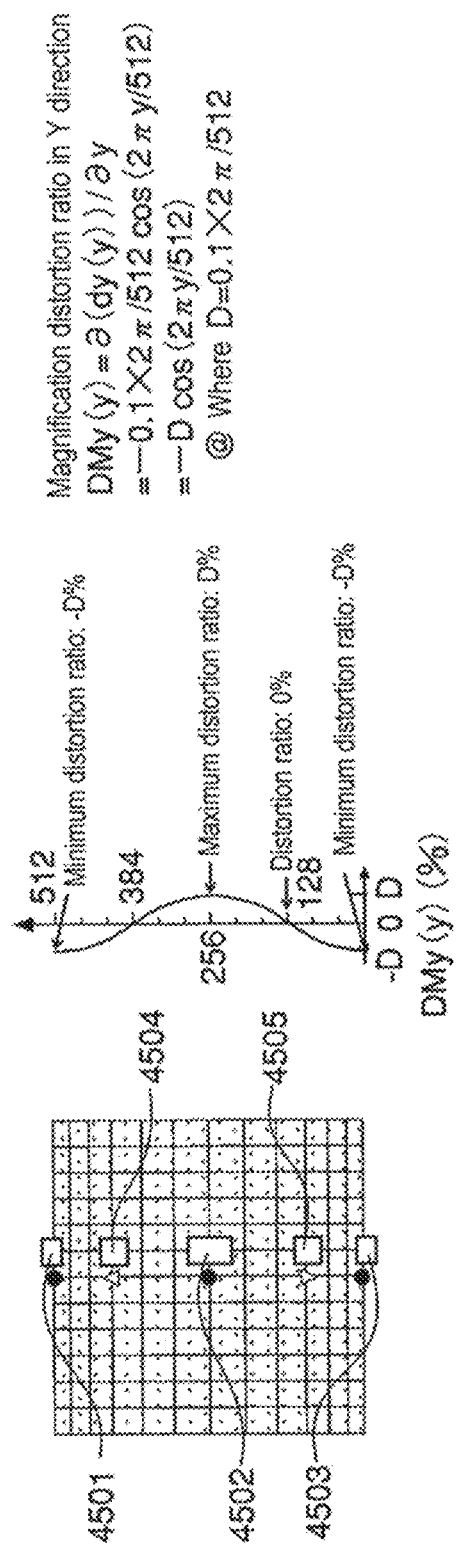
FIG. 45 is a diagram showing an example of a representation of a calculation result of a magnification distortion ratio distribution in the Y direction.

FIG. 45 shows a distribution of the magnification distortion ratio in the Y direction of an image having the position shift distribution expressed by the formula 18. At points 4501 and 4503, a square pattern contracts in the Y direction, and the magnification distortion ratio in the Y direction is negative. At a point 4502, a square pattern expands in the Y direction, and the magnification distortion ratio is positive. At points 4504 and 4505, no distortion occurs, and a square pattern is not distorted and remains in the square shape. The magnification distortion ratio DMy in the Y direction is expressed as a partial differential of the amount dy(x, y) of the position shift due to the magnification distortion in the Y direction with respect to y and is expressed by the following formula in this example.

$$DMy(y)=\partial(dy(x,y))/\partial y=-0.1\times2\pi/512\ \cos(2\pi y/512)$$
$$=-D\ \cos(2\pi y/512)\ \text{where}\ D=0.1\times2\pi \quad \text{(formula 19)}$$

From the relationships expressed by the formulas 18 and 19, the amount dy(y) of the position shift due to the distortion is calculated from the distortion ratio DMy(y) according to the following formula.

$$dy(y)=\int DMy(y)dy \quad \text{(formula 20)}$$

The magnification distortion ratio in the Y direction described in this embodiment is detected at each measurement point as shown by the exemplary graph 4004 in FIG. 40, so that the exemplary graph 4004 is fitted to a function and integrated, or the detected distortion ratio is numerically integrated. Depending on the distribution, the trapezoidal rule or the Simpson's rule is applied to the numerical integration. The calculation is performed on the assumption that the position shift at the left end of the image is 0. However, the reference position of the position shift can be modified by subtracting the shift amount Δ at the reference position from the position movement amounts over the entire image.

The position shift amount can be calculated in the same manner using the distribution of the magnification distortion ratio in the X direction.

Figure 46:
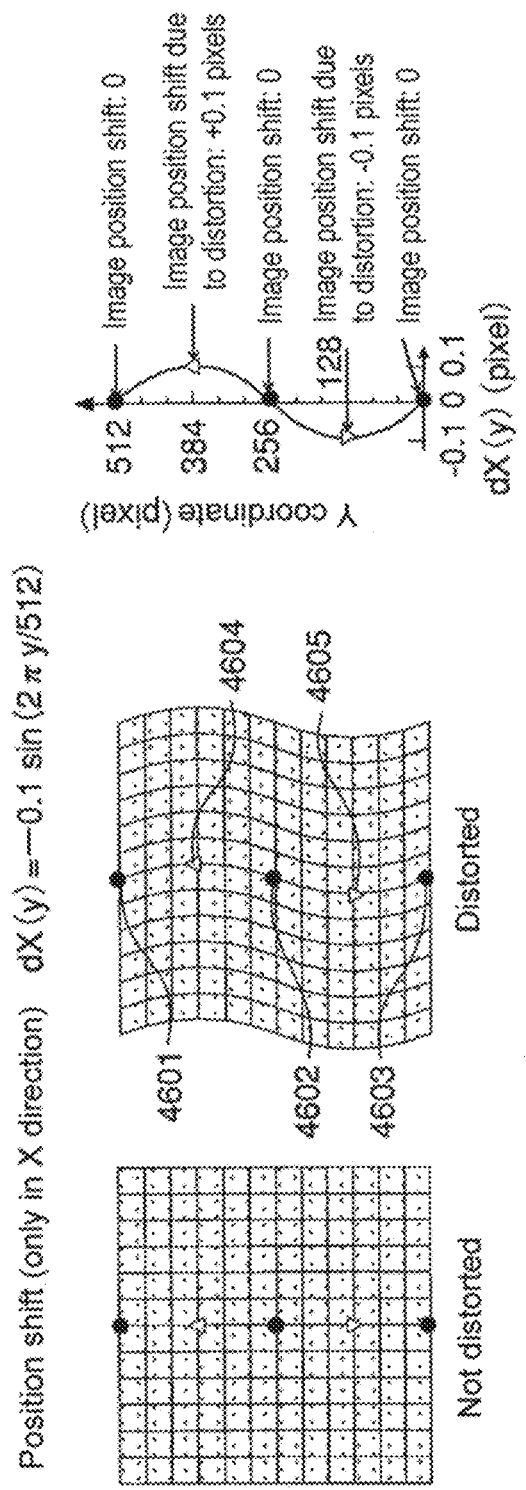
FIG. 46 is a diagram showing an example of a representation of a magnification distortion distribution in the X direction.

As a second example, FIG. 46 shows a shear distortion in the X direction. In the case of an image composed of 512 pixels by 512 pixels, in a coordinate system with an origin at the lower left point of the image, a position shift amount dx in the X direction, which depends only on the Y coordinate, varies due to a distortion according to a sine wave having an amplitude of 0.1 pixels and a wavelength of 512 pixels as expressed by the following formula.

$$dx(x,y)=dx(y)=-0.1\ \sin(2\pi y/512) \quad \text{(formula 21)}$$

At positions 4601, 4602 and 4603, no position shift occurs in the Y direction. However, a rightward position shift of 0.1 pixels occurs due to a distortion at a point 4604, and a leftward position shift of 0.1 pixels occurs at a point 4605.

Figure 47:
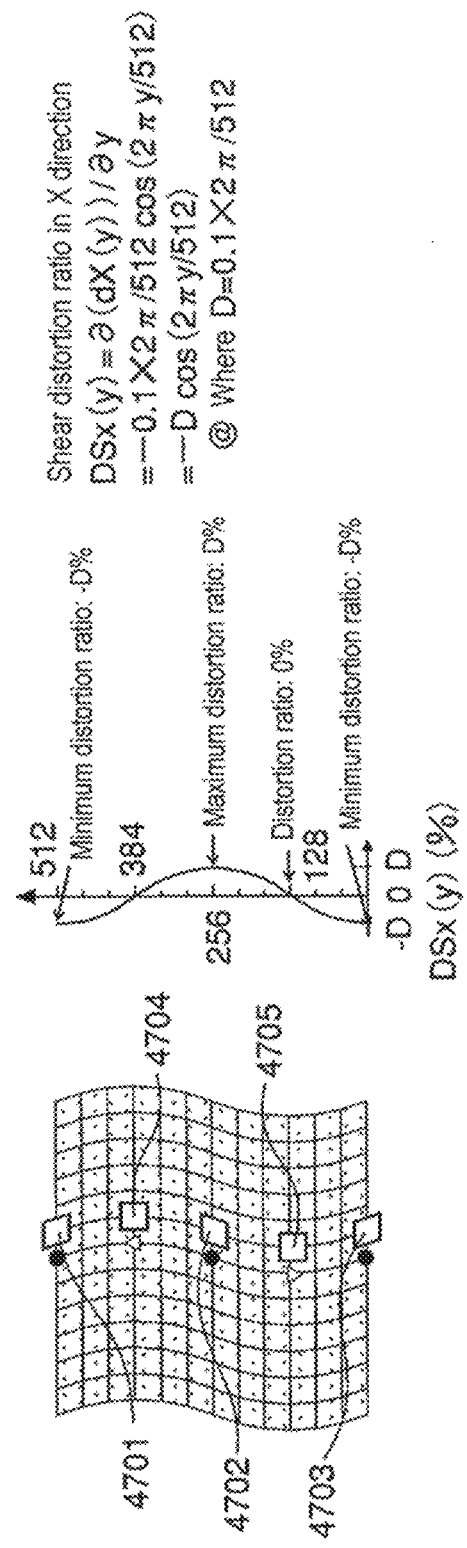
FIG. 47 is a diagram showing an example of a representation of a calculation result of a magnification distortion ratio distribution in the X direction.

FIG. 47 shows a distribution of the shear distortion ratio in the X direction of an image having the position shift distribution expressed by the formula 18. At points 4701 and 4703, a square pattern is deformed with a negative shear distortion ratio in the X direction. At a point 4702, a square pattern is deformed with a positive shear distortion ratio in the X direction. At points 4704 and 4705, no deformation due to a distortion occurs, and a square pattern is not distorted and remains in the square shape. The shear distortion ratio DSx in the Y direction is expressed as a partial differential of the amount dx(x, y) of the position shift due to the shear distortion in the X direction with respect to x and is expressed by the following formula in this example.

$$DSx(y)=\partial(dx(x,y))/\partial y=-0.1\times2\pi/512\ \cos(2\pi y/512)=-D\ \cos(2\pi y/512)\ \text{where}\ D=0.1\times2\pi \quad \text{(formula 22)}$$

From the relationships expressed by the formulas 21 and 22, the amount dx(y) of the position shift due to the distortion is calculated from the distortion ratio DSx(y) according to the following formula.

$$dx(y)=\int DSx(y)dy \quad \text{(formula 23)}$$

The shear distortion ratio in the X direction described in this embodiment is detected at each measurement point as shown by the exemplary graph 4001 in FIG. 40, so that the exemplary graph 4001 is fitted to a function and integrated, or the detected distortion ratio is numerically integrated. Depending on the distribution, the trapezoidal rule or the Simpson's rule is applied to the numerical integration. The calculation is performed on the assumption that the position shift at the left end of the image is 0. However, the reference position of the position shift can be modified by subtracting the shift amount Δ at the reference position from the position movement amounts over the entire image.

The position shift amount can be calculated in the same manner using the distribution of the shear distortion ratio in the Y direction.

In the examples described above, each distortion is uniform in the X direction or the Y direction. However, the position shift amount can be calculated in the same manner even if the distortion is not uniform in the X direction or the Y direction. The position shift amount at each measurement point in the image is the sum of the calculated position shift amounts due to the magnification distortion in the X direction, the magnification distortion in the Y direction, the shear distortion in the X direction and the shear distortion in the Y direction at the point.

[Calculation of Position Shift Amount at Point Other than Measurement Point]

Figure 48:
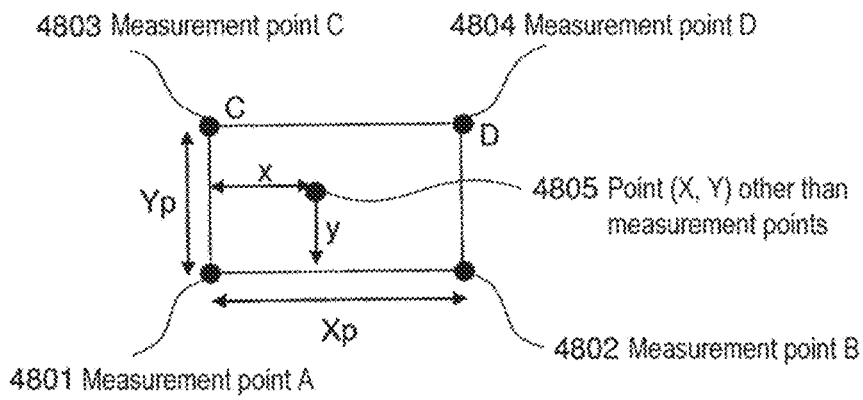
FIG. 48 is a diagram showing an example of calculation of the movement amount of a point other than measurement points.

The position shift amount at a measurement point is calculated in the above description. However, the position shift amount may need to be corrected at a point other than the measurement points. The position shift amount at an arbitrary point in the image is determined from the results at surrounding measurement points by extrapolation or interpolation. In the following, an example of such a process will be described. Provided that four measurement points are arranged with an X-directional pitch of Xp (pixels) and a Y-directional pitch of Yp (pixels), and the lower left edge point of the four measurement points is the origin as shown in FIG. 48, an example of a method of calculating the position shift amount at a position (x, y) will be described. It is assumed that the position shift amounts at measurement points A 4801, B 4802, C 4803 and D 4804 are denoted by a, b, c and d, respectively. Then, the position shift amount A at the position (x, y) is determined by interpolation according to the following formula.

$$\Delta=a+(c-a)\cdot y/Yp+(b-a)\cdot x/Xp+(a-b-c+d)\cdot x\cdot y/(Xp\cdot Yp) \quad \text{(formula 24)}$$

According to this formula, the position shift amount Δ at the point (x, y) is as follows.

When (x, y)=(0, 0), Δ=a
When (x, y)=(Xp, 0), Δ=b
When (x, y)=(0, Yp), Δ=c
When (x, y)=(Xp/2, 0), Δ=(a+b)/2
When (x, y)=(0, Yp/2), Δ=(a+c)/2
When (x, y)=(Xp/2, Yp), Δ=(c+d)/2
When (x, y)=(Xp, Yp/2), Δ=(b+d)/2
When (x, y)=(Xp/2, Yp/2), Δ=(a+b+c+d)/4

Figure 49:
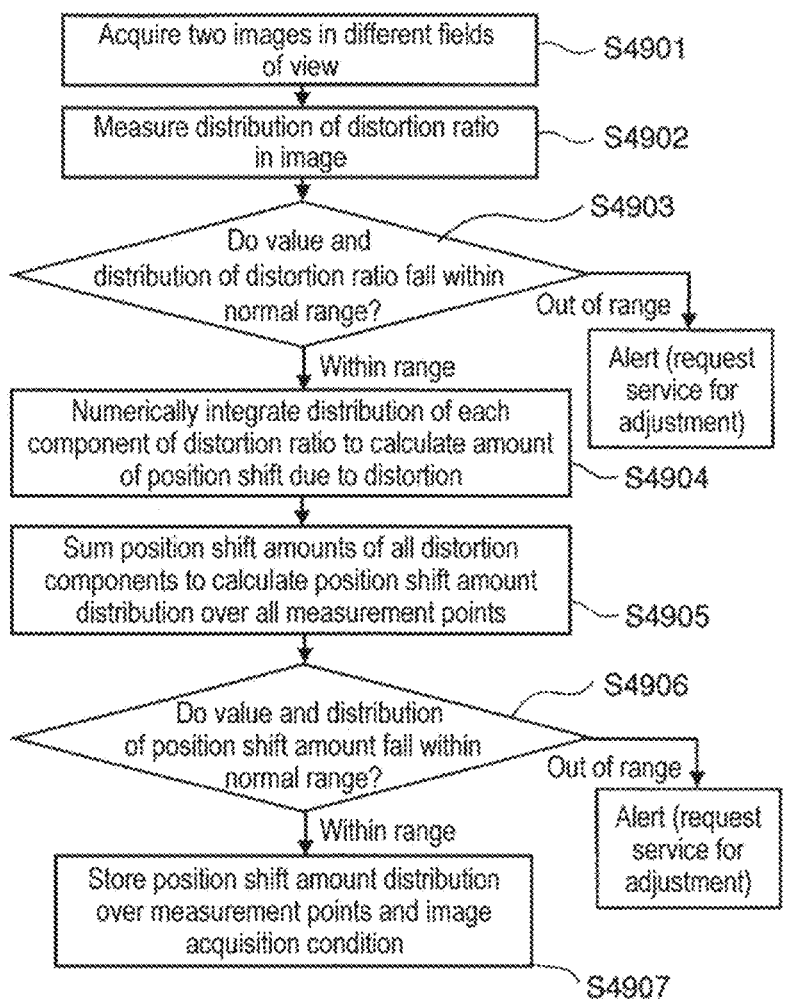
FIG. 49 is a flowchart showing a process of measuring a position shift amount distribution.
Figure 50:
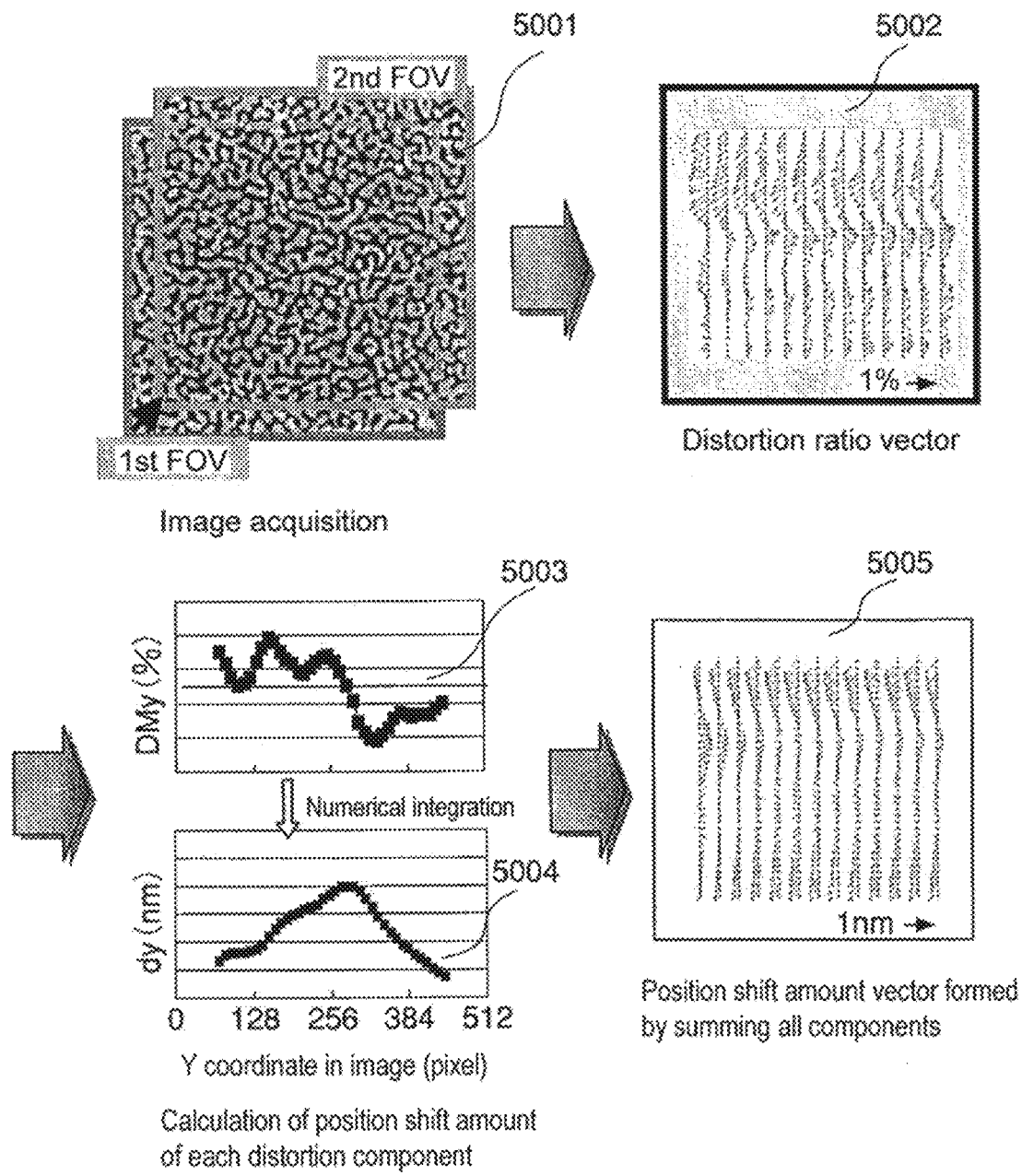
FIG. 50 is a diagram for illustrating an example of position shift amount distribution measurement.

FIG. 49 is a flowchart showing a process of calculating the amount of the position shift due to the image distortion from two images taken in different fields of view. FIG. 50 shows results of steps of the process shown in the flowchart.

In Step 4901, two images in different fields of view are taken. The two images have an overlapping area as shown by reference numeral 5001 in FIG. 50. In Step 4902, the distribution of the distortion ratio in the images is calculated using the two images. In this step, the measurement data may be represented by a distortion ratio vector as shown by reference numeral 5002 in FIG. 50, or the X component and the Y component of the distortion ratio vector at each measurement point may be stored in the form of numerical value. Then, in Step 4903, it is determined whether the distortion ratio falls within a normal range or not.

The determination can be made with respect to the upper limit of the magnitude of the distortion ratio or the upper limit of the difference in distortion ratio between adjacent measurement points. If it is determined that the distortion ratio falls out of the normal range, an alert is issued, the quality of the acquired images, the condition of the sample, the condition of the hardware of the electron microscope or the like is checked and adjusted, and then the position shift distribution is measured again. If it is determined that the distortion ratio falls within the normal range, the process proceeds to Step 4904, in which the distribution of the position shift due to the distortion is determined by performing a numerical integration or other calculation on each component of the distortion ratio distribution as shown by reference numeral 5003 in FIG. 50. Then, in Step 4905, the position shift amounts due to all the distortion components are summed to determine the distribution of the amount of the position shift due to the image distortion over the measurement points as shown by reference numeral 5005 in FIG. 50. In Step 4906, it is determined whether the position shift value and the position shift distribution fall within their respective normal ranges or not. If it is determined that the position shift value or the position shift distribution falls out of the normal range, an alert is issued as in Step 4903, and the quality of the acquired images, the condition of the sample, the condition of the hardware of the electron microscope or the like is checked and adjusted, and then the position shift distribution is measured again. If it is determined that the position shift value and the position shift distribution fall within their respective normal ranges, the process proceeds to Step 4907, in which the position shift amount distribution over the measurement points and the image acquisition condition are stored.

[Correction of Measurement Target Based on Detected Distortion 1]

Figure 51:
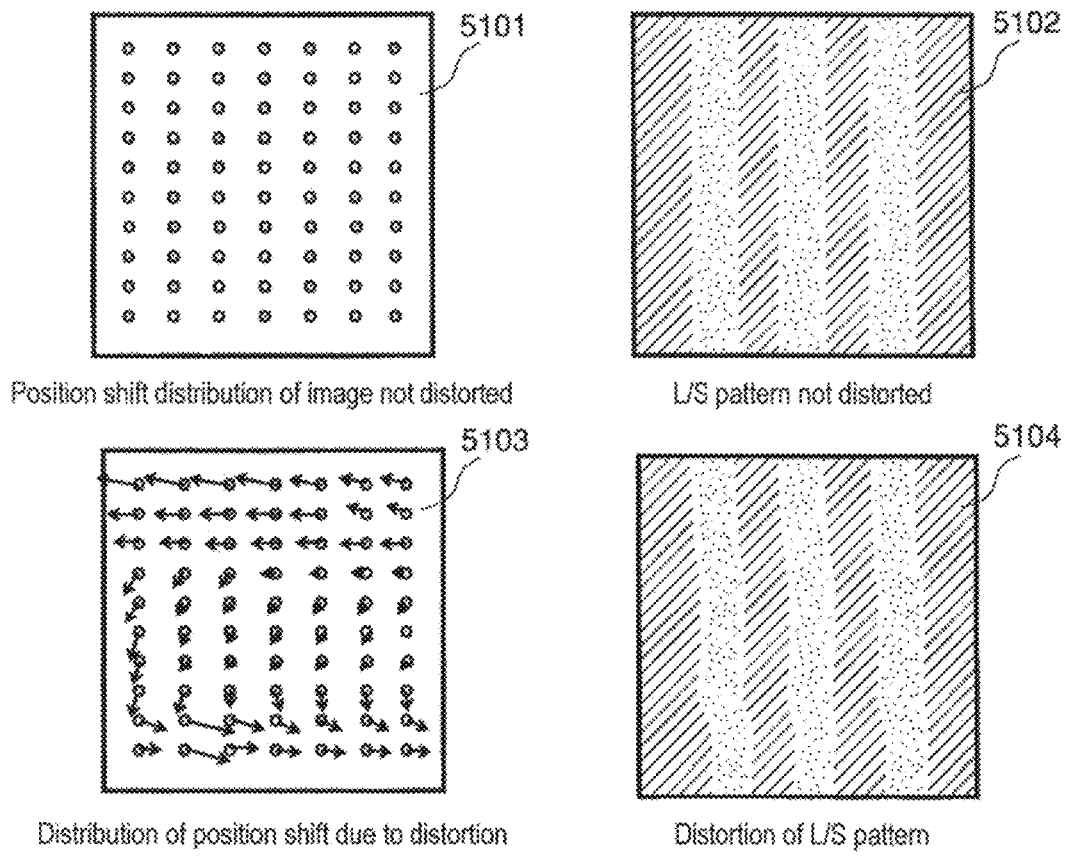
FIG. 51 is a diagram showing examples of the position shift amount distribution and a distortion of an L/S pattern.

FIG. 51 shows an example of a deformation of a pattern depending on the presence or absence of a distortion. If no image distortion occurs, as shown in an image position shift vector distribution 5101, the vectors at all the measurement points are zero, and an L/S pattern image 5102 taken under the conditions of the distribution 5101 is not distorted compared with the shape of the pattern on the sample. FIG. 51 further shows an exemplary position shift vector distribution 5103 of position shifts due to an image distortion according to the present invention and an exemplary L/S pattern image 5104 of the same L/S pattern as the L/S pattern of the image 5102 taken under the conditions of the distribution 5103 in which an image distortion occurs. Because of the image distortion, the L/S pattern image 5104 is distorted compared with the shape of the pattern on the sample. However, the difference between the L/S pattern image 5102 that is not distorted and the L/S pattern 5104 can be calculated from the position shift vectors in the position shift vector distribution 5103. Thus, information obtained from the L/S pattern image 5102 can be calculated using the position shift vector distribution 5103 and the L/S pattern image 5104.

Figure 52:
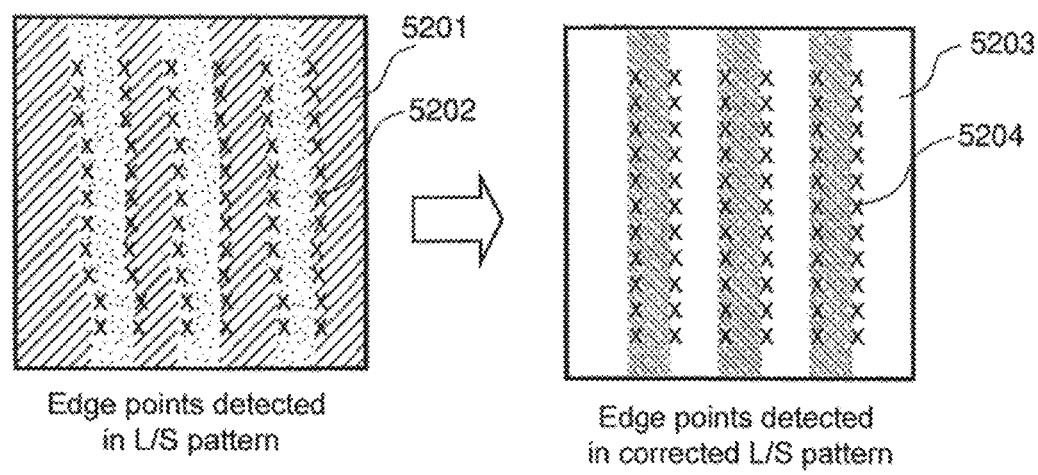
FIG. 52 is a diagram showing an example of correction of edge points detected in the L/S pattern.

A first method is to move an edge point detected for measuring a dimension of the pattern. As shown in FIG. 52, an edge point 5202 of a line in a distorted image 5201 is moved to an edge point 5204 based on a correction value calculated from the data on the image distortion vector 5103, and the dimensions of the pattern is measured using the edge points 5204 after movement. A corrected image 5203 does not have to be created, and the dimensions can be measured only with the edge points 5204. As the correction value calculated from the data on the image distortion vector 5103 used to move the edge point 5202 to the edge point 5204, the vector 5103 itself may be fed back, or only the X-directional component of the vector 5103 at the edge point 5202 or the like that contributes to the vertical line dimension may be fed back.

[Correction of Measurement Target Based on Detected Distortion 2]

A second method is to correct the hardware of the electron beam scanning microscope based on a distortion ratio vector and a position shift vector of a position shift due to a distortion.

Figure 53:
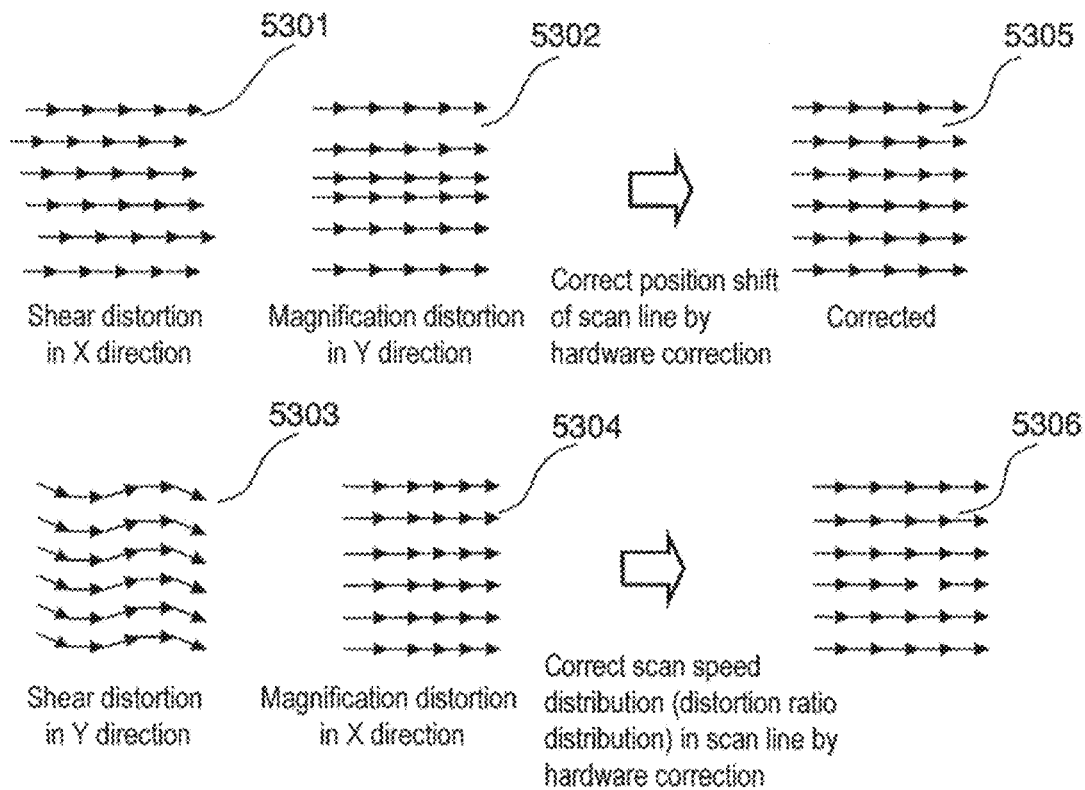
FIG. 53 is a diagram showing an example of feedback (hardware correction) to a scan distortion.

The distortion can be classified into magnification distortions in the X direction and the Y direction and shear distortions in the X direction and the Y direction. FIG. 53 shows beam images in the cases where the distortions occur. As shown by beam images 5301 and 5302, the shear distortion in the X direction and the magnification distortion in the Y direction are caused by variations of the relative positions of the scan lines in the X direction and in the Y direction, respectively. The cause of the variation is electric noise or a vibration in synchronization with the frequency of the power supply. However, regardless of the type of the cause, the shear distortion in the X direction and the magnification distortion in the Y direction can be corrected as shown by a beam image 5305 by feeding the Y-directional distribution of the amounts of the position shifts due to the shear distortion in the X direction and the magnification distortion in the Y direction back to a circuit that controls the relative coordinates of the scan lines of the electron beam scanning microscope.

On the other hand, the magnification distortion in the X direction is caused by a variation of the scan speed in the X direction along the scan line. When the scan speed in the X direction increases by n %, the distortion ratio in the X direction decreases by n %, and a correction value determined from the measured distribution of the magnification distortion in the X direction is fed back to a circuit that control the scan speed in the X direction. The shear distortion in the Y direction occurs when the scan speed in the Y direction is not 0. The magnification distortion ratio in the X direction is calculated according to a formula: (the scan speed in the Y direction)/(the scan speed in the X direction)× 100(%). A correction value determined from the measured distribution of the shear distortion in the Y direction is fed back to a circuit that controls the scan speed in the Y direction during scanning. The magnification distortion in the X direction and the shear distortion in the Y direction can be corrected by such feedback as shown by a beam image 5306.

Figure 54:
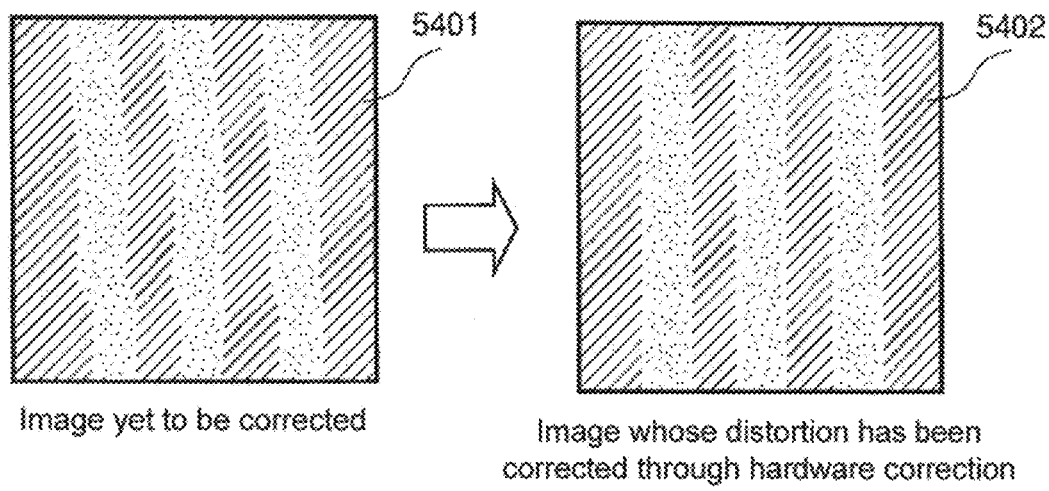
FIG. 54 is a diagram showing an example of image distortion correction through hardware correction.

FIG. 54 shows an example of a correction of an image distortion through hardware correction. A distorted image 5401 can be corrected through hardware correction to provide an image 5402 without distortion. Furthermore, the hardware correction can be verified by acquiring images in different fields of view with the hardware and measuring the amount of a position shift due to an image distortion again.

[Correction of Measurement Target Based on Detected Distortion 3]

Figure 55:
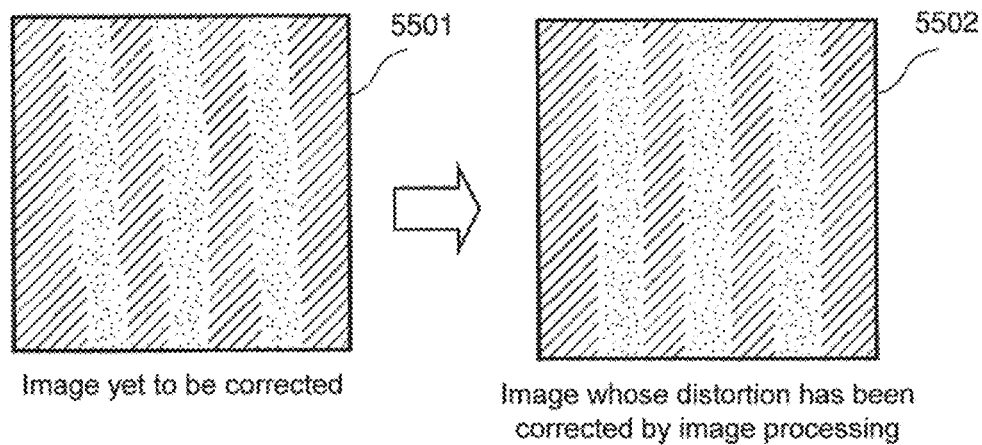
FIG. 55 is a diagram showing an example of image distortion correction by image processing.

A third method is to perform an image processing of an image acquired for measuring a pattern dimension by feeding back the amount of a position shift due to an image distortion. As shown in FIG. 55, a software-based image correction can be performed on a distorted image 5501 by feeding back the image distortion vector 5103, thereby providing an image 5502 without distortion.

[Correction of Measurement Target Based on Detected Distortion 4]

Figure 56:
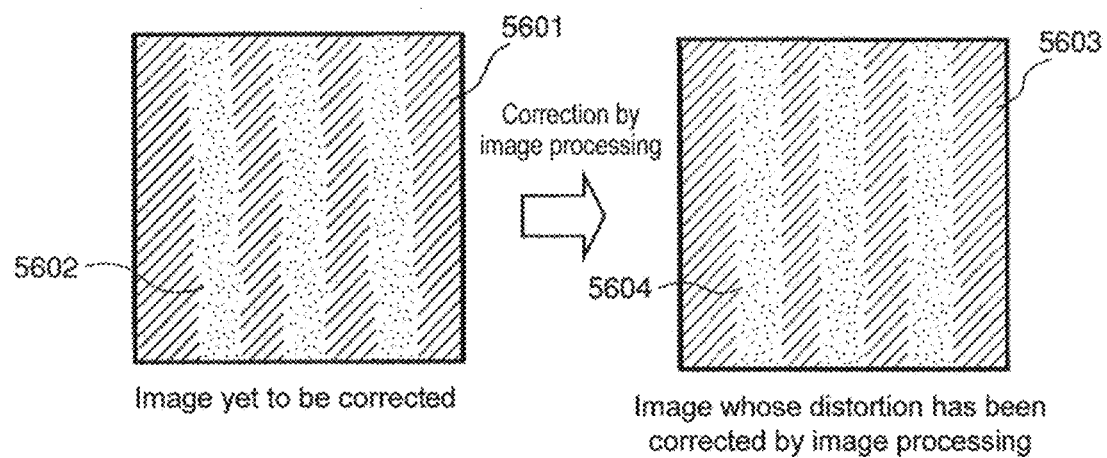
FIG. 56 is a diagram showing an example of image distortion correction by image processing (in the case where the distortion is substantial).

FIG. 56 shows an example in which the image distortion is substantial, and the image cannot be satisfactorily corrected by the image processing based on the image distortion vector described above. When an L/S pattern image that would be the L/S pattern image 5102 if no image distortion occurs is deformed by an image distortion as shown by an L/S pattern image 5601, a part 5602 that is especially substantially distorted may sometimes remain deformed in an image corrected by an image processing as shown by a part 5604. A main cause of this is that the value of the distortion ratio detected according to the present invention is the average value of the distortions between two points measured in two images taken in different fields of view. In simulation evaluation, when the distance for which the field of view is moved is one ninth of the image size, the sensitivity to a distortion having a wavelength equal to one sixth of the image size decrease to 50%. When the image distortion is substantial, the precision can be improved by performing the correction by the image processing based on the image distortion vector on the two images taken in different fields of view and then calculating the image distortion vector again.

Figure 57:
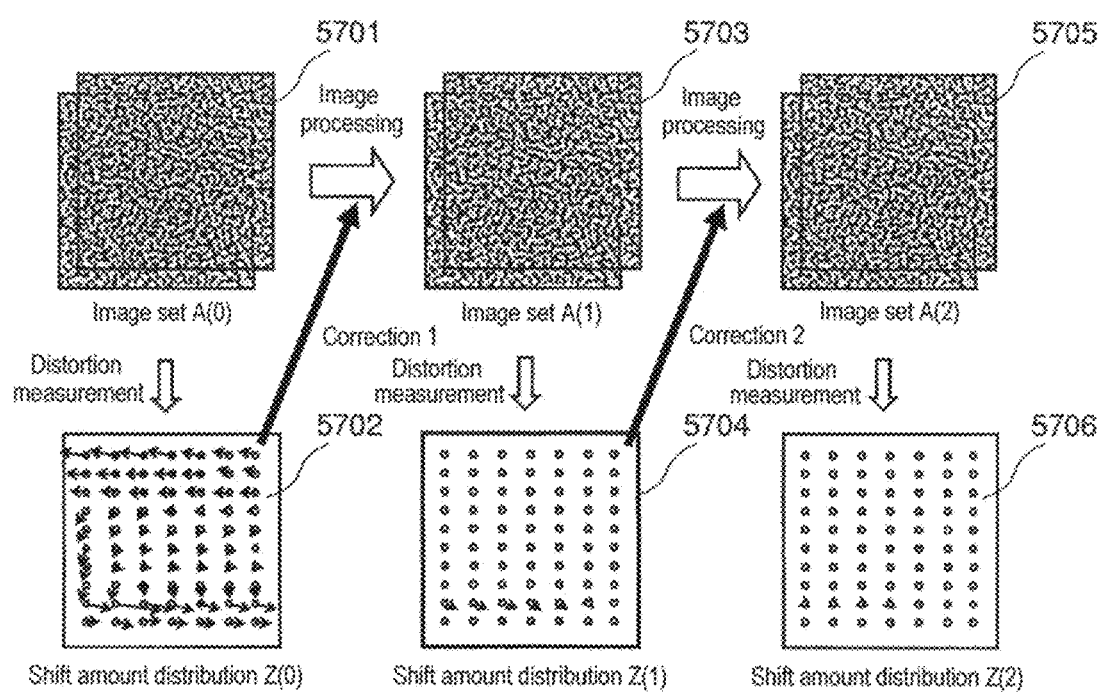
FIG. 57 is a diagram showing an example of feedback of the distribution of the position shift amount due to the distortion to a distortion measurement image.

FIG. 57 shows an example of a distortion detection method that involves feedback of a distortion correction to an image whose distortion is to be measured. A set of images (image set) taken in different fields of view (not subjected to a distortion correction) is denoted by A(0). The numeral "0" in the parentheses represents the number of corrections N. A position shift amount distribution of a position shift due to an image distortion calculated using the image set A(0) is denoted by Z(0). An image set obtained by performing an image processing for correcting the shift amount distribution Z(0) on the image set A(0) is denoted by A(1). A position shift amount distribution of a position shift due to an image distortion calculated using the image set A(1) is denoted by Z(1). An image set obtained by performing an image processing for correcting the shift amount distribution Z(1) on the image set A(1) is denoted by A(2). A position shift amount distribution of a position shift due to an image distortion calculated using the image set A(2) is denoted by Z(2). As this process is repeated, the shift amount in a shift amount distribution Z(N) becomes smaller.

Figure 58:
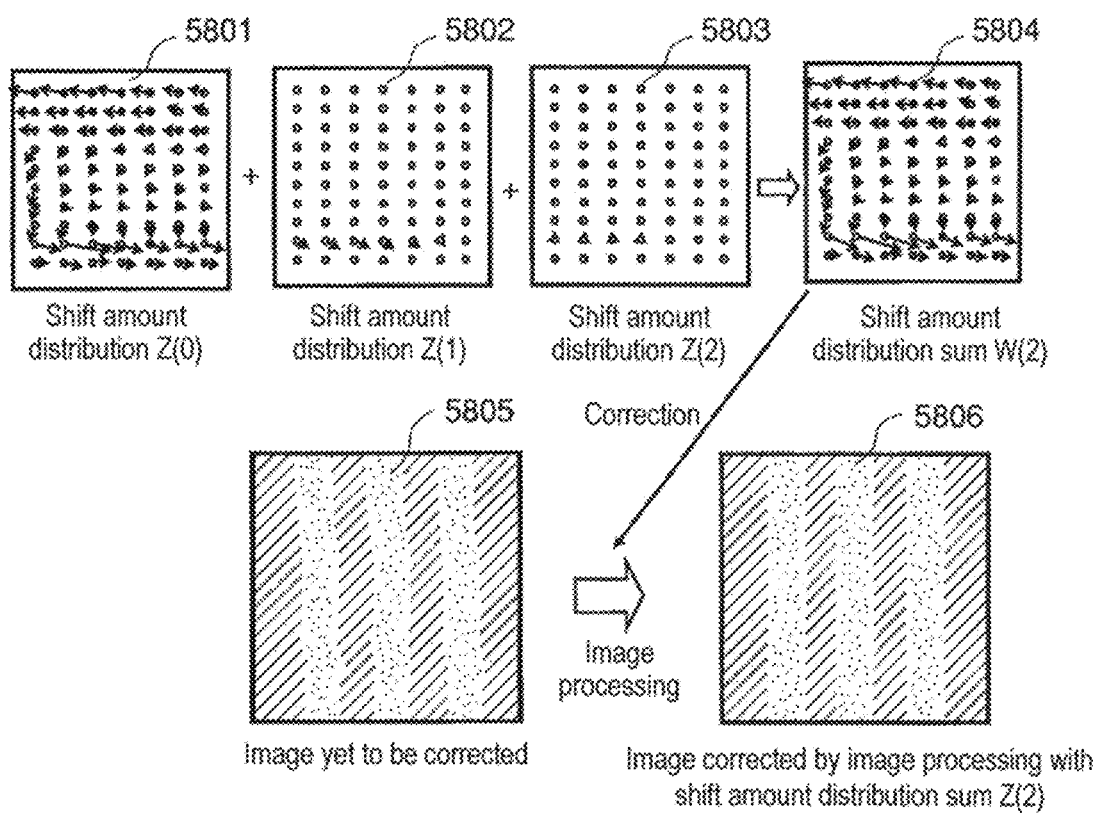
FIG. 58 shows an example of correction that uses the sum of distributions of the position shift due to the distortion.

FIG. 58 shows an example in which shift amount distributions Z(0), Z(1) and Z(2) are determined according to the method of determining an image distortion correction described above. The sum of the position shift amount distributions Z(0), Z(1) and Z(2) is referred to as a position shift distribution sum W(2), and the position shift distribution sum W(2) is fed back as a correction value. In the case of the distortion for which the sensitivity is 50% described above, it is expected that 50% of the distortion is detected in the position shift amount distribution Z(0), 25% of the same is detected in the position shift amount distribution Z(1), and 12.5% of the same is detected in the position shift amount distribution Z(2). Therefore, it is expected that 87.5% of the distortion is detected and corrected in the position shift distribution sum W(2).

Figure 59:
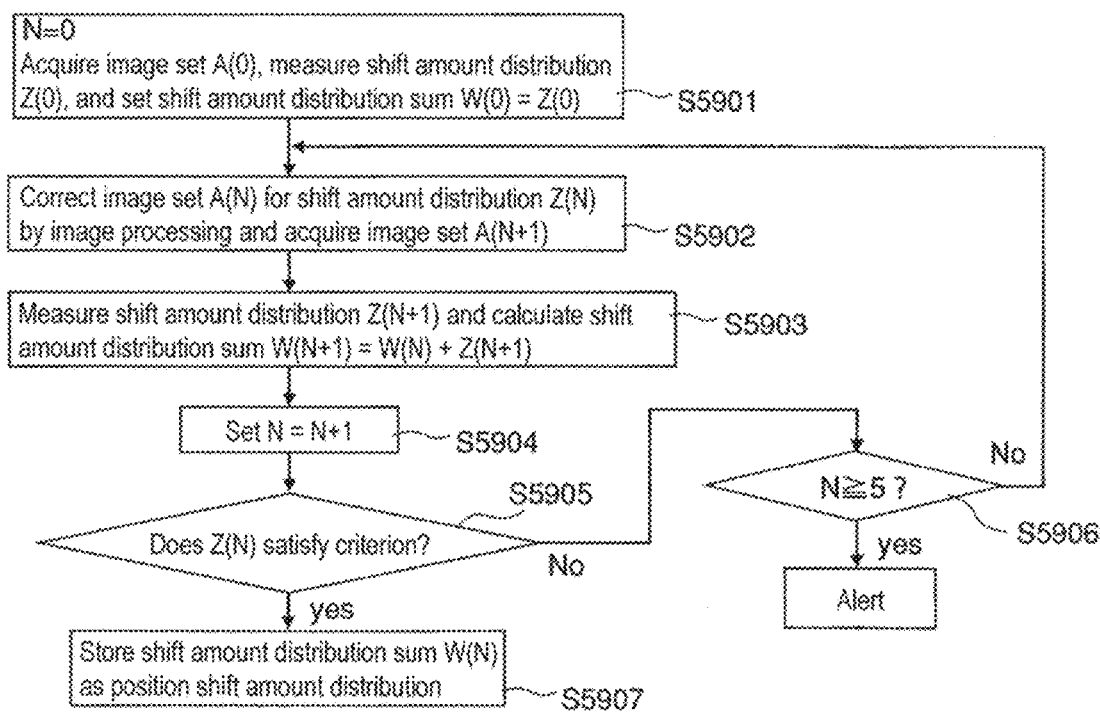
FIG. 59 is a flowchart (1) showing an example of a method of improving precision by feedback of the position shift amount distribution.

FIG. 59 is a flowchart showing this method further including determination with the position shift amount distribution Z(N). In Step S901, the shift amount distribution Z(0) is determined from the acquired image set A(0). In Step S902, the result is fed back to the image set A(N=0) to determine a position shift amount distribution, which is denoted by Z(N=1). In Step S905, it is determined whether the position shift amount distribution Z(N=1) satisfies a criterion or not. For example, the criterion is that the position shift amount is 0.05% or lower at all the points in the position shift amount distribution Z(N). If the criterion is satisfied, a position shift correction distribution W(N=1)=Z(0)+Z(1) is stored. If the criterion is not satisfied, the image processing based on the position shift amount distribution Z(1) is performed on the image set A(N=1) again until it is determined in Step S906 that the number of repetitions has reached a upper limit of repetition. If the upper limit of repetition is exceeded, an alert is output, and determination of whether an adjustment is to be performed or not is made.

Figure 60:
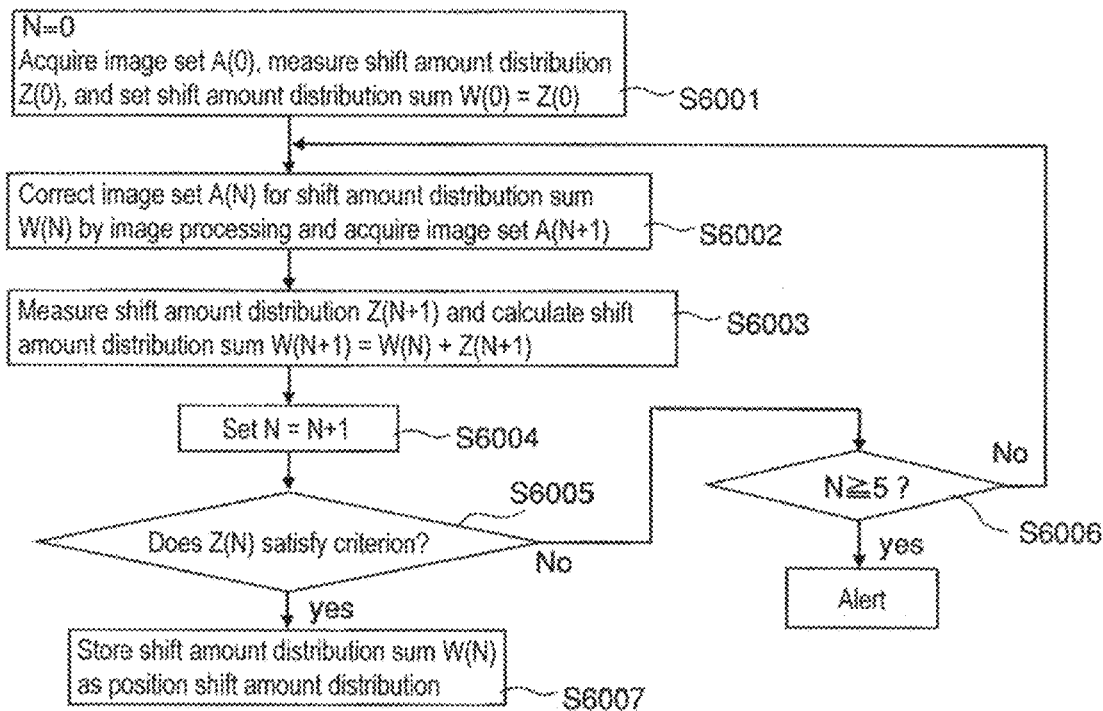
FIG. 60 is a flowchart (2) showing an example of a method of improving precision by feedback of the position shift amount distribution.

According to the method shown in FIG. 59, an image corrected once is further corrected for a distortion still detected therein. However, FIG. 60 is a flowchart showing an example in which the target of the image correction is an image yet to be corrected. Steps 6001 and 6003 to 6007 are the same as Steps 5901 and 5903 to 5907, respectively. However, in Step 6002, the image set A(0) is corrected by an image processing based on the shift amount distribution sum W(N) to acquire an image set A(N+1). Even if the shift amount distribution is repeatedly determined in this way, the image processing is performed on the image set A(0) that has been subjected to no image processing.

[Storage of Measured Distortion Data]

Figure 61:
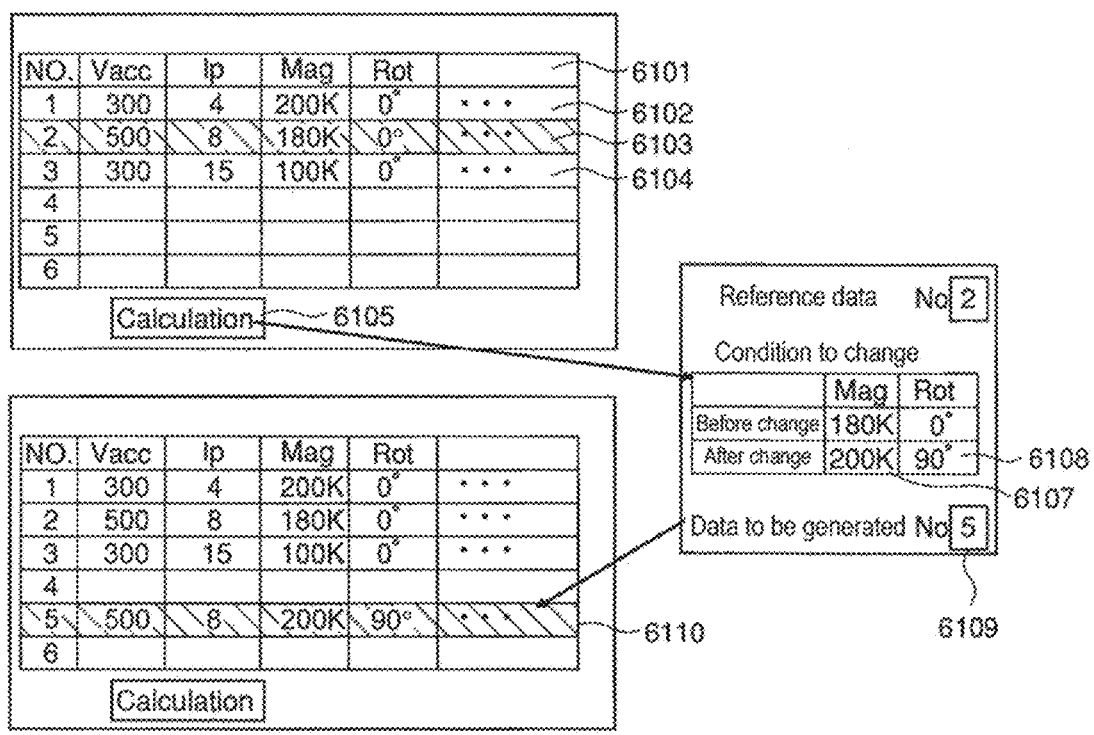
FIG. 61 is a diagram showing an example of a method of storing distortion correction data.

FIG. 61 shows an example of a method of storing measured distortion data. The distortion has a dependency on an image acquisition condition, such as the electron beam acceleration voltage (Vacc), the electron beam current value (Ip), the magnification (Mag) and the image rotation angle (Rot). Therefore, not only data on the distortion ratio distribution of the image and the distribution of the amount of the position shift due to the distortion but also the image acquisition condition used for calculating the distortion data need to be stored. Thus, a list of data identification number (NO.) (or data name) as well as image acquisition conditions 6101 to 6104 is displayed.

As described above with reference to FIGS. 41 to 43, as for the magnification (Mag) and the image rotation angle (Rot), correction data other than the image acquisition conditions can be calculated. For example, correction data 6110 can be calculated by selecting the correction data 6103 and pressing a calculation button 6105 to input a magnification 6107 to be changed, a rotation angle Rot 6108 to be changed and a data identification number 6109 of data to be generated. Furthermore, the magnification Mag and the rotation angle Rot of the image to be corrected may be read in before the correction, and the stored data may be changed and corrected to the read magnification Mag and rotation angle Rot.

[Measurement Using Stored Distortion Data]

Figure 62:
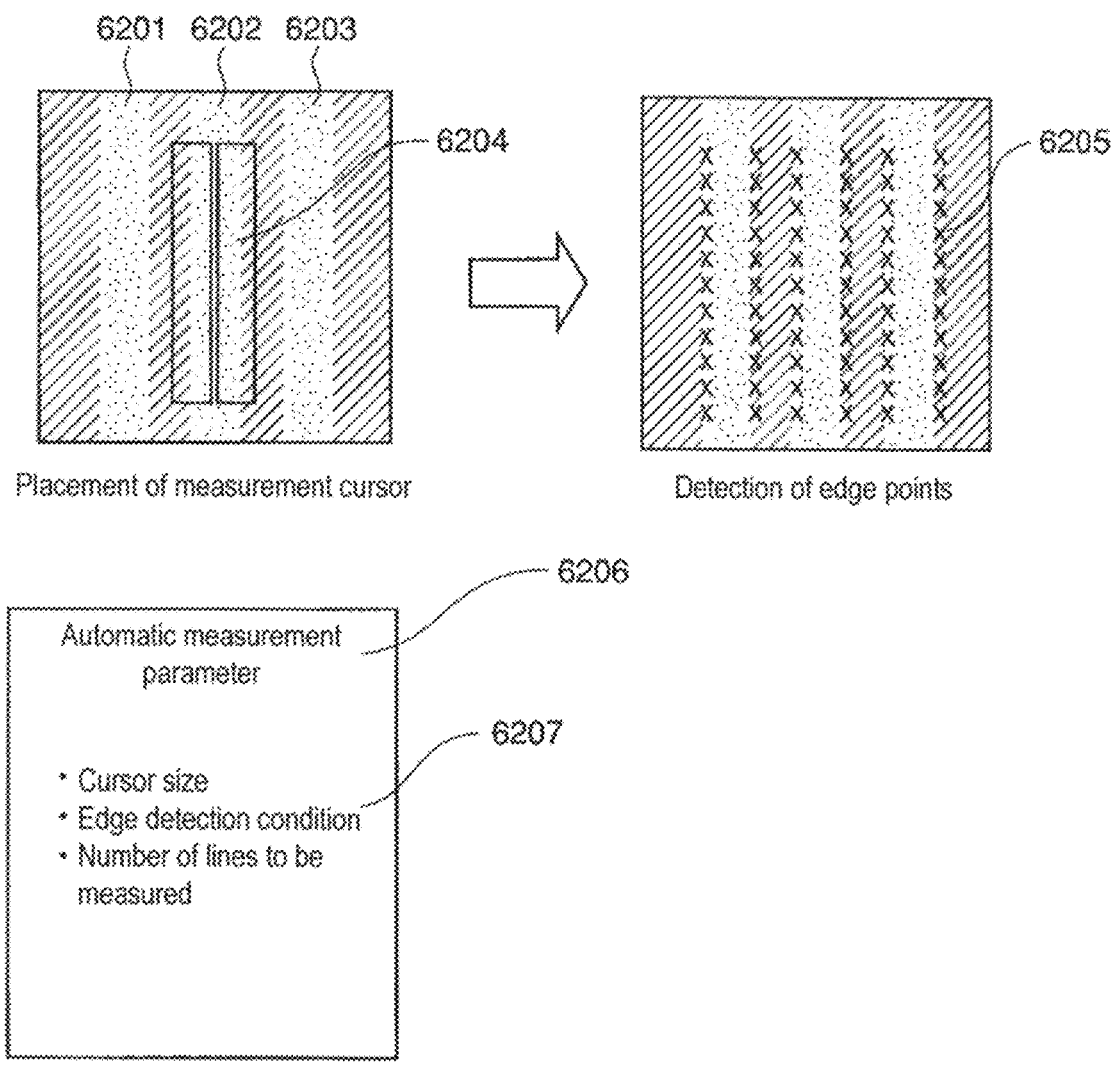
FIG. 62 is a diagram showing an example of pattern dimension measurement.

FIG. 62 shows an example of automatic measurement of a pattern with an electron scanning microscope. In this example, to measure the line width of three vertical lines 6201 to 6203, an automatic measurement parameter 6206 is set, and a cursor 6204 is set to a line pattern in the image. As the automatic measurement parameter 6206, a condition

6207, such as the cursor size, an edge detection condition and the number of lines to be measured, is set. Even if the cursor 6204 is a cursor that points to a part of a line, if the number of lines to be measured is set at 3, three lines are detected in the image and measured. The cursor may be manually placed or configured to be positioned at the center of a line detected by image recognition according to a measurement recipe.

Figure 63:
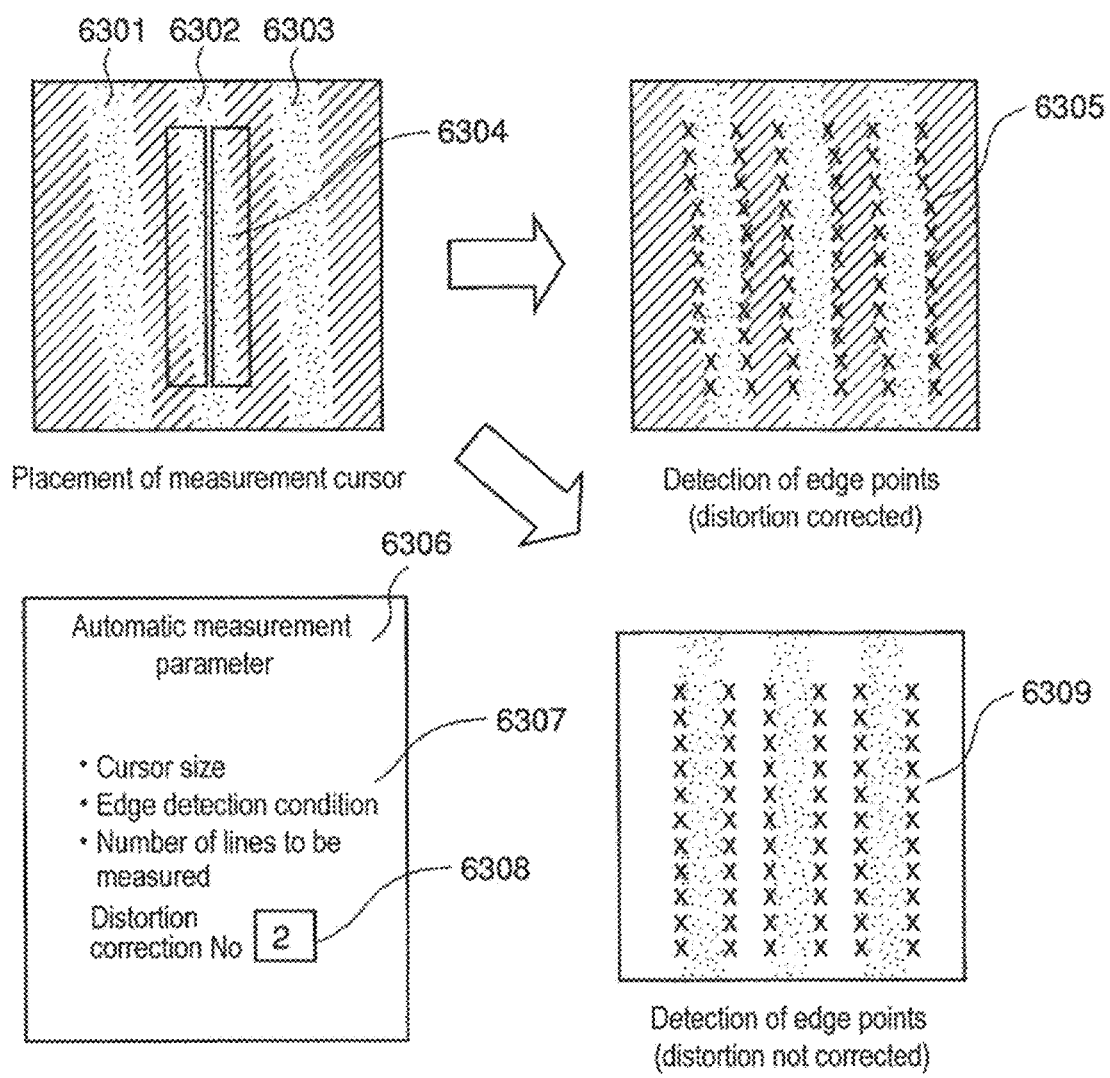
FIG. 63 is a diagram showing an example of pattern dimension measurement.
Figure 64:
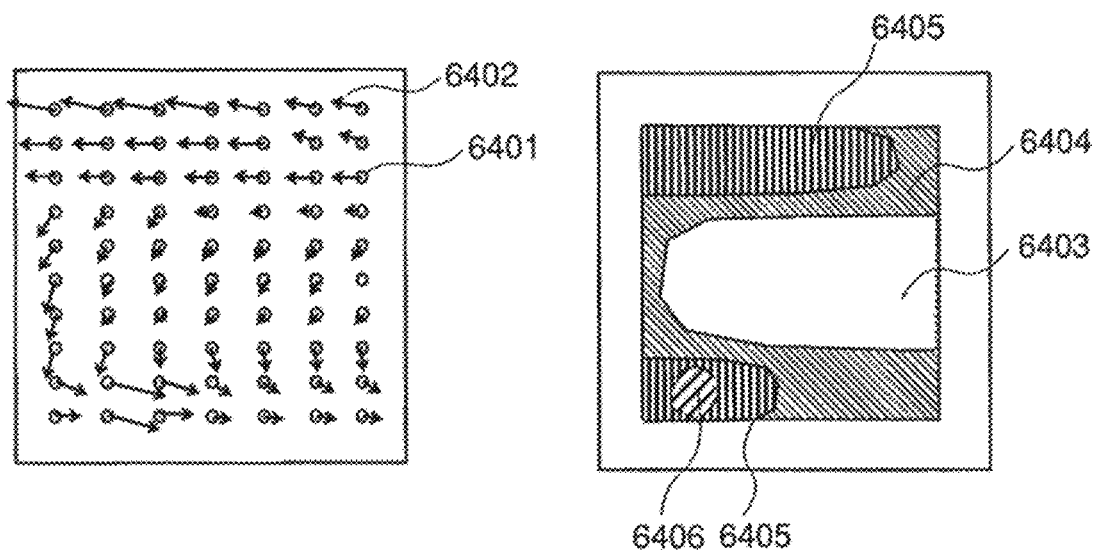
FIG. 64 is a diagram showing an example of a method of displaying the position shift amount distribution.

In automatic measurement, edge points 6205 of each line are detected, the line width is detected at a plurality of points, and the average value of all the line widths is output as the line width, for example. In the following, an example of an automatic measurement method for a distorted image using the position shift distribution of the position shift due to a distortion measured according to the present invention will be described. Measurement is performed for an image in which the vertical lines 6201 to 6203 are deformed by an image distortion as shown by vertical lines 6301 to 6303 as shown in FIG. 63. In a case where a cursor 6304 is set according to the automatic measurement parameter 6206 that does not take the image distortion into consideration, a measured edge 6306 is detected along a distorted line.

Automatic measurement parameters 6306 additionally include a distortion data identification number 6308. The distortion data is distortion measurement data registered in advance as shown in FIG. 61. In recipe-based measurement, the distortion data identification number 6308 may be registered when the recipe is configured. The correction based on the automatically measured image distortion may be performed by an image processing or by moving the position of an edge point 6305.

[Method of Displaying Position Shift Amount Distribution]

Examples of a method of displaying a position shift amount distribution of a position shift due to a measured image distortion will be described. A first example is to display a position shift vector 6402 at a measurement point 6401. The start point of the vector agrees with the measurement point 6401, which is the measurement point in the distorted image. The end point of the vector is displaced because of the image distortion. Therefore, to correct the edge point detected at the measurement point 6401, the edge point is shifted for the same distance as the length of the position shift vector in the opposite direction to the vector. The vectors may be displayed in different colors or thicknesses depending on the vector size so that the vectors can be discriminated according to the vector size. The reference of the discrimination may be the X component or the Y component of the vector.

Next, an example will be described in which the position shift amount distribution is shown by ranges 6404 to 6406 according to the magnitude of the shift amount. In this case, corrections in edge detection and contour line extraction are not performed but used for determining the area that can be measured. For example, if the shift amount allocated to the ranges increases in ascending order of the reference numerals of the ranges 6403, 6404, 6405 and 6406, it is possible to issue an alert that measurement cannot be performed if an edge point in the range 6406 is involved or an alert that measurement cannot be performed if both edge points involved in measurement of the distance between two points lie in the range 6405 or 6406.

Figure 65:
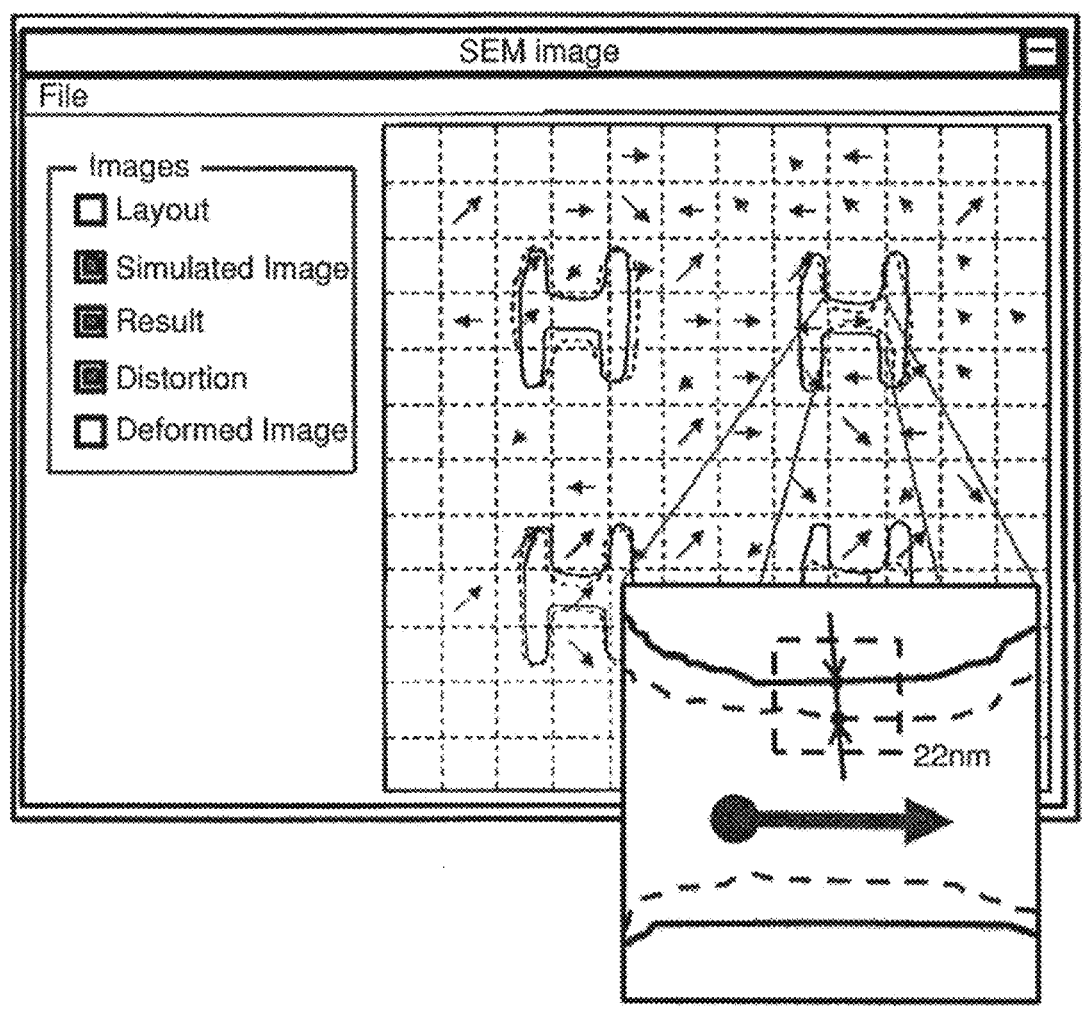
FIG. 65 is a diagram showing an example in which distortion distribution information is displayed on a GUI screen.

FIG. 65 shows an example of a GUI screen provided with a window for displaying an SEM image. Such a display screen is displayed on a display apparatus provided in the condition setting apparatus 704 or the SEM 701 to 703, and the setting information set on the GUI screen is transmitted to the image processor 901 or the like, in which a required processing is performed. In the SEM image display window in the GUI screen illustrated in FIG. 65, selection buttons are provided so that layout data (Layout) that represents an ideal pattern shape generated based on the design data stored in the storage medium 706, a simulated image (Simulated Image) generated by the simulator 705, a measurement result (Result: a length measurement result that represents the distance between a line segment of the simulated image and an SEM edge (edge placement error (EPE), for example) output by the image processor 901, distortion information (Distortion) or a pattern graphics (Deformed Image) subjected to a deformation processing based on the distortion information can be displayed superposed on the SEM image or the contour line image.

Since the distortion information can be displayed superposed on other items, such as the layout data and the SEM image, a cause of the deformation of the pattern can be easily identified.

In the following, techniques relating to adjustment of a charged particle beam apparatus using a charged particle beam adjustment sample according to embodiments 2 and 3 will be described. Investigations into requirements of the charged particle beam adjustment sample (referred to simply as an adjustment sample hereinafter) have shown that a semiconductor material, such as Si, needs to be used to prevent contamination, projections need to have an uniform height to reduce errors, and irregular patterns having an uniform height can be formed by dry-etching a Si substrate with a silicon oxide film having a thickness of 10 nm to 0.1 nm deposited thereon under a condition that the selection ratio of Si to $SiO_2$ is high. The side wall of the projection is preferably vertical. The embodiments described below are based on the findings described above.

In the following, embodiments will be described in detail with reference to the drawings.

Embodiment 2

The second embodiment of the present invention will be described with reference to FIGS. 66, 67 and 73 to 78.

FIG. 66 includes schematic diagrams showing an adjustment sample 6601 according to this embodiment. FIG. 66(*a*) is a top view, and FIG. 66(*b*) is a cross-sectional view. The same reference numerals denote the same components. In order to prevent a heavy metal from entering a semiconductor device via an electron microscope that measures the adjustment sample, a Si substrate 6605 is used for the adjustment sample 6601 according to this embodiment. The adjustment sample 6601 having an irregular shape and fine projection and depression patterns is fabricated by dry-etching the Si substrate 5 with a plasma dry etching apparatus. In the top view of FIG. 66(*a*), a white area 6602 shown represents a top surface 6604 of the pattern, and a black area 6603 represents a bottom 6608 of the pattern. Reference numeral 6606 denotes the height of the projection pattern, and reference numeral 6607 denotes the width of the projection (pattern dimension). Although the Si substrate is used in this embodiment, a laminate substrate having a semiconductor layer of Si or the like on the top thereof may be used.

The adjustment sample having fine irregular patterns 6221 has the characteristics described below.

(1) Since the patterns are formed by processing the Si substrate, there is no possibility that a heavy metal enters the semiconductor device, and the sample is not charged even if it is irradiated with an electron beam. Since the sample is not charged even if it is irradiated with an electron beam, a distortion due to charges on the sample does not occur in the acquired image, and accurate measurement can be performed.

(2) As shown in FIG. 66(b), the irregular patterns formed on the sample have flat top surfaces 6604 and have a uniform height 6606. Therefore, measurement variations of the edge sharpness, which would otherwise occur due to variations in pattern height, do not occur, and the electron microscope can be adjusted with high precision and high stability.

Figure 73:
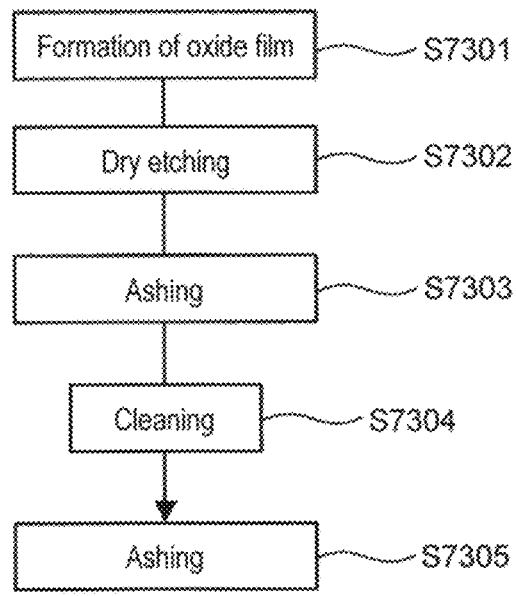
FIG. 73 is an example of a flowchart showing a process of manufacturing the charged particle beam apparatus adjustment sample according to the second embodiment.
Figure 74:
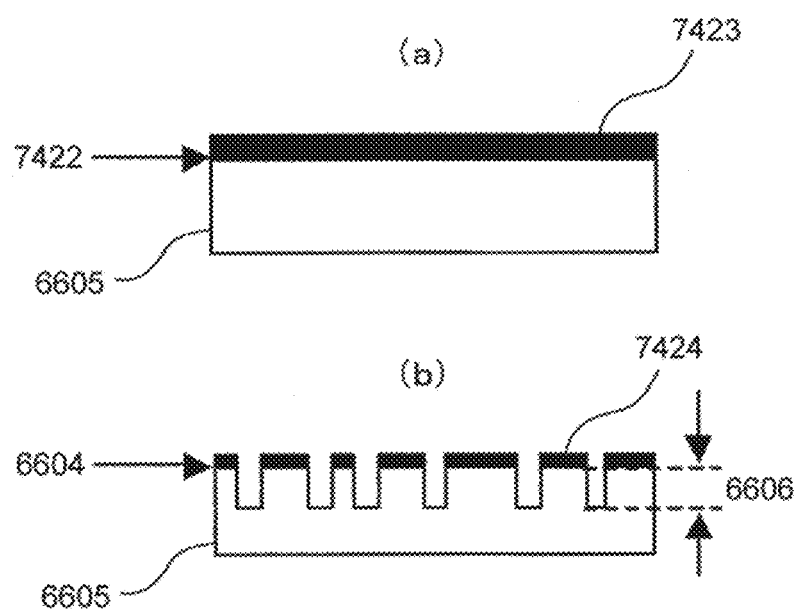
FIG. 74 includes schematic diagrams showing the charged particle beam apparatus adjustment sample according to the second embodiment in the course of the manufacturing process, FIG. 74(a) being a cross-sectional view of the charged particle beam apparatus adjustment sample in Step S801 (after formation of an oxide film), and FIG. 74(b) being a cross-sectional view of the charged particle beam apparatus adjustment sample in Step S802 (after dry etching).

Next, a method of manufacturing the adjustment sample will be described. FIG. 73 is a flowchart showing a process of manufacturing the adjustment sample 6601, and FIG. 74 includes schematic diagrams showing the sample in the course of the manufacturing process. FIG. 74(a) is a cross-sectional view of the adjustment sample in Step S7301 in FIG. 73, and FIG. 74(b) is a cross-sectional view of the adjustment sample in Step S7302.

As shown in FIGS. 74(a) and 73, first, a thin uniform silicon oxide film 7423 having a thickness of 10 nm to 0.1 nm is formed on a surface 7422 of the Si substrate 6605 (Step S7301). The oxide film can be formed by wet oxidizing the Si wafer surface, for example. However, in the case of an Si wafer for manufacture of a semiconductor device, although the Si substrate surface is cleaned during wafer fabrication, the thin uniform silicon oxide film 7423 having a thickness of 10 nm to 0.1 nm is usually formed after wafer fabrication by cleaning using hydrogen peroxide and ammonia or hydrochloric acid (cleaning based on RCA cleaning). Thus, the purchased clean Si wafer can be subjected to a dry etching processing as it is without pre-cleaning, thermal oxidation or the like of the wafer (Step S7302).

In the dry etching processing (Step S7302), a dry etching processing of the Si substrate 6605 with the thin silicon oxide film 7423 formed thereon is performed under etching conditions that Si is etched and the selection ratio of Si to the silicon oxide film 7423 is high, thereby forming irregular fine patterns on the wafer surface. In this embodiment, as an example, plasma etching using a mixed gas of $Cl_2$, $CHF_3$, Ar and $O_2$ is performed.

Figure 75:
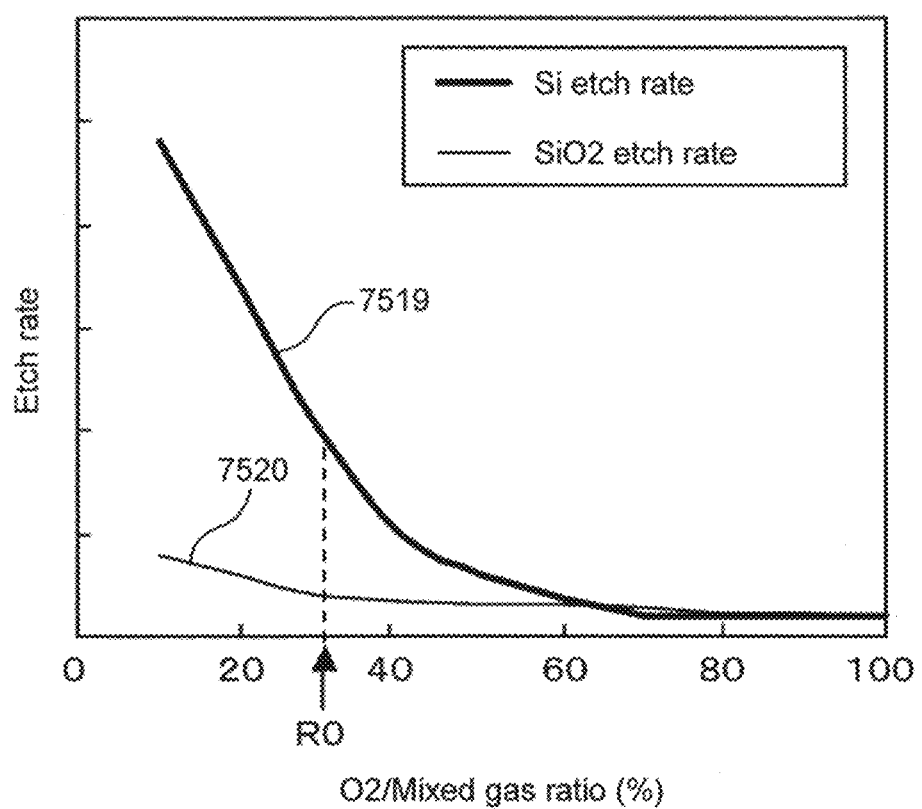
FIG. 75 is a graph for illustrating changes of etch rates of Si and a silicon oxide film according to the ratio of $O_2$ gas in a mixed gas.

If the ratio of the $O_2$ gas changes, for example, the mixed gas changes in etch rate of Si and the silicon oxide film. FIG. 75 shows an example of a graph showing a change of an etch rate 7519 of Si and a change of an etch rate 7520 of the silicon oxide film in the case where the ratio of the $O_2$ gas in the mixed gas of $Cl_2$, $CHF_3$, Ar and $O_2$ changes. Under a condition that the $O_2$ gas is excessive, etching of Si does not proceed, and a protective film (composed of an oxide film and a deposit) 7424 that serves to stop the progress of etching is formed on the surface of the Si substrate 5. If the ratio of the $O_2$ gas is low, etching of Si proceeds. However, if the ratio of the $O_2$ gas is too low, etching of the silicon oxide film 7423 serving as a mask proceeds, and it becomes difficult to form the patterns. Thus, as an etching condition that allows the silicon oxide film 7423 to partially remain, the ratio of the $O_2$ gas is set to be close to R0. Under this condition, the selection ratio of Si to the silicon oxide film is high, so that etching of Si proceeds.

If the Si wafer with an extremely thin uniform silicon oxide film 7423 formed on the surface thereof is dry-etched under this condition, since the etch rate 7520 of the silicon oxide film is low, etching of Si rapidly proceeds at irregular areas where the silicon oxide film 7423 has happened to disappear. The areas where etching of the Si substrate 6605 has proceeded develop into depressions, and the areas where the Si substrate 6605 has not been etched develop into projections. In this way, the irregular patterns are formed.

The dimensions of the depression and projection patterns can be made finer by adjusting not only the mixture ratio of the etching gas but also other etching conditions, such as the etching duration and the bias electrode power. In the dry etching processing in this embodiment, in order to form fine patterns having flat top surfaces 6604 and a uniform height 6606 over a wide area of the wafer, dry etching is performed so that parts of the flat uppermost surface 7422 of the Si substrate 6605 remain as the flat top surfaces 6604 of the fine patterns.

Once the dry etching is completed, ashing is performed to remove the residue (an oxide film and a deposit) of the dry etching (Step S7303). Furthermore, cleaning with hydrofluoric acid or the like is performed to remove the silicon oxide film on the surface (Step S7304). After the processing, ashing may be performed again to form a thin oxide on the sample surface to prevent a deposit from adhering to the adjustment sample irradiated with an electron beam (Step S7305). The adjustment sample according to this embodiment may be formed over the entire surface of the Si wafer or may be cut into chips having a size equal to or larger than a 1-cm square and placed on a stage in the electron microscope.

Figure 67:
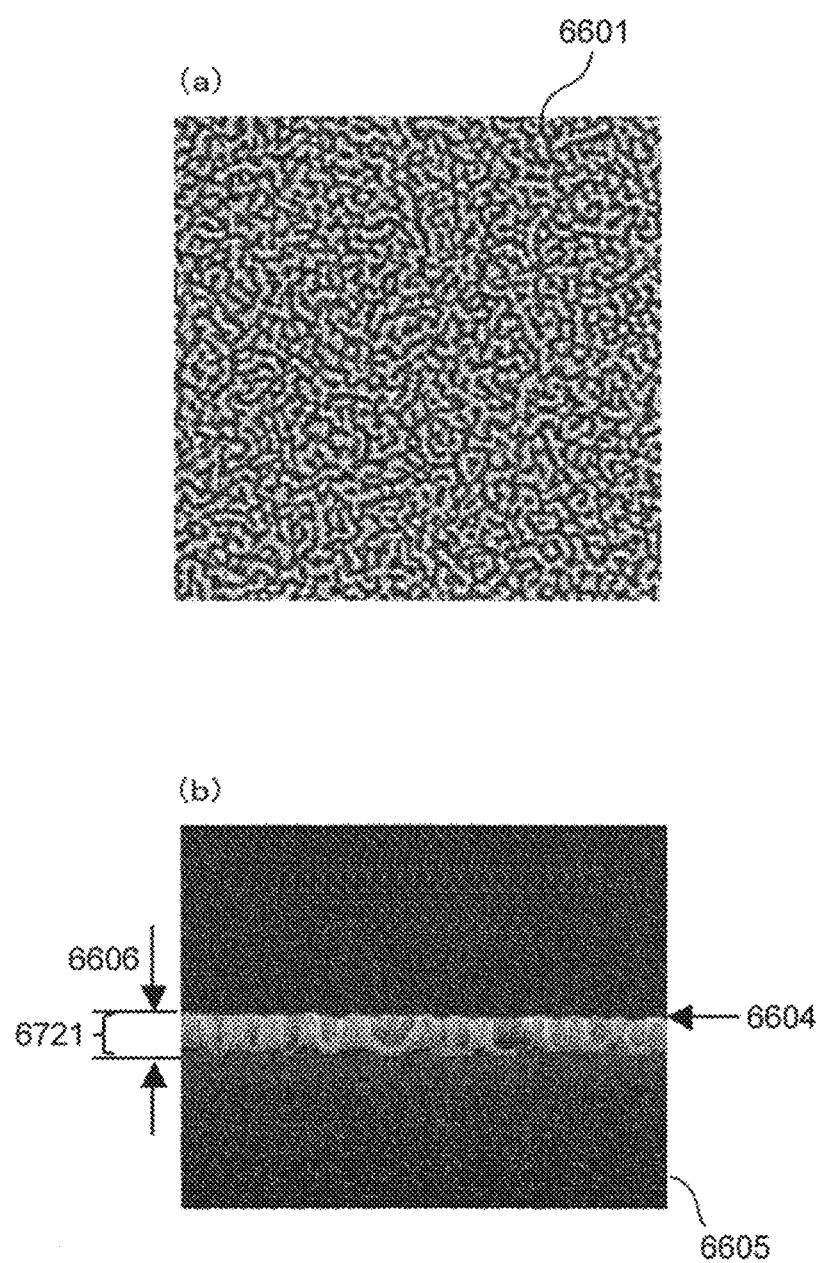
FIG. 67 includes electron microscope pictures of an example of the charged particle beam apparatus adjustment sample according to the second embodiment, FIG. 67(a) being a picture taken from above, and FIG. 67(b) being a cross-sectional picture.
Figure 70:
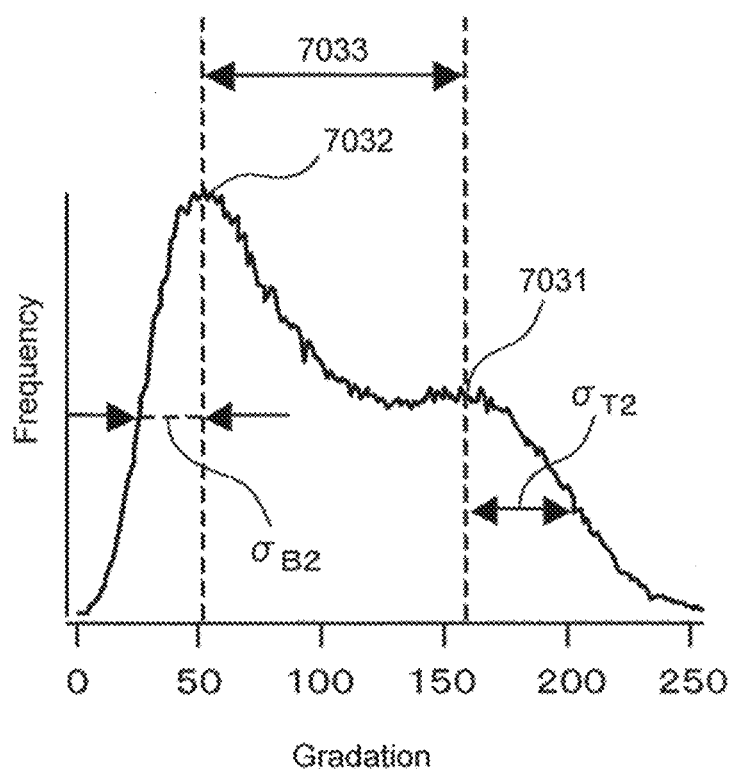
FIG. 70 is an example of a histogram of black and white gradation of an electron microscope image taken using a conventional sample.
Figure 71:
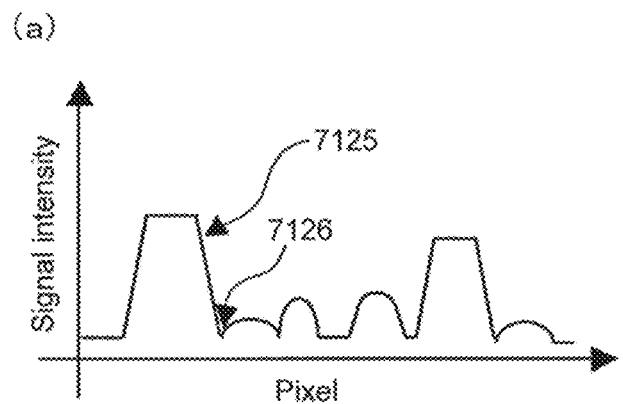
FIG. 71 includes diagrams for illustrating an electron beam profile in a case where the conventional sample is used, FIG. 71(a) showing a case where the electron microscope is focused on a tall projection, and FIG. 71(b) showing a case where the electron microscope is focused on a short projection.
Figure 72:
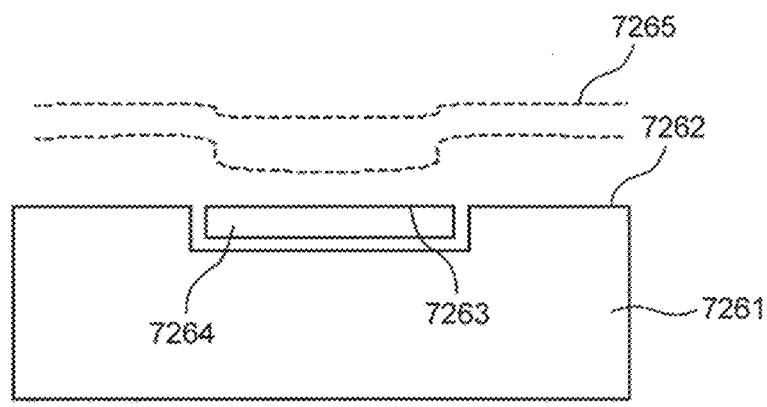
FIG. 72 is a schematic diagram showing a chip-like charged particle beam apparatus adjustment sample placed on a sample holder.

FIG. 67 shows an example of an electron microscope picture of the adjustment sample according to this embodiment. FIG. 67(a) is a top view, and FIG. 67(b) is a cross-sectional view. As shown in FIG. 67(a), dense fine patterns are formed over the entire wafer surface. As shown in FIG. 67(b), the fine patters have flat top surfaces and have a uniform height regardless of the position on the wafer. Furthermore, since the selection ratio of Si to the silicon oxide film is quite high under the etching condition, the patterns can be formed so that the side walls of the depressions and the projections are substantially perpendicular to the Si substrate. Although the mixed gas of $Cl_2$, $CHF_3$, Ar and $O_2$ is used in this embodiment, a mixed gas of $Cl_2$ and $O_2$, a mixed gas of $Cl_2$, $O_2$ and Ar, a mixed gas of HBr, $O_2$, $CHF_3$ and Ar, a mixed gas of HBr, $O_2$ and Ar, a mixed gas of HBr and $O_2$ or the like can also be used.

In the example of the electron microscope picture of the adjustment sample according to this embodiment shown in FIG. 67(a), the length of one side of the image is 0.7 μm. In the picture in this embodiment, the pattern pitch ranges from about 20 nm to 60 nm, and the pattern dimension 6607 of the projections ranges from about 10 nm to 30 nm. The pattern pitch and the pattern dimension are values in the cross section taken at an arbitrary position of the top view. In FIG. 66(b), the width of each projection indicates the pattern dimension (denoted by reference numeral 6607, for example), and the distance between the centers of projections (not shown) indicates the pitch. As shown in FIG. 67(b), the top surfaces 6604 of the patterns are substantially flat, and the pattern height 6606 is about 30 nm and is substantially the same over the entire surface of the sample. This is because the dry etching processing is performed so that the flat surface 7422 of the original Si substrate remains as the flat top surfaces 6604 of the fine patterns. As a result, the height variation of the adjustment sample 6601 falls within a range of 5 nm, and the edge sharpness can be measured with high precision, high stability and high reproducibility.

Figure 76:
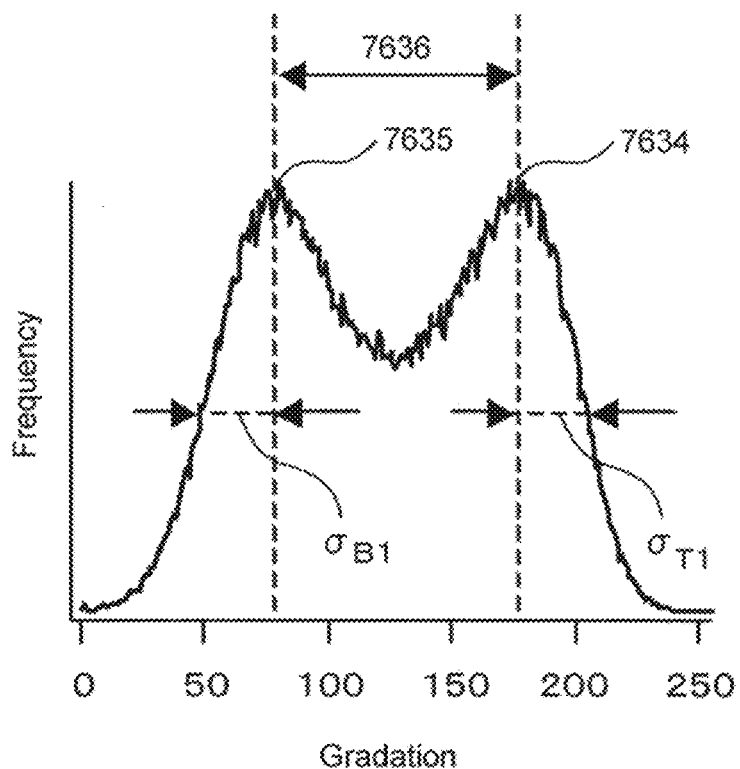
FIG. 76 is an example of a histogram of the black and white gradation of an electron microscope image of the charged particle beam apparatus adjustment sample according to the second embodiment.

FIG. 76 shows an example of a histogram of the black and white gradation of an electron microscope image of the adjustment sample 6601. The higher the gradation of the histogram, the brighter the image is, and the lower the gradation of the histogram, the darker the image is. The histogram shown in FIG. 76 has a bright peak 7634 and a dark peak 7635, the bright peak 7634 is formed by signals from the top surfaces 6604 of the patterns, and the dark peak 7635 is formed by signals from the bottom 6608 of the patterns. The gradation difference 7636 between the bright peak 7634 and the dark peak 7635 is a brightness component that varies depending on the height 6606 of the top surfaces 6604 of the patterns from the bottom 6608 of the patterns.

A variation $\sigma B1$ of the dark peak 7635 is a variation of the signal from the bottom 6608 of the patterns, which is the sum of a variation $\sigma N$ caused by an image noise component and a height variation of the bottom of the patterns. In the case of these patterns, the height variation of the bottom 6608 of the patterns is substantially 0, so that the variation $\sigma B1$ is mostly composed of the variation $\sigma N$ caused by the image noise component. On the other hand, a variation $\sigma T1$ of the bright peak 7634 is a variation of the signals from the top surfaces 6604 of the patterns, which is the sum of the variation $\sigma N$ caused by the image noise component and a brightness variation $\sigma TH1$ caused by a height variation of the top surfaces of the patterns. In FIG. 7611, the variation $\sigma T1$ is 30 gradations, and the variation $\sigma B1$ of the dark peak 7635 is about 30 gradations. Therefore, the variation $\sigma TH1$ caused by the height variation of the top surfaces of the patterns is substantially 0. Note that the variation $\sigma T1$ of the bright peak 7634 is preferably equal to or less than twice the variation $\sigma B1$ of the dark peak 7635.

Thus, the height variation of the adjustment sample 6601 can be reduced to 10 nm or less, for example. For example, when the height variation of the patterns having an average height from the pattern bottom 6608 to the pattern top of 100 nm is reduced to 10 nm or less, the variation $\sigma TH1$ caused by the height variation of the top surfaces of the patterns in the histogram of the electron microscope image is equivalent to 10 gradations or less. As a result, the measurement variation of the edge sharpness can be reduced to one tenth or less, and the measurement can be performed with high precision.

Figure 77:
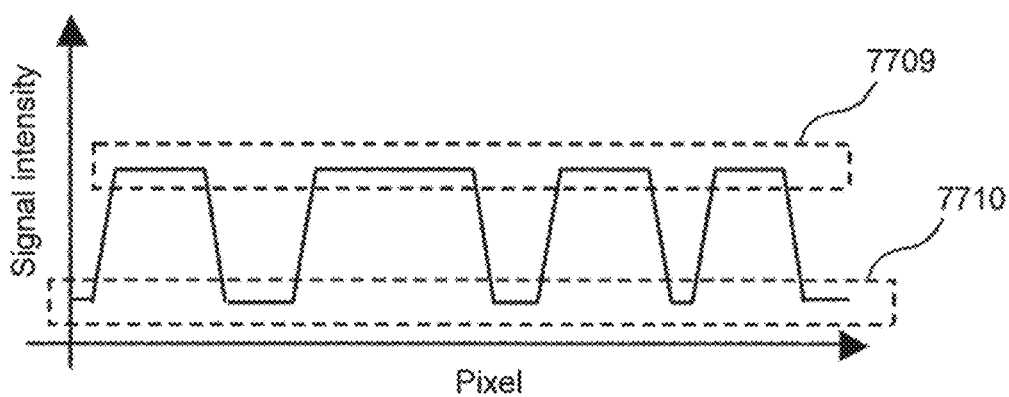
FIG. 77 shows an example of an electron beam profile acquired from an image of the charged particle beam apparatus adjustment sample according to the second embodiment.

In addition, the height variation of the patterns has little effect on the focus point in acquisition of the image of the adjustment sample 6601, and the image can be stably acquired. FIG. 77 shows an example of an electron beam profile acquired from the image of the adjustment sample 6601 according to this embodiment. Since the upper most surface of the adjustment sample 6601 has flat parts (the top surfaces 6604 of the patterns), and the pattern height 6606 is uniform, the focus point during image acquisition is little affected by the variation of the pattern height 6606, and the electron beam profile can be stably acquired. In addition, since the uppermost surface of the sample has flat parts (the top surfaces 6604 of the patterns), signal areas 7709 of signals from the top surfaces of the patterns and signal areas 7710 of signals from the bottom 6608 of the patterns can be easily extracted in the electron beam profile, and a clear image can be stably acquired.

Although the dimensions of the patterns in the example of the electron microscope image of the sample 6601 shown in FIG. 67 have been described above, in general, the adjustment sample can have pattern dimensions described below. That is, the fine projection and depression patterns can have a pattern pitch ranging from about 6 nm to 200 nm, the projections can have a pattern dimension 6607 ranging from about 3 nm to 200 nm, and the fine projection and depression patterns can have a uniform height falling within a range from 5 to 500 nm.

FIG. 78 shows correlations between the edge sharpness measured with the adjustment sample 6601 and an average length measurement value of standard line patterns. FIG. 78(*a*) shows a correlation between an edge sharpness 7851 measured with the adjustment sample 6601 and an average length measurement value 7852 of standard line patterns in a case where the current value of the objective lens is changed to change the focus of the incident electron beam. FIG. 78(*b*) shows a correlation between an edge sharpness 7854 measured with the adjustment sample 6601 and an average length measurement value 7855 of standard line patterns in a case where astigmatism is changed. For comparison, plots 7853 and 7856 of the edge sharpness measured with a conventional gold-particle sample are also shown.

The value of the edge sharpness measured with the adjustment sample 6601 changes in synchronization with the length measurement value of line patterns to be inspected, and the focusing current value and the set astigmatism value at which the edge sharpness is at the minimum agree with the values at which the line length measurement value of the patterns to be inspected is at the minimum. This shows that the conditions can be adjusted to be suitable for length measurement of the patterns to be inspected by adjusting the electron beam with the adjustment sample 6601. However, in the case where the conventional gold-particle sample is used, the conditions cannot be adjusted to be suitable for length measurement of the patterns to be inspected by adjusting the electron beam to minimize the edge sharpness. This is because the edge sharpness of the gold-particle sample is adjusted in terms of contrast, which depends on the gold particle and the material of the organic film, although the structure and the material of the patterns to be inspected are the same as those of the adjustment sample 6601, or an error in attachment of the gold-particle sample, which is a chip-like sample, to the sample holder makes the electric field intensity on the sample surface different from that in length measurement of the patterns to be inspected.

Due to residual gas or the like in the vacuum of the electron microscope, a contamination or the like may be deposited in the area irradiated with the electron beam during image acquisition or adjustment and the surrounding area to cause a slight change of the pattern dimension 6607 or shape of the adjustment sample 6607. To reduce the contamination deposition due to irradiation with the electron beam, a thin oxide film may be formed on the surface of the adjustment sample (Step S7305 in FIG. 73). Note that the thin silicon oxide film on the surface is thin enough that the film is not charged when it is irradiated with the electron beam.

Since the adjustment sample according to this embodiment has irregular patterns, even if a part of the sample once imaged is observed again, dimension variations have no significant effect on the resolution evaluation value or the image distortion measurement result. However, in the case where an especially high measurement precision is needed, the dimension variations may have a significant effect. Thus, in order to avoid evaluating again an area once imaged, the adjustment sample may be marked at several positions so that the part to be imaged can be recognized. By such marking, information on which area of the sample has already been irradiated with the electron beam can be managed based on the address on the sample. The marks are formed at desired positions on the adjustment sample. Therefore, in the process of forming the marks, a mask is formed by lithography, and the marks are formed by dry etching. The process of forming the marks may be performed before or after the irregular patterns are formed on the adjustment sample. In the case where the irregular patterns are formed after the marks are formed, for example, projection and depression patterns having depths ranging from 100 nm to 1 µm are formed as the marks, and then, a silicon oxide film having a thickness or 10 nm or less is formed in the area where the irregular patterns are to be formed. After that, the irregular patterns can be formed according to the flowchart of FIG. 73. In the case where the marks are formed after the irregular patterns are formed, a resist is applied to the adjustment sample to protect the area where the irregular patterns are to be maintained, after the irregular patterns are formed according to the flowchart of FIG. 73. Then, a mask for forming the masks is formed by lithography, and projection and depression patterns having depths ranging from 100 nm to 1 µm, for example are formed by dry etching.

As described above, according to this embodiment, by forming irregular patterns of a semiconductor material having a uniform height on the surface of the substrate, a charged particle beam apparatus adjustment sample that allows precise and stable adjustment of the charged particle beam apparatus that can be used for manufacturing a semiconductor device and a method of manufacturing the same can be provided.

Embodiment 3

The third embodiment will be described with reference to FIGS. 7, 11, 79 and 80. Matters that have been described in the embodiment 2 but will not be described in this embodiment can be applied to this embodiment unless otherwise described. In this embodiment, a method of measuring and adjusting the performance of an electron microscope using the adjustment sample 6601 described in the embodiment 2 will be described. In particular, a method of measuring edge sharpness as a spatial resolution evaluation value of an electron microscope will be described in detail.

Figure 79:
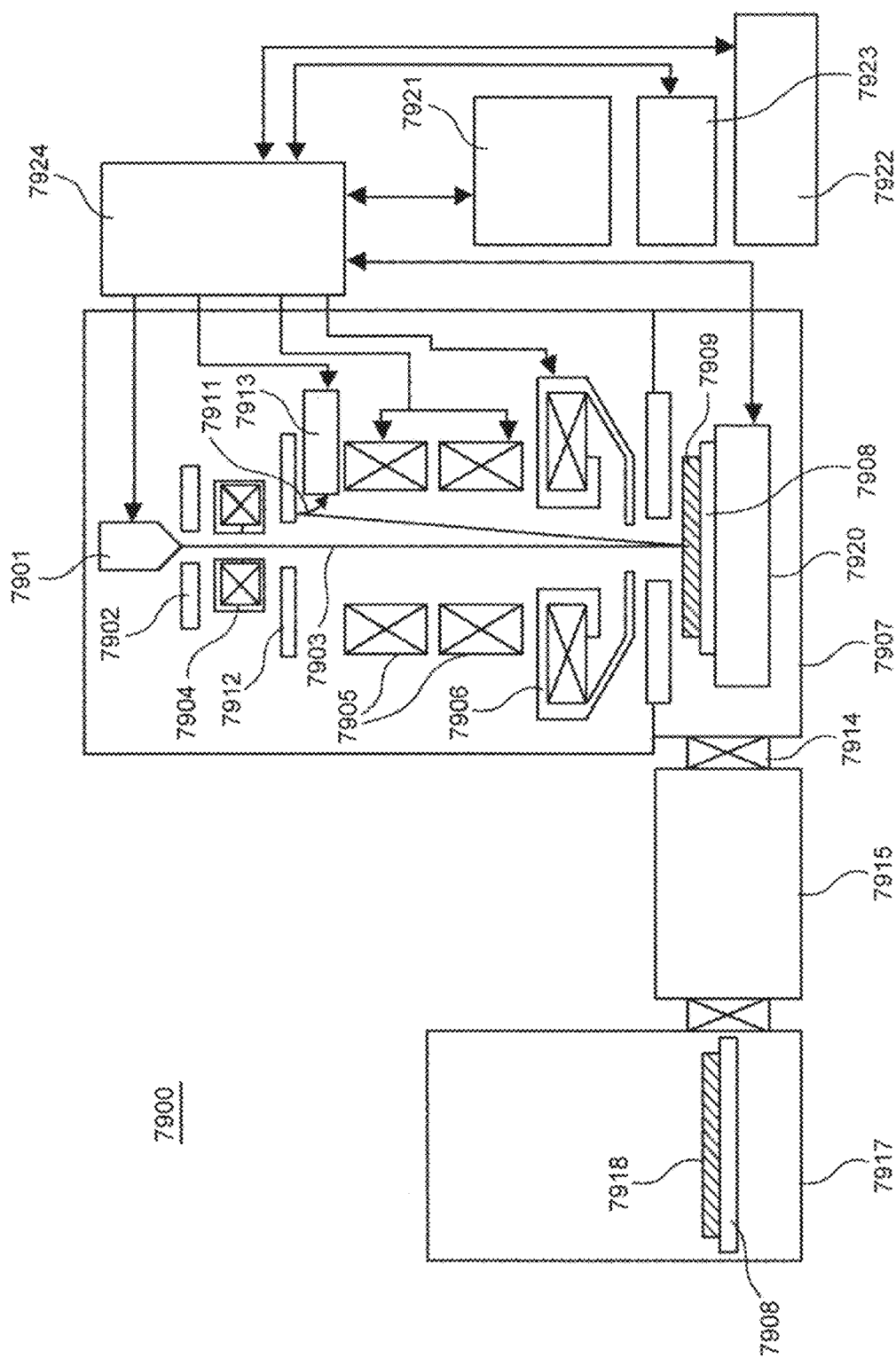
FIG. 79 is a schematic diagram showing an example of a configuration of a scanning electron microscope used in a third embodiment.

FIG. 79 is a schematic diagram showing an example of a configuration of a scanning electron microscope 7900 used in this embodiment. An electron beam 7903 extracted from an electron source 7901 by an extraction electrode 7902 and accelerated by an acceleration electrode is focused by a condenser lens 7904, and then, a sample 7909 is one-dimensionally or two-dimensionally scanned with the electron beam 7903 by a scanning deflector 7905. The electron beam 7903 is decelerated by a negative voltage applied to a sample stage 7908 and focused by the lens effect of an objective lens 7906 before irradiating the sample 7909.

When the sample 7909 is irradiated with the electron beam 7903, a secondary electron and a backscattered electron are emitted from the irradiated part. The electrons emitted from the sample are accelerated in the direction of the electron source and collides with a conversion electrode 7912 to produce a secondary electron 7911. The secondary electron 7911 emitted from the conversion electrode 7912 is detected by a detector 7913. The output of the detector 7913 changes depending on the amount of the detected secondary electrons. The brightness of a secondary electron image displayed on a display apparatus 7921 changes with the output. For example, in a case of forming a two-dimensional image, an image in a scan area is formed by synchronizing a deflection signal to the scanning deflector 7905 and the output of the detector 7913 with each other.

The scanning electron microscope illustrated in FIG. 79 is further provided with an image shifting deflector for moving the scan area for the electron beam without moving the sample by moving a sample stage 7920, so that the field of view of the electron microscope can be finely moved. Although the electron emitted from the sample is converted by the conversion electrode before detection in the example shown in FIG. 79, the present invention is, of course, not limited to such an arrangement. For example, an electron multiplier or a detection surface of the detector may be disposed on the path of the accelerated electron.

A sample 7918 including the adjustment sample 6601 for adjusting the electro-optical system used in this embodiment may be placed on the sample stage 1101 for placement of the sample 1102 in the electron microscope, as illustrated in FIG. 11. The sample 7918 is placed on the sample stage so that an upper most surface 7262 of the sample stage and a surface 7263 of the sample need to be flush with each other in order to prevent an electric field intensity distribution 7265 from changing because of the level difference between the uppermost surface 7262 of the sample stage and the surface 7263 of the sample, and the sample has a size equal to or larger than a 5-mm square. Furthermore, as illustrated in FIG. 79, a pre-evacuation chamber (load lock chamber) 7915 and a mini environment 7917 are connected to a sample chamber 7907 with a vacuum valve 7914 interposed therebetween. For example, the sample 1103 having adjustment patterns may be prepared in the mini environment 7917 and carried into the sample chamber 807 as required. Alternatively, a wafer having adjustment patterns formed on the entire surface thereof (the sample 1102, for example) may be used to adjust a plurality of apparatuses. Using the same adjustment sample formed on the wafer to adjust the measurement conditions of a plurality of apparatuses is advantageous in that the measurement errors owing to the sample can be reduced, so that the machine difference of the plurality of apparatuses can be accurately measured and adjusted. In addition, the electro-optical system can be adjusted under exactly the same conditions as those for measurement of the wafer to be inspected, so that there are advantages that the measurement precision of the evaluation value of the spatial resolution, and the image distortion and the like can be improved, and the apparatus can be adjusted with high precision.

A controller 7924 not only controls each component of the scanning electron microscope 7900 and but also has a capability of forming an image based on the detected electrons and a capability of measuring a dimension of a pattern formed on the sample based on the signal intensity distribution of the detected electrons. The controller 7924 further has a capability of adjusting the focus point, the astigmatism or the like based on the signal intensity distribution of the image acquired by irradiating the adjustment sample 6601 with the electron beam. In particular, the controller 7924 has a capability of calculating the edge sharpness as the evaluation value of the image resolution from the acquired image and controlling each component of the scanning electron microscope 7900 to adjust the electron microscope based on the measured evaluation value if the calculated evaluation value falls out of a prescribed range. Furthermore, as described later, the controller 7924 has a capability of measuring the image magnification or image distortion by image processing of a plurality of images. Furthermore, an image processing section 7923 has an image processing capability for correcting the distortion of the image acquired with the scanning electron microscope 7900 based on the magnification measurement result or the image distortion measurement result. Furthermore, the controller 7924 has a capability of controlling each component of the scanning electron microscope 7900 so as to correct the distortion of the image acquired with the scanning electron microscope 7900 based on the magnification measurement result or the image distortion measurement result.

Figure 80:
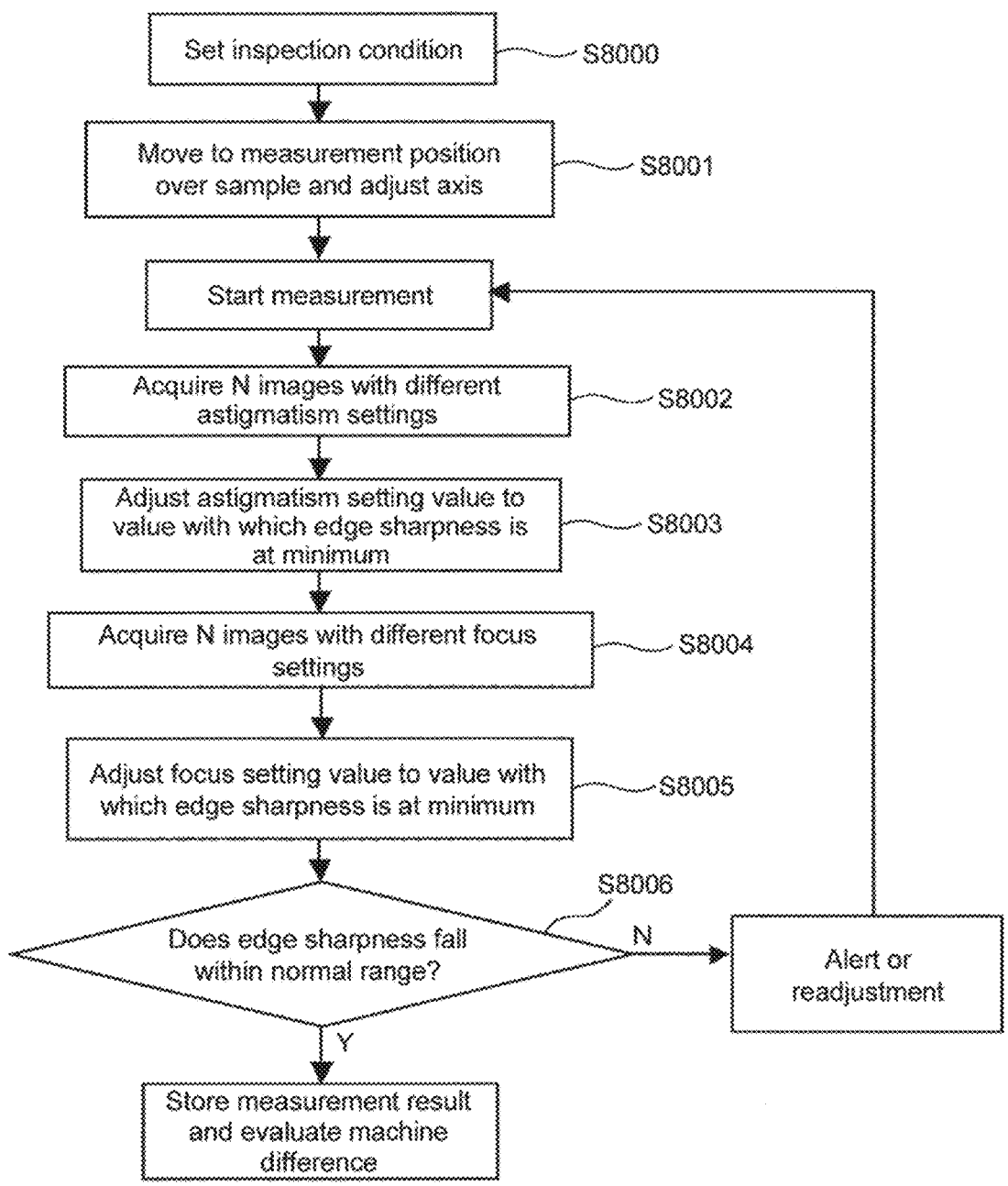
FIG. 80 is a flowchart showing an example of a process of measuring the edge sharpness using the adjustment sample shown in FIG. 66.

First, there will be described an example of a method of measuring an evaluation value of the spatial resolution of an electron microscope using the adjustment sample according to this embodiment described above and adjusting the electron microscope based on the measured evaluation value. As the evaluation value of the spatial resolution, for example, values described in Patent Literatures 3, 4 and 5 can be used. FIG. 80 is a flowchart showing an example of a process of measuring the edge sharpness using the adjustment sample 6601. First, an inspection condition of the scanning electron microscope 7900 is set (Step S8000). Then, the stage 7920 is moved to move the adjustment sample into a field of view (Step S8001). Then, N images of the adjustment sample 6601 are acquired with N slightly different astigmatism setting values of the objective lens 7906 (Step S8002). The controller 7924 calculates the setting value with which the edge sharpness is at the minimum from the acquired N images and adjusts the astigmatism setting value at that value (Step S8003). Then, N images of the adjustment sample 1 are acquired with N slightly different focus setting values of the objective lens 7906 (Step S8004). The controller 7924 calculates the setting value with which the edge sharpness is at the minimum from the acquired N images and adjusts the focus setting value at that value (Step S8005).

After the focus adjustment and the astigmatism adjustment of the scanning electron microscope 7900, an image for spatial resolution evaluation is acquired and stored in a storage apparatus 7922. Then, the controller 7924 calculates the edge sharpness of the acquired image and determines whether or not the value of the edge sharpness falls within a preset normal value range (Step S8006). If the edge sharpness of the adjusted image does not fall within the normal value range, Steps S8001 to S8006 are repeated to perform adjustment again. Alternatively, an alert may be output. If the edge sharpness falls within the normal value range, the measurement result is stored. Furthermore, machine difference evaluation is performed as required.

The adjustment sample 6601 used in this embodiment has densely formed fine patterns that have flat top surfaces flush with each other and stand substantially perpendicularly to the surface of the sample, as described in the embodiment 2. Therefore, a steep electron beam profile can be stably acquired over the entire image, and an accurate spatial resolution evaluation value can be stably acquired regardless of the part of the sample irradiated with the electron beam. As described above, the controller 7924 can stably and accurately calculate the edge sharpness from the image acquired by irradiating the adjustment sample 6601 with the electron beam. The calculated value of the edge sharpness is stored in the storage apparatus 7922. The value can also be displayed on the image display apparatus 7921 of the scanning electron microscope 7900.

Furthermore, in a semiconductor manufacturing line in which a plurality of scanning electron microscope are used to manage the dimensions of semiconductor devices for a long period, high spatial resolution can be maintained and the machine difference between the electron microscopes can be managed by monitoring the edge sharpness from the plurality of electron microscopes.

In the following, there will be described a method of reducing the machine difference among SEMs 701 to 703 using the measurement/inspection system in which the SEMs 701 to 703 are connected to a network as illustrated in FIG. 7. First, each SEM 701 to 703 regularly evaluates the spatial resolution using the adjustment sample 6601, displays the progression of the evaluation value and stores the evaluation value in the storage section (the storage medium 706, for example). The resolution evaluation value regularly obtained by each electron microscope is transmitted to the condition setting apparatus 704 via the network, and the condition setting apparatus 704 centrally manages the resolution evaluation values and other information from the electron microscopes. If the measured spatial resolution evaluation value falls out of a preset allowance range, a notification of the abnormality is made by the display section 7921 of the microscope and the condition setting apparatus 704. If an electron microscope is judged to be abnormal from the spatial resolution evaluation value according to the method described above, the electron microscope is instructed by an operator of the apparatus or a program incorporated in a control program to perform adjustment of the electro-optical system that is one of inspection conditions, for example, and the controller 7924 of the microscope controls and adjusts the lens system according to a signal based on the evaluation value so that the spatial resolution evaluation value falls within the desired normal range. In this way, the electron microscopes are centrally managed and regularly adjusted by the condition setting apparatuses 704 so that the spatial resolution evaluation value falls within the desired normal range. Thus, even if a semiconductor manufacturing line is managed with a plurality of electron microscopes, measurement can be performed while keeping the spatial resolution within a certain normal range, so that measurement errors owing to the machine difference among the apparatuses can be reduced, and the quality can be stabilized. However, a small machine difference can occur among the apparatuses despite the spatial resolution evaluation values of the plurality of electron microscopes falling within the prescribed normal range. In such a case, the condition setting apparatus 704 determines, in advance, a machine difference correction coefficient for the length measurement value of each apparatus and correct the length measurement value obtained by each apparatus. In this way, the machine difference among a plurality of electron microscopes can be reduced in dimension management in semiconductor device manufacturing.

As described above, according to this embodiment, by using a charged particle beam apparatus adjustment sample having irregular patterns of a semiconductor material having a uniform height formed on the surface of a substrate, a charged particle beam apparatus adjusted with high precision that can be used in semiconductor device manufacturing can be provided. Furthermore, since the performance of the charged particle beam apparatus can be monitored and adjusted with high precision any time, measurement can be performed with high precision and high stability. Furthermore, since the spatial resolution evaluation value can be adjusted so as to fall within a desired normal range, the machine difference in measurement value among a plurality of charged particle beam apparatuses in a semiconductor manufacturing line can be reduced, and measurement can be performed with high stability.

Embodiment 4

The embodiment 4 will be described with reference to FIGS. 1 and 81 to 83. Matters that have been described in the embodiments 2 and 3 but will not be described in this embodiment can be applied to this embodiment unless otherwise described. In this embodiment, a method of measuring and adjusting the performance of an electron microscope using the adjustment sample 6601 described in the embodiment 2 will be described. In particular, a method of quickly and precisely measuring a two-dimensional local magnification variation or image distortion of an image acquired with an electron microscope will be described in detail.

With reference to FIG. 1, a method of measuring an image distortion used in this embodiment will be described in detail. This method is to two-dimensionally measure an image distortion using a plurality of images acquired before and after movement of the field of view. A partially overlapping area is provided between a first image A 101 acquired before movement of the field of view and a second image B 106 acquired after movement of the field of view, and the area is used as a distortion evaluation area. A magnification distortion distribution and a shape distortion distribution in the overlapping image area can be measured at the same time by comparing the two images. The image distortion can be evaluated in a shorter time since the calculation involves a reduced number of (at least two) images.

First, the image A 101 in a field of view on a sample is acquired. Then, the field of view is moved rightward by a field-of-view movement amount 103, and the image B 106 is acquired. There is an overlapping field of view between the field of view of the image A 101 and the field of view 102 of the image B. It is assumed that there are a circle pattern 105 in a left area of the image and a rectangle pattern 104 in a right area of the image. The positions of these patterns differ by the field-of-view movement amount 103 between the image A 101 and the image B 106. On the assumptions described above, it is further assumed that the position of the circle pattern 105 in the image A is shifted leftward in the image B by a circle pattern movement amount 107 (X1), for example. Similarly, it is assumed that a rectangle pattern movement amount 108 (X2) is determined. Then, the image distortion in the horizontal direction in the vicinity of the rectangle pattern 104 can be measured to be X2/X1% of the image distortion in the horizontal direction in the vicinity of the circle pattern 105. Other than the rectangle pattern, if there is a pattern having a characteristic shape at a different position in the image, the relative magnitude of the image distortion in the vicinity of the pattern can be measured. If there are such patterns evenly distributed in the image, a distribution diagram of the image distortion of the image can be created.

This method has an advantage that no dimension calibration of the pattern on the sample is needed. Therefore, this method has an advantage that the cost required to produce the sample can be reduced. This method further has an advantage that, since the image distortion distribution over the entire image can be essentially obtained at one time from two images, the time and cost required for image distortion measurement can be reduced.

Although the field of view is moved in the horizontal direction in this embodiment, the field of view may be moved in an oblique direction at an angle of 45°. Then, the field of view can be moved in the horizontal direction and in the vertical direction at the same time. Then, the image distortion can be measured in the horizontal direction and in the vertical direction at the same time, and the measurement time can be advantageously reduced.

Figure 81:
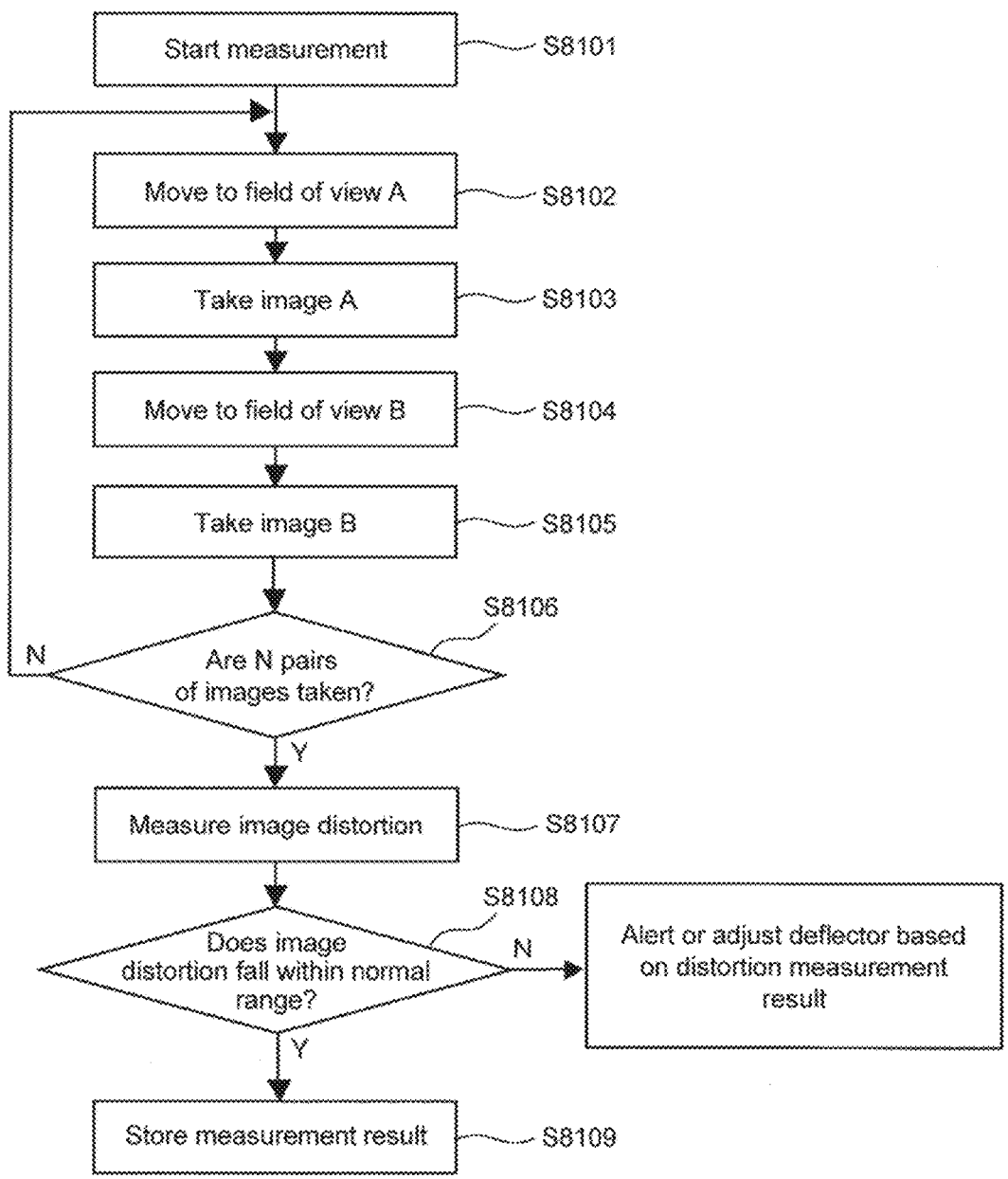
FIG. 81 is a flowchart for illustrating a process of acquiring an image required for image distortion measurement.

FIG. 81 is a flowchart showing a process of acquiring an image required for image distortion measurement. The scanning electron microscope used in this embodiment is the scanning electron microscope 7900 described above in the embodiment 3 with reference to FIG. 79.

First, when a signal to start measurement (Step S8101) is input to the apparatus, the stage 7920 is moved to move the adjustment sample 6601 into a field of view A (Step S8102). The image A is taken in the field of view A and stored in the storage apparatus (Step S8103). Then, the field of view is moved to a field of view A that partially overlaps with the field of view A (Step S8104). The scanning electron microscope 7900 performs the movement of the field of view by image shifting, for example. Alternatively, the stage on which the sample is mounted is moved to move the field of view for observation. The direction of the movement from the field of view A to the field of view B is an upper right direction at an angle of 45° with respect to the field of view A, for example. The distance of the movement is a distance determined by about a tenth of the length and about a tenth of the width of the field of view A, for example. If the field of view has a size of 0.7 µm by 0.7 µm, for example, the distance of the movement is determined by 0.07 µm of rightward movement and 0.07 µm of upward movement. Then, the image B is taken and stored in the storage apparatus 7922 (Step S8105).

By the procedure described above, a pair of images, the image A and the image B, is taken. In the actual measurement, in order to reduce an error caused by noise in the images, a plurality of pairs of images are preferably taken. Thus, the procedure described above is repeated in a loop until N pairs of images (N=10, for example) are acquired (Step S8106).

Once the images in different fields of view are acquired, the movement amount of a pattern at a specified position in the overlapping field of view is measured to measure the image distortion (Step S8107). The measurement of the movement amount of the pattern can be performed by a pattern matching method, for example. According to the pattern matching method, the movement amount of the pattern can be measured by cutting an image area A' around a specified position in the image A to create a template for pattern matching and then searching the image B for a part that closely resembles the template.

Once the movement amount of the pattern is measured, in step S8108, it is determined whether the image distortion falls within a normal range or not. If the result of the determination is NO (N) (the image distortion falls out of the normal range), an alert is issued, or the deflector is adjusted based on the distortion measurement result. If the result of the determination is YES (Y) (the image distortion falls within the normal range), the measurement result is stored (Step S8109).

Figure 82:
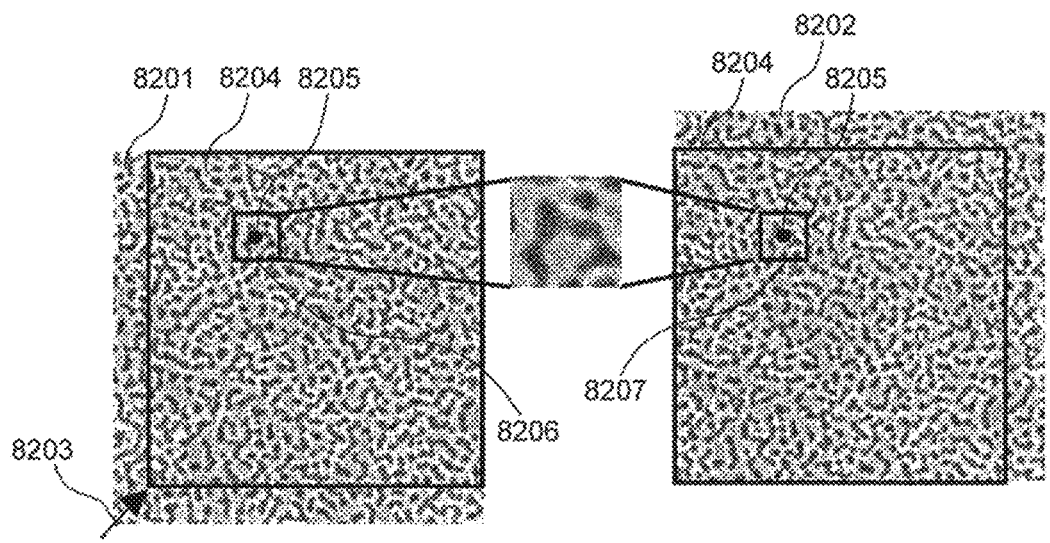
FIG. 82 is a diagram for illustrating a method of measuring the movement amount of a pattern by image matching.

As an alternative, the movement amount of the pattern may be measured by image matching according to phase-only correlation. FIG. 82 is a diagram for illustrating the measurement method. First, image matching is performed between the whole of an image A 8201 taken in a field of view and the whole of an image B 8202 taken in a different field of view to measure a movement amount 8203 of the entire image. Then, an image 8206 around a specified position 8205 in an overlapping field of view 8204 is cut from the image A, and an image 8207 around the specified position 8205 in the overlapping field of view 8204 in the image B is cut from the image B. Then, matching is performed between the images 8206 and 8207 to measure a small movement amount around the specified position 8205. Then, the movement amount of the specified position can be determined by matching the movement amount 8203 of the entire image and the small movement amount around the specified position 8205 against each other. In this embodiment, image information on a local area in the overlapping area is used to measure the movement amount of the pattern. Of course, image matching methods other than the method described above can also be used.

Thus, the magnification adjustment sample according to this embodiment needs to have patterns having characteristic shapes formed evenly over the entire field of view as described in the embodiment 2. In addition, in order to determine the movement amount of the pattern, the images 8206 and 8207 around the specified position need to contain information on the characteristic shape enough to measure the movement amount by image matching. Furthermore, the sample needs to be capable of being stably and clearly imaged with the electron microscope regardless of the area of the sample to be measured. The adjustment sample 6601 described in the embodiment 2 is suitable for measurement and calibration of the image distortion according to this embodiment because the entire image of the adjustment sample 6601 is dense with of fine patterns having irregular shapes. Table 1 shows representative values of the magnification of the image measured in this embodiment and the required pattern dimension 6607 on the adjustment sample in the image area around the specified position.

TABLE 1

| Magnification | Representative pitch (nm) |
|---|---|
| × 50,000 | 230 nm |
| × 100,000 | 115 nm |
| × 200,000 | 60 nm |
| × 400,000 | 30 nm |
| × 600,000 | 20 nm |

As an example, a case will be described in which a 32-pixel by 32-pixel block is cut as the image area around the specified position to perform image matching. Although a unique dimension cannot be determined since the adjustment sample has irregular patterns, the patterns need to be appropriately fine. If the image magnification is of the order of 50,000, the representative value of the required pattern dimension 6607 on the adjustment sample is 230 nm. However, since current electron microscopes are used with the image magnification increased up to 600,000 or so, the pattern pitch is preferably as small as 20 nm or so. The adjustment sample according to this embodiment have irregular patterns formed over the entire surface thereof with pitches ranging from 10 to 100 nm, so that the movement amount of the pattern can be measured at any specified position in the field of view as far as the image magnification is not higher than approximately 600,000.

Figure 83:
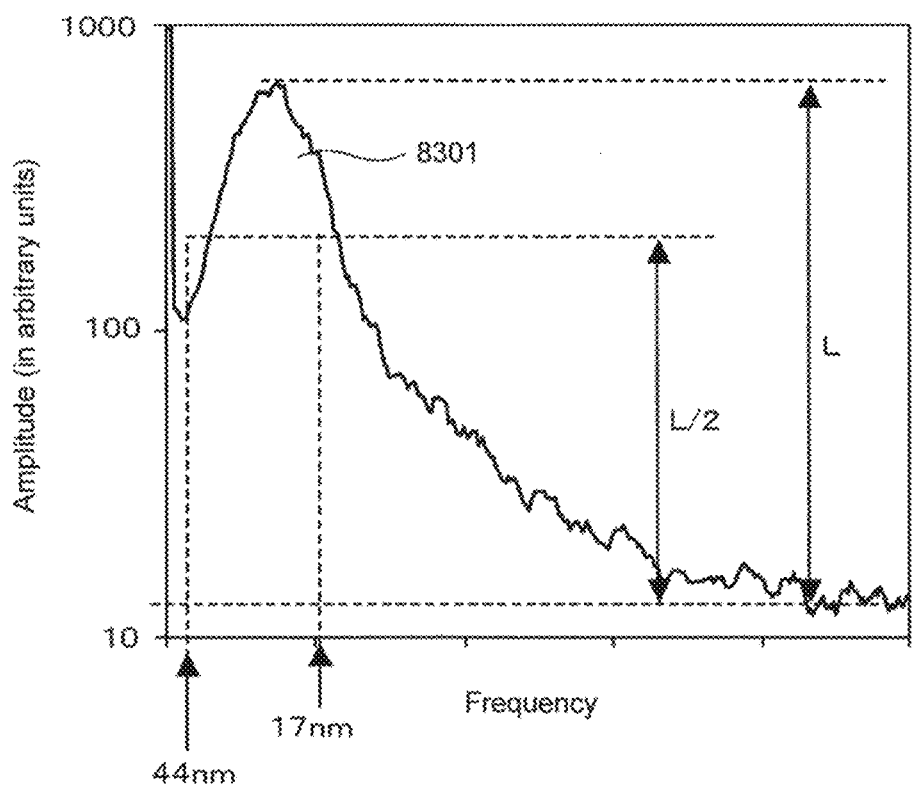
FIG. 83 shows an example of a power spectrum of an image of the adjustment sample shown in FIG. 66.

FIG. 83 shows an example of a power spectrum 8301 determined by two-dimensional Fourier transform from an image of the adjustment sample. Provided that the dimensions corresponding to the frequencies at which the amplitude value of the power spectrum 8301 is equal to or larger than a half of a maximum amplitude L are predominant pattern pitches of the adjustment sample, it can be seen that, in this embodiment, the peak is composed of components corresponding to the pitches of 17 nm to 44 nm in the image. In the case of this sample, provided that the local area to be evaluated for image distortion has a size of 32 pixels by 32 pixels, images with magnifications of up to approximately 600,000 can be evaluated.

FIG. 4 shows a vector representation 401 of an image distortion measured by moving the field of view in the X direction and the Y direction at the same time. A large number of specified positions (in FIG. 4, a total of 630 positions: 45 positions in the vertical direction by 14 positions in the horizontal position) at which the movement amount is to be measured are provided, and the amounts and directions of the distortion measured at the points can be represented by vectors. The vector representation 401 of the distortion allows the local image distortion distribution to be seen at a glance. The X component and the Y component of each vector represent the X-directional component and the Y-directional component of the distortion. The length of the arrow shown at the bottom right of the vector-based distribution representation diagram represents a distortion ratio of about 1%. In this way, according to this embodiment, a two-dimensional local image distortion can be measured and displayed.

The measurement value of the image distortion obtained in this way is output to an electronic file as inspection information on an image acquired after measurement of the distortion at the time of acquisition. Alternatively, the measurement value is stored as inspection information in the storage apparatus 7922 of the scanning electron microscope 7900.

Next, an application of the measurement value of the distortion amount obtained as described above to image correction or the like will be described.

First, according to an example of a method of correcting a measured image distortion, the controller 7924 of the scanning electron microscope 7900 can calculate an adjustment value for the scanning deflector 7905 from a distortion measurement value calculated from the image and adjust the scanning deflection amount of the scanning deflector 7905 to correct the image distortion at the time of inspection.

As another example of the method of correcting a measured image distortion, there is a method of correcting the image distortion by distorting the entire image in the opposite direction based on the vector distribution over the specified positions obtained as described above, for example. The distortion vector is calculated at each pixel based on the distortion vector at the specified position, and a correction vector is obtained by inverting the sign of the distortion vector at each pixel. The image can be distorted at each pixel according to the correction vector, thereby eliminating the distortion to correct the image.

As further example of the method of correcting a measured image distortion, there is a method of obtaining correct positional information by correcting positional information derived from the image. For example, a contour line of a structure observed in an electron beam image is extracted, and positional information for contour points forming the contour line is calculated. Then, the distortion vectors at the calculated points are calculated according to the distortion vectors at the specified positions measured as described above. Then, the sign of the distortion vector is inverted at each contour point to obtain a correction vector. An accurate contour line that is not affected by the image distortion can be obtained by correcting the position of the contour line according to the correction vectors.

Next, there will be described an example in which a semiconductor manufacturing line is managed by evaluating an image distortion with a plurality of electron microscopes. For example, three SEMs 701 to 703 are connected to the measurement/inspection system illustrated in FIG. 7. When the same pattern is measured with a plurality of electron microscopes, it is preferred that the electron microscopes output the same measurement result. However, if there is a machine difference among the apparatuses, the measurement result can differ from each other. In such a case, each electron microscope performs the image distortion evaluation according to this embodiment and stores the image distortion evaluation result and the machine difference in the storage section. The image distortion evaluation result regularly obtained by each electron microscope is transmitted to the condition setting apparatus 704 via the network, and the condition setting apparatus 704 centrally manages the image distortion evaluation result and other information from the electron microscopes. Furthermore, the plurality of electron microscopes can be made to provide the same measurement result by performing measurement by correcting the image distortion based on the image distortion measurement result from each electron microscope. The correction of the image distortion may be performed by the controller 7924 in each scanning electron microscope 7900, or the condition setting apparatus 704 may centrally correct the images and measurement results received from the plurality of electron microscopes via the network. In this way, by performing measurement by correcting the image distortion in all the electron microscopes in the semiconductor manufacturing line, the machine difference among the electron microscopes can be eliminated, and the measurement precision of the semiconductor wafer can be improved. One adjustment sample may be prepared in each of the plurality of SEMs as shown in FIG. 79, for example. Alternatively, one sample 7918 including the adjustment sample may be prepared in each mini environment 7917 and carried into the sample chamber 7907 as required. Alternatively, an adjustment sample 7919 on a wafer that has fine projection and depression patterns formed over the entire surface thereof may be produced, and the plurality of apparatuses may be adjusted with the same wafer. Using the adjustment sample 7919 formed on the wafer is advantageous in that, since the measurement conditions can be adjusted using the same sample, the measurement errors owing to the sample can be reduced, so that the plurality of apparatuses can be adjusted so as to reduce the machine difference. In addition, the electro-optical system can be adjusted under exactly the same conditions as those for measurement of the wafer to be inspected, so that there is an advantage that the measurement precision of the image distortion and the adjustment precision can be improved.

According to the method described above, the cause of the image distortion can be properly determined, and the machine difference can be stably measured without being affected by the image distortion.

Although the scanning electron microscope has been described as an example in this embodiment, the present invention can be equally applied to any apparatus that uses a charged particle beam.

As described above, according to this embodiment, by using a charged particle beam apparatus adjustment sample having irregular patterns of a semiconductor material having a uniform height formed on the surface of a substrate, a charged particle beam apparatus adjusted with high precision that can be used in semiconductor device manufacturing can be provided. Furthermore, since the performance of the charged particle beam apparatus can be monitored and adjusted with high precision any time, measurement can be performed with high precision and high stability. Furthermore, since the evaluation values of the local magnification variations or image distortions can be adjusted so as to fall within a desired normal range, the machine difference in measurement value among a plurality of charged particle beam apparatuses in a semiconductor manufacturing line can be reduced, and measurement can be performed with high stability.

Note that the present invention is not limited to the embodiments described above and includes various modifications. For example, the above detailed description of the embodiments is intended to facilitate understanding of the present invention, and the embodiments do not always have to have a complete set of the components described above. Furthermore, one or more components of an embodiment can be replaced with one or more components of another embodiment, and one or more components of an embodiment can be added to another embodiment. Furthermore, one or more components of each embodiment can be added to another embodiment, omitted, or replaced with one or more components of another embodiment.

REFERENCE SIGNS LIST

701, 702, 703 SEM
704 condition setting apparatus
705 simulator
706 storage medium
710 controller
801 electron source
802 extraction electrode
803 electron beam
804 condenser lens
805 scanning deflector
806 objective lens
807 sample chamber
808 sample stage
809 sample
810 electron
811 secondary electron
812 conversion electrode
813 detector

The invention claimed is:

1. A charged particle beam apparatus, comprising:
a charged particle source;
a deflector that moves a field of view to move a position irradiated with a beam emitted from the charged particle source;
a detector that detects a charged particle obtained through irradiation of a sample with the beam;
a stage that places the sample at the position irradiated with the beam; and
a control device that controls the deflector to move the field of view, generates an image based on an output from the detector, and measures, based on the output, a dimension of a pattern formed on the sample,
wherein the control device
controls the deflector to move the field of view so as to acquire a first image of a first area on the sample and a second image of a second area on the sample that is located in a predetermined direction with respect to the first area, is located at a different position than the first area by a predetermined amount, and partially overlaps with the first area,
determines a difference of position between a pattern in the first image of a particular area on the sample and a pattern of the second image for a plurality of sites in the overlapping area,
obtains vector information that indicates an amount of pattern movement and direction from the difference of the position between the pattern in the first image and the pattern in the second image for each of the plurality of sites, and
corrects a position of an edge of the pattern in the second image based on the vector information obtained with respect to each of the plurality of sites.

2. The charged particle beam apparatus according to claim 1, wherein said first area is a same size as said second area.

3. The charged particle beam apparatus according to claim 1, wherein the control device determines a distortion ratio between a reference position and each of the plurality of sites.

4. The charged particle beam apparatus according to claim 3, wherein said control device determines whether the distortion ratio is outside of a predetermined range.

5. The charged particle beam apparatus according to claim 3, wherein said control device sets an apparatus condition for calibrating a scan width of said beam based on an image obtained when a reference pattern is located at said reference position and acquiring said first image and said second image under the apparatus condition after the calibration.

6. The charged particle beam apparatus according to claim 1, wherein said sample is disposed outside a sample chamber and carried into the sample chamber when said first image and said second image are to be acquired.

7. The charged particle beam apparatus according to claim 1, wherein the sample is black silicon.

* * * * *